United States Patent
Lee

(10) Patent No.: US 11,984,703 B2
(45) Date of Patent: May 14, 2024

(54) SURFACE EMITTING LASER DEVICE AND A LIGHT EMITTING DEVICE INCLUDING THE SAME

(71) Applicant: SUZHOU LEKIN SEMICONDUCTOR CO., LTD., Taicang (CN)

(72) Inventor: Jeong Sik Lee, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 798 days.

(21) Appl. No.: 17/054,405

(22) PCT Filed: May 10, 2019

(86) PCT No.: PCT/KR2019/005621
§ 371 (c)(1),
(2) Date: Nov. 10, 2020

(87) PCT Pub. No.: WO2019/216685
PCT Pub. Date: Nov. 14, 2019

(65) Prior Publication Data
US 2021/0075193 A1      Mar. 11, 2021

(30) Foreign Application Priority Data

May 10, 2018 (KR) .................. 10-2018-0053703
May 10, 2018 (KR) .................. 10-2018-0053706
Aug. 27, 2018 (KR) .................. 10-2018-0100340

(51) Int. Cl.
*H01S 5/183* (2006.01)
*H01S 5/042* (2006.01)

(52) U.S. Cl.
CPC ........ *H01S 5/18338* (2013.01); *H01S 5/0425* (2013.01)

(58) Field of Classification Search
CPC .................................................. H01S 5/18338
(Continued)

(56) References Cited

U.S. PATENT DOCUMENTS 5,978,408 A    11/1999   Thornton
7,596,161 B2   9/2009    Chua et al.
(Continued)

FOREIGN PATENT DOCUMENTS

JP    10-229248 A      8/1998
JP    2003-309325 A    10/2003
(Continued)

*Primary Examiner* — Tuan N Nguyen
(74) *Attorney, Agent, or Firm* — Birch, Stewart, Kolasch & Birch, LLP

(57) ABSTRACT

The embodiment relates to a surface emitting laser device and a light emitting device including the same.
The surface-emitting laser device according to the embodiment includes a first reflective layer, an active region disposed on the first reflective layer, a plurality of aperture regions disposed on the active region, including an aperture and an insulating region, a second reflective layer disposed on the aperture region, and a first electrode and a second electrode electrically connected to the first reflective layer and the second reflective layer, respectively.
In the aperture region, an outer periphery of the insulating region may have a circular shape, and an outer periphery of the aperture may have a polygonal shape.

15 Claims, 69 Drawing Sheets

(58) Field of Classification Search
USPC .................................................... 372/38.05
See application file for complete search history.

(56) References Cited

U.S. PATENT DOCUMENTS

| | | | |
|---|---|---|---|
| 8,183,074 B2 | 5/2012 | Masui et al. | |
| 2005/0078726 A1 | 4/2005 | Watanabe et al. | |
| 2005/0100070 A1 | 5/2005 | Nakayama et al. | |
| 2006/0227836 A1 | 10/2006 | Omori et al. | |
| 2011/0194579 A1* | 8/2011 | Maeda | H01S 5/18391 |
| | | | 372/45.01 |
| 2017/0244219 A1* | 8/2017 | Barve | H01S 5/423 |

FOREIGN PATENT DOCUMENTS

| | | |
|---|---|---|
| JP | 2005-93798 A | 4/2005 |
| JP | 2005-116933 A | 4/2005 |
| JP | 2006-41181 A | 2/2006 |
| JP | 2006-278572 A | 10/2006 |
| JP | 2006-294810 A | 10/2006 |
| JP | 2010-192650 A | 9/2010 |
| KR | 10-2017-0125640 A | 11/2017 |

* cited by examiner

[Figure 1]
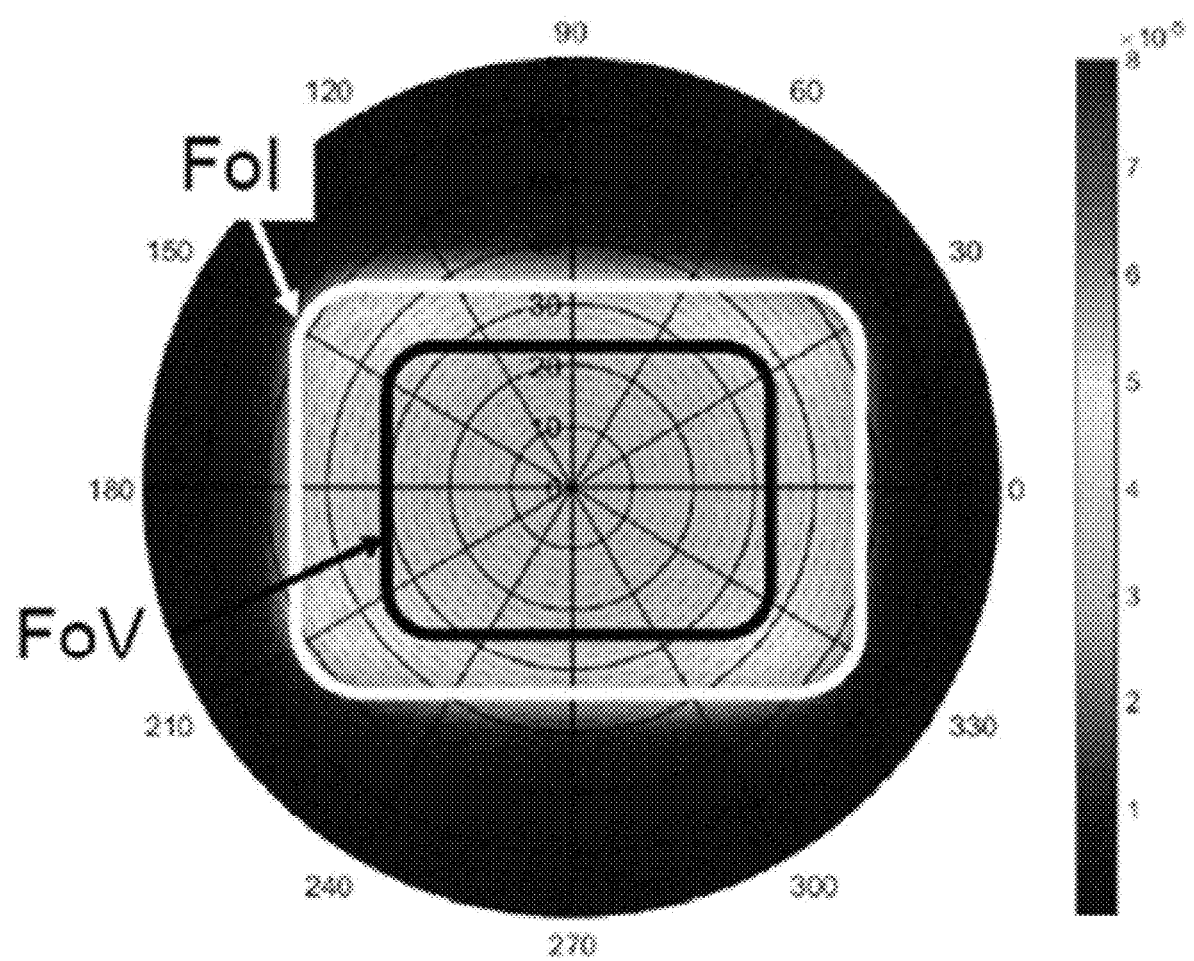

[Figure 2a]
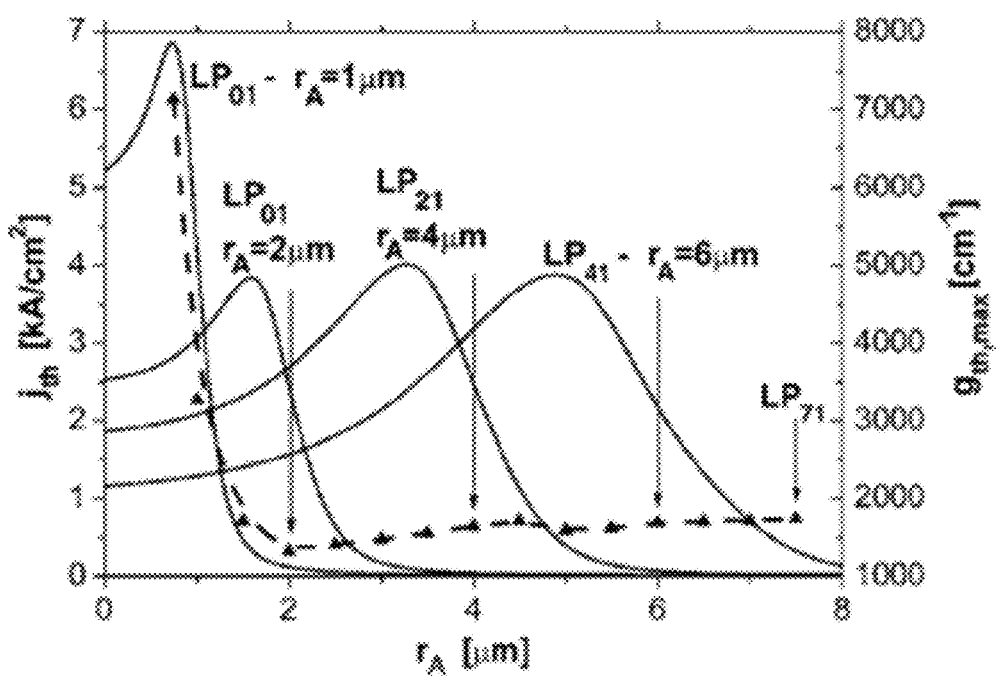

[Figure 2b]
$r_A = 4.5 \mu m$
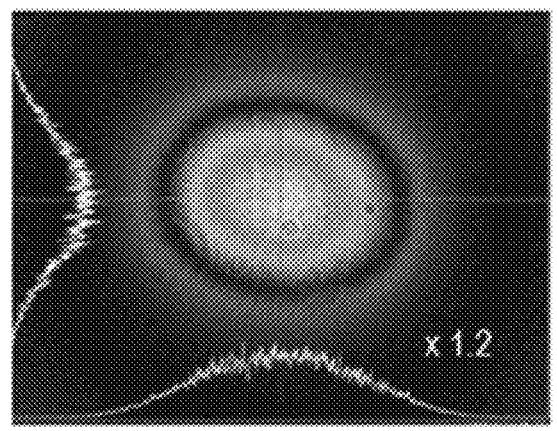
(b1)
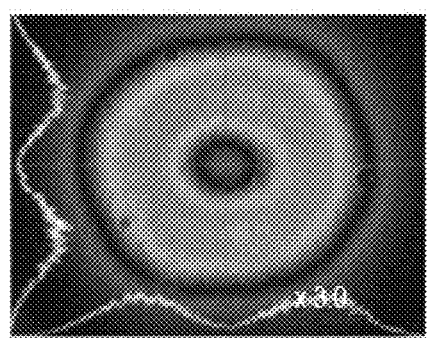
(b2)
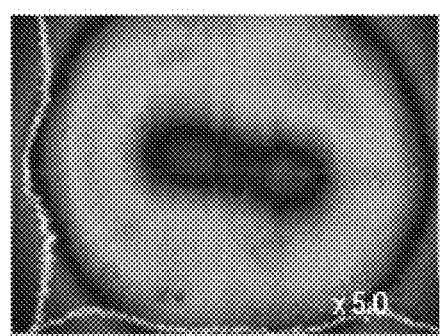
(b3)

[Figure 2c]
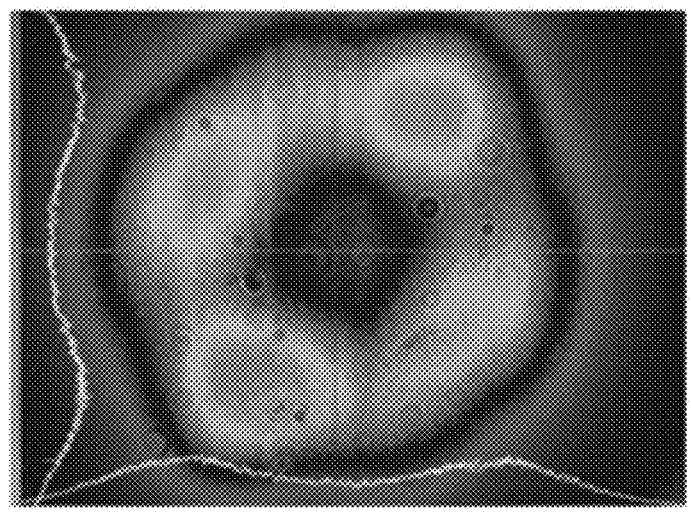

[Figure 2d]
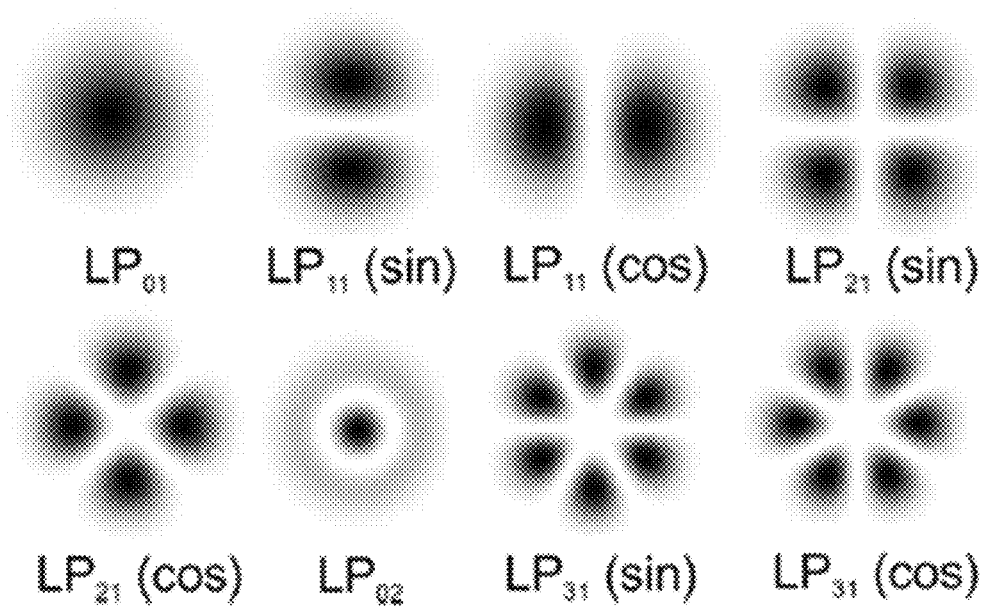
[Figure 2e]
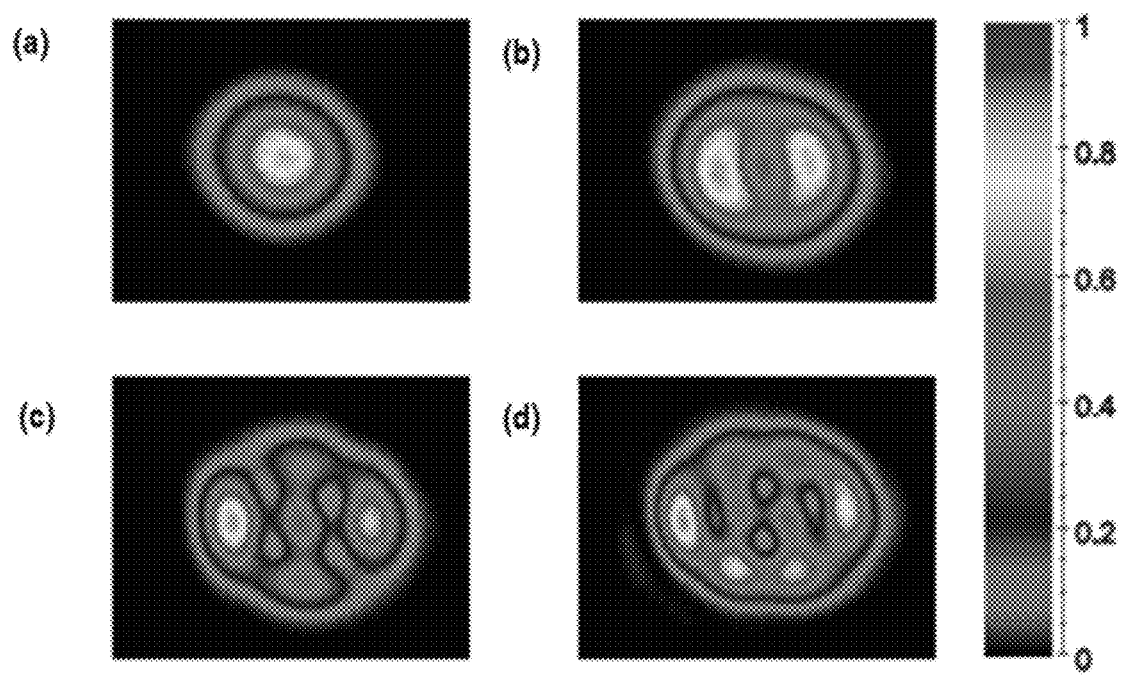

[Figure 2f]
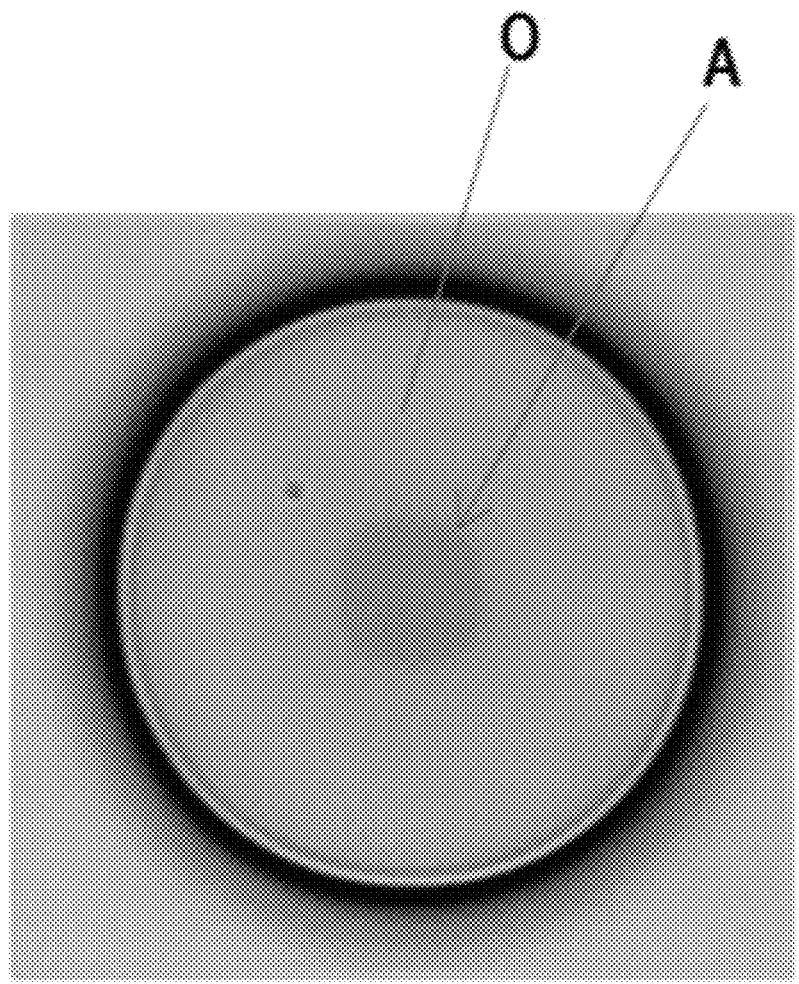

[Figure 2g]
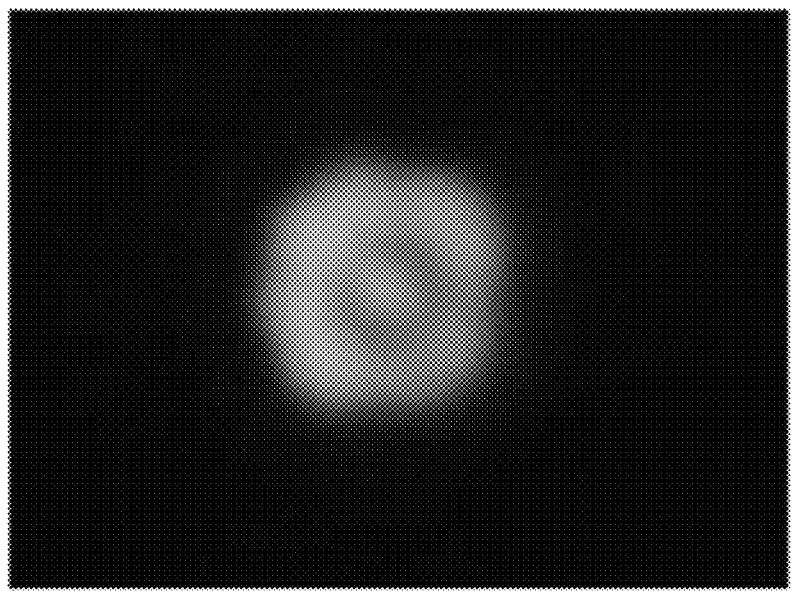

[Figure 2h]
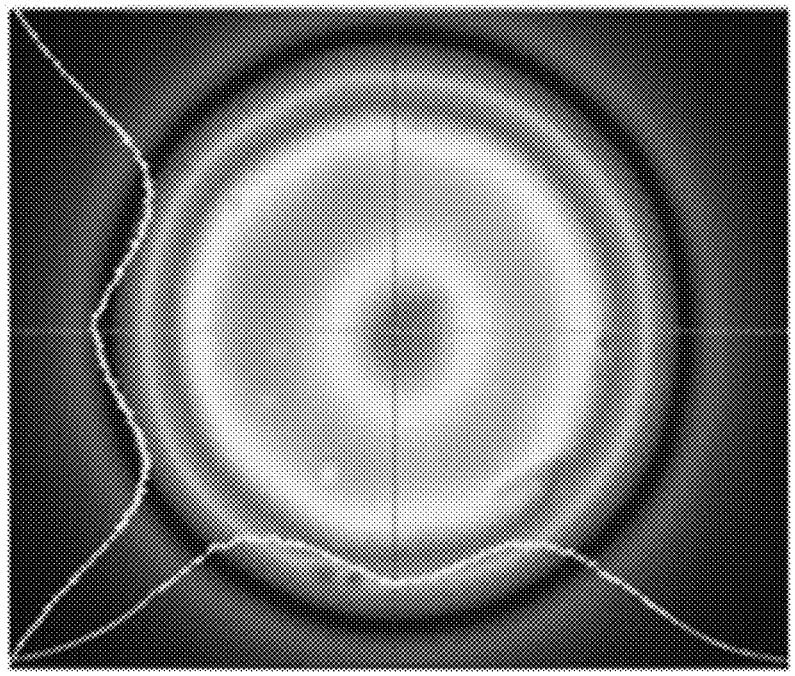

[Figure 3]
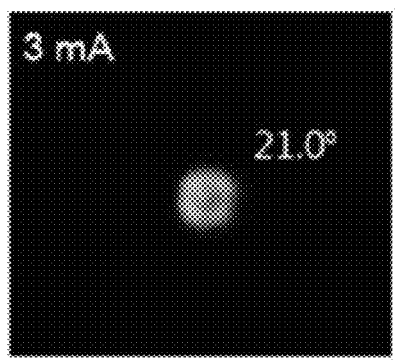
(d1)
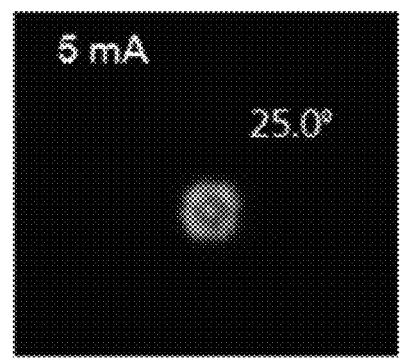
(d2)
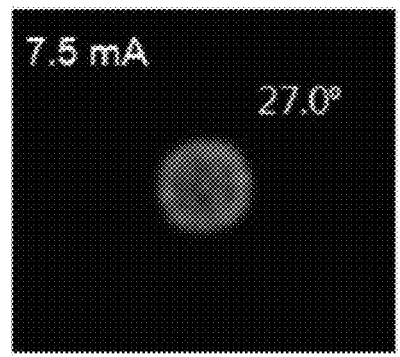
(d3)
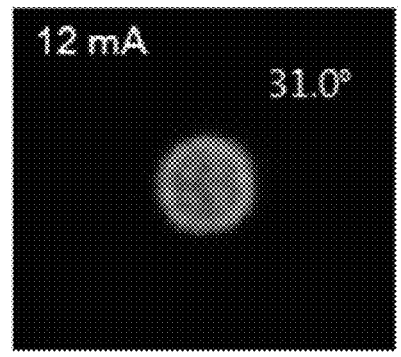
(d4)

[Figure 4]
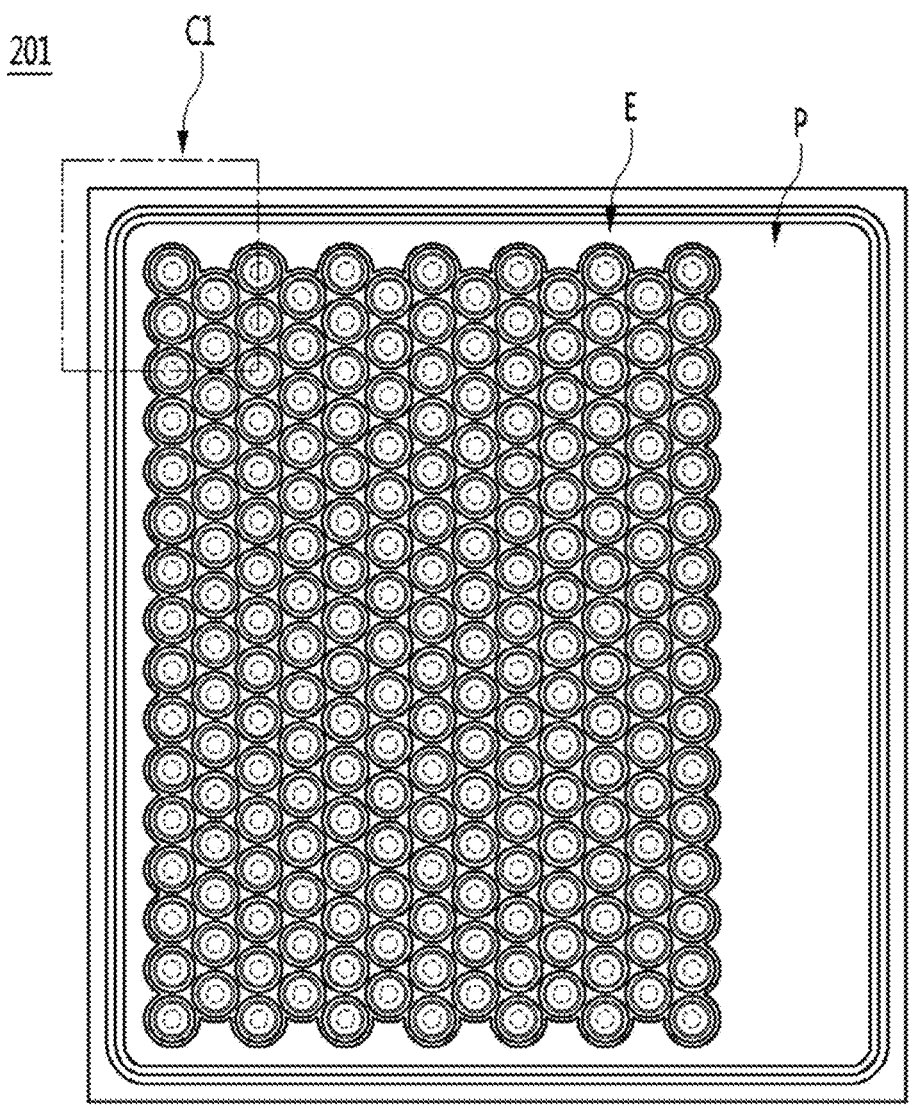

[Figure 5]
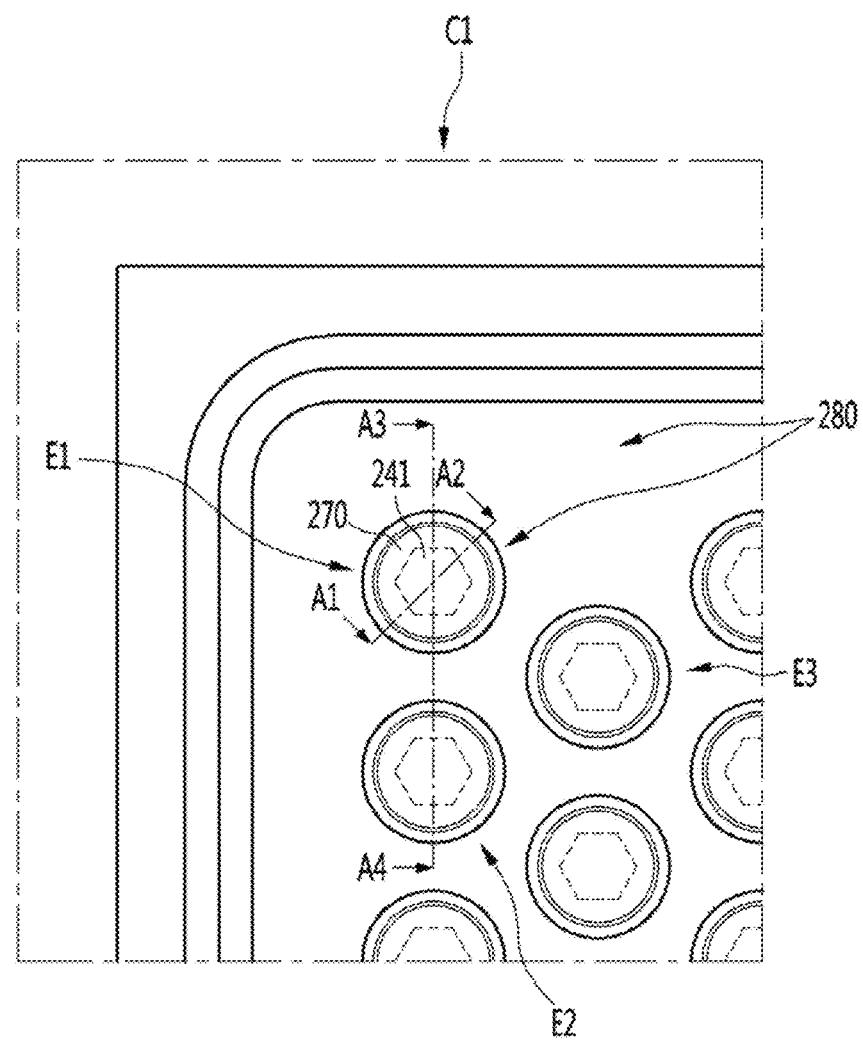

[Figure 6a]
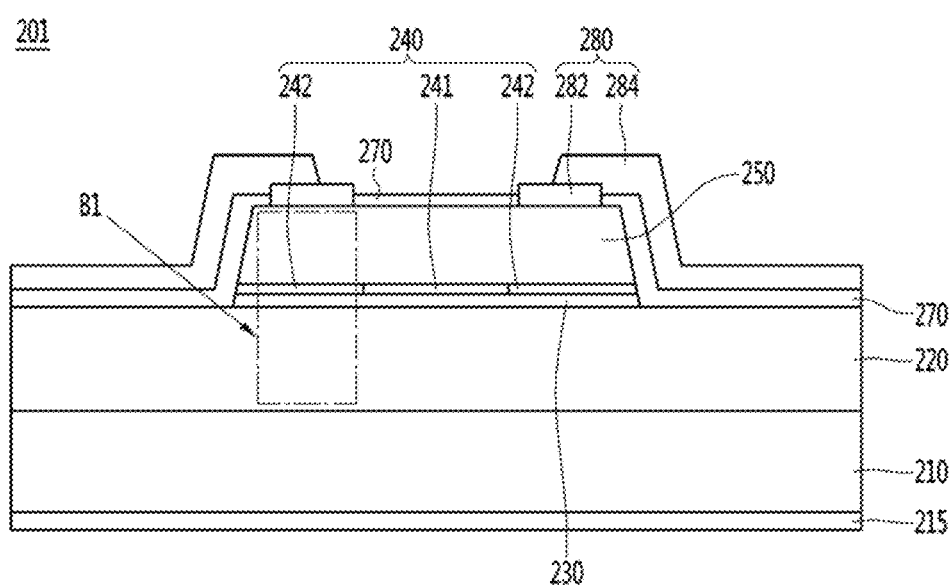

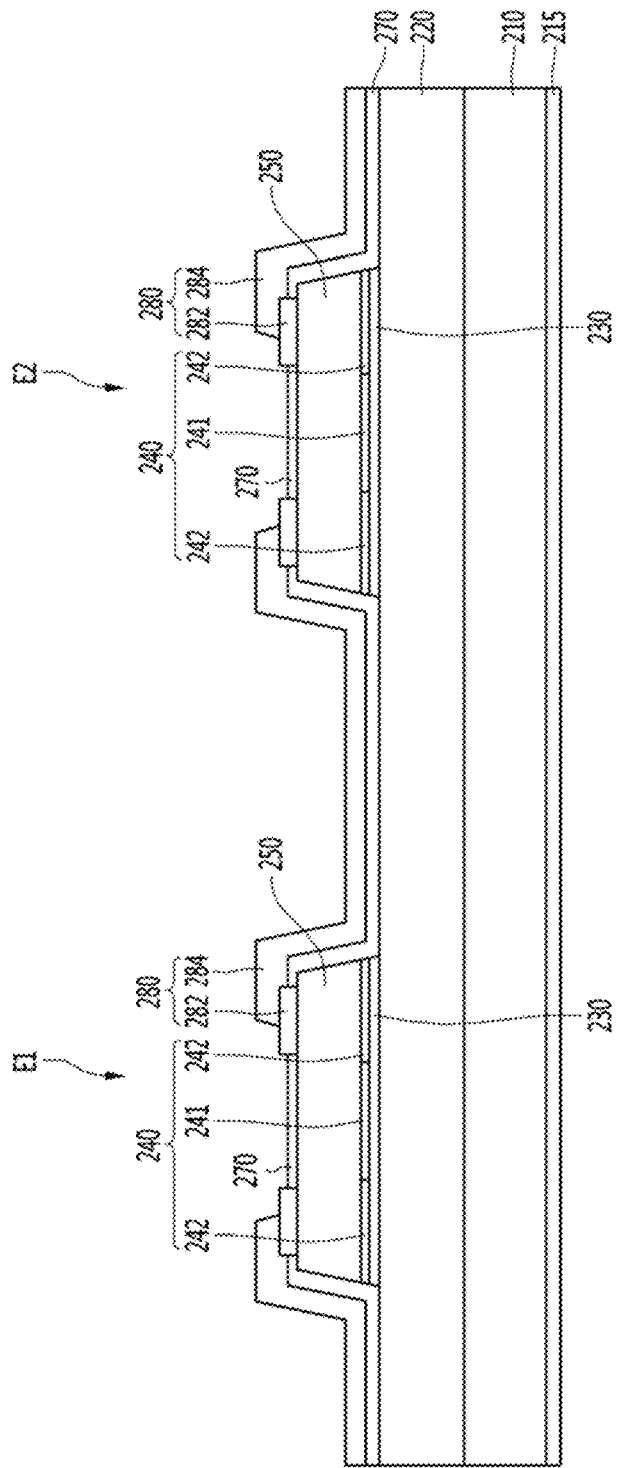
[Figure 6b]

【Figure 7】
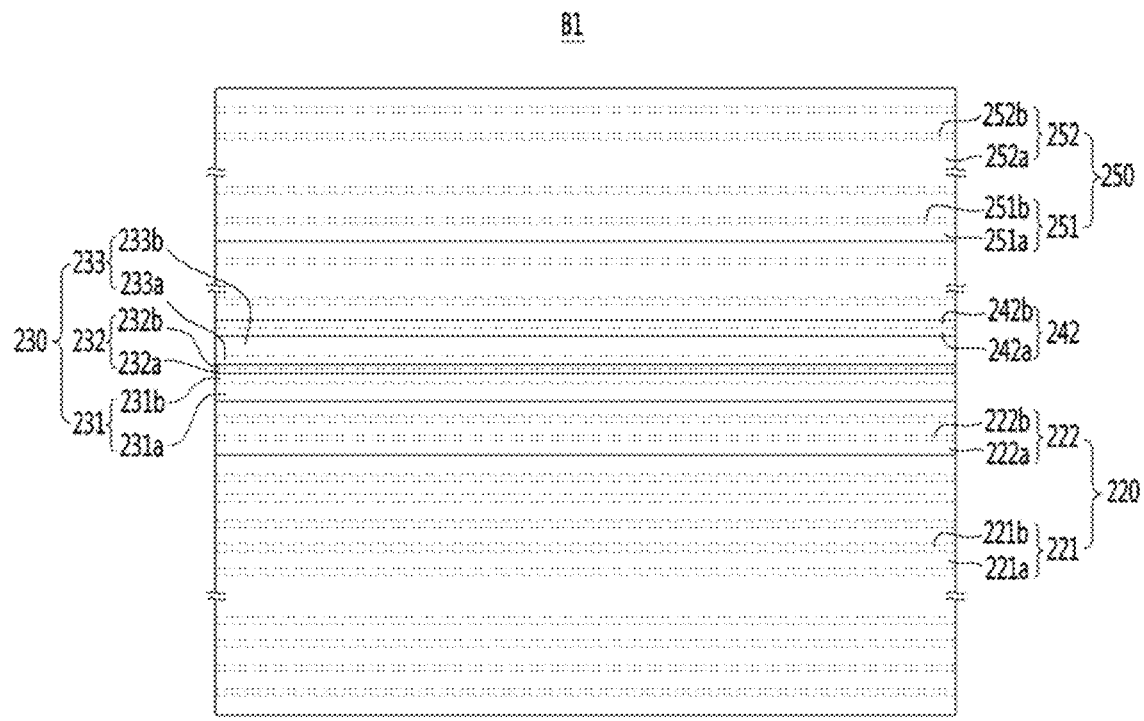
【Figure 8a】
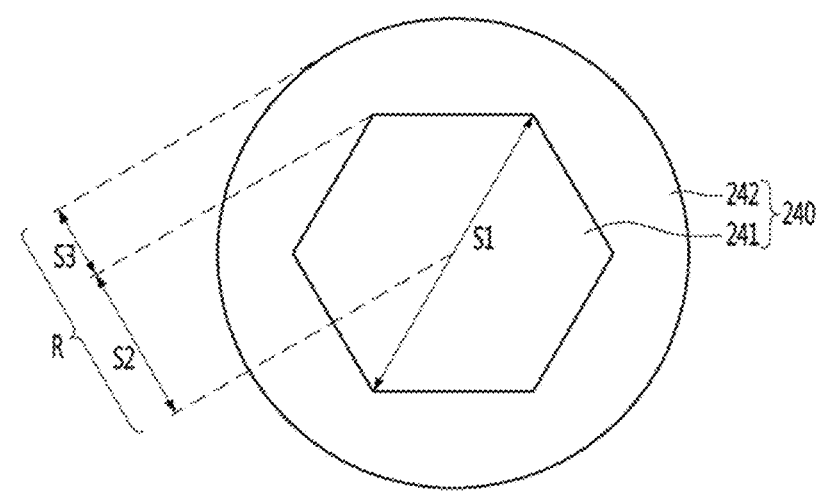

[Figure 8b]
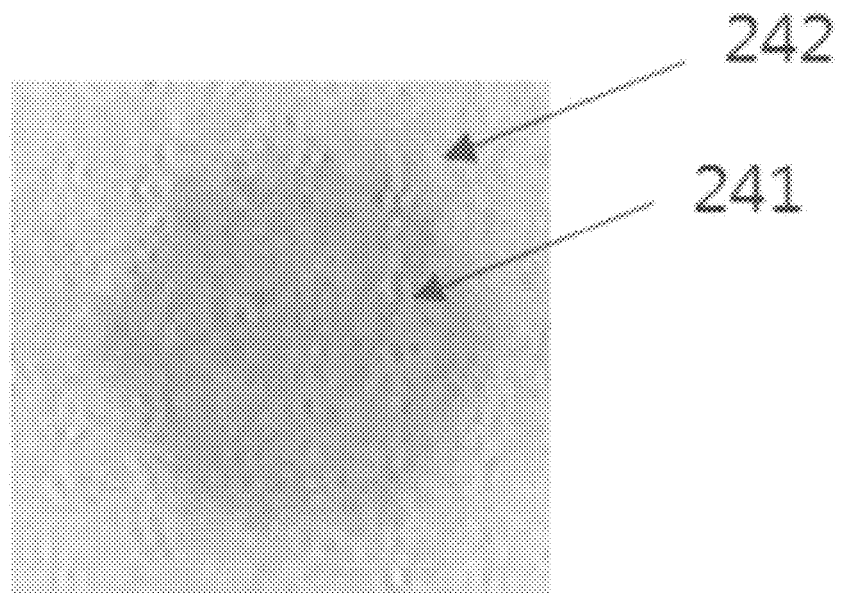
[Figure 8c]
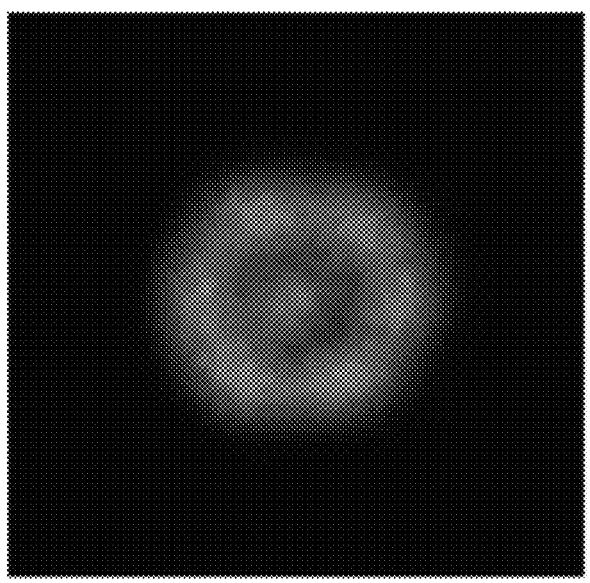

[Figure 9a]
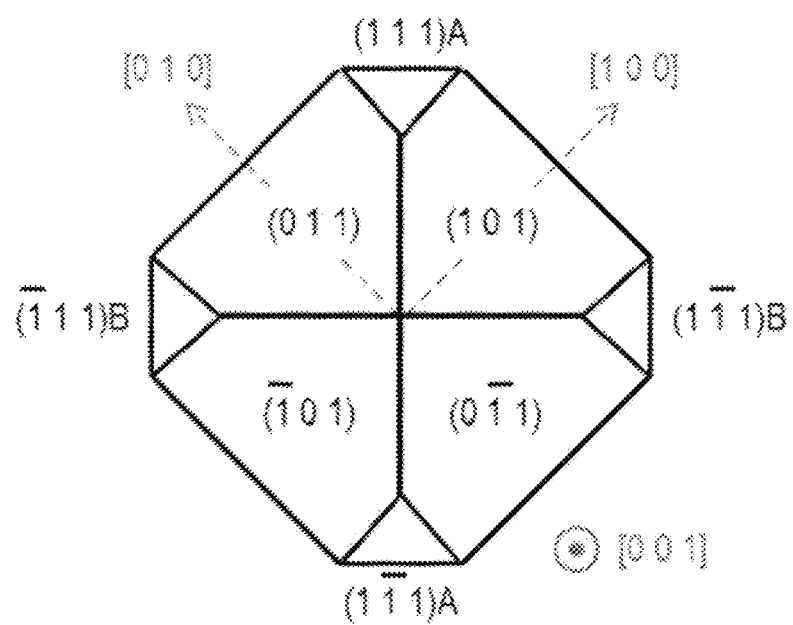

[Figure 9b]
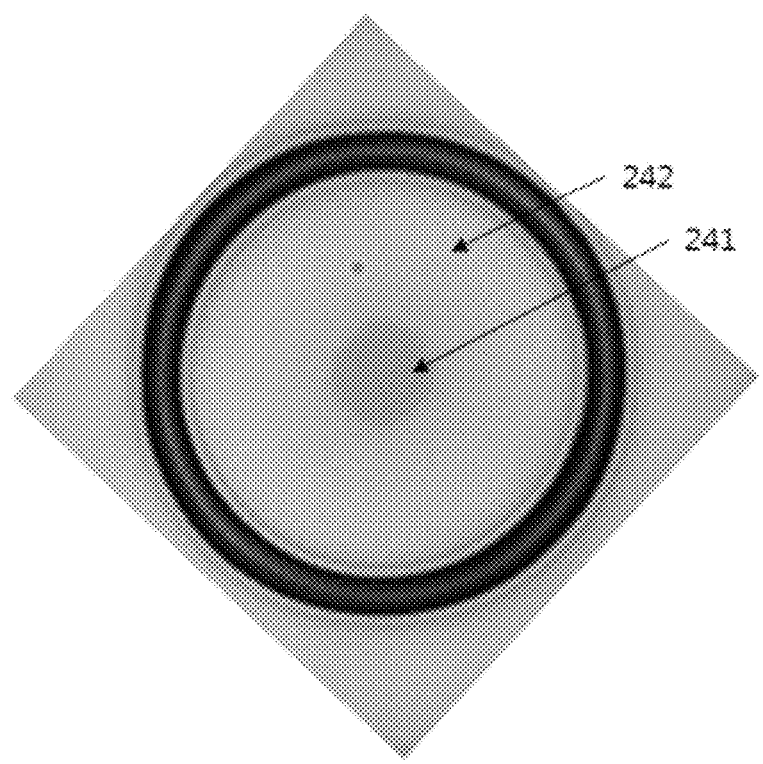

[Figure 10a]
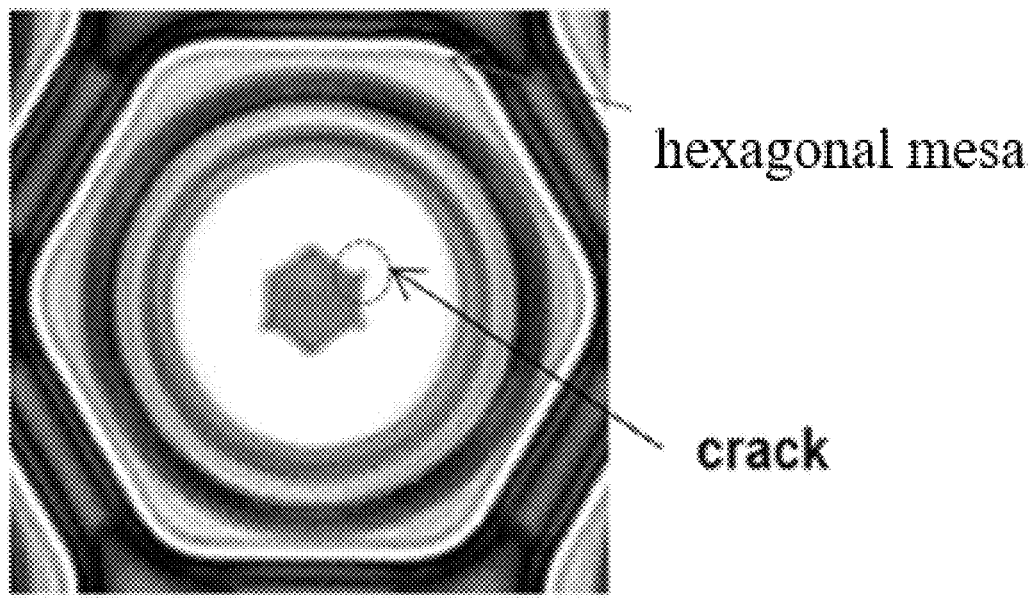
[Figure 10b]
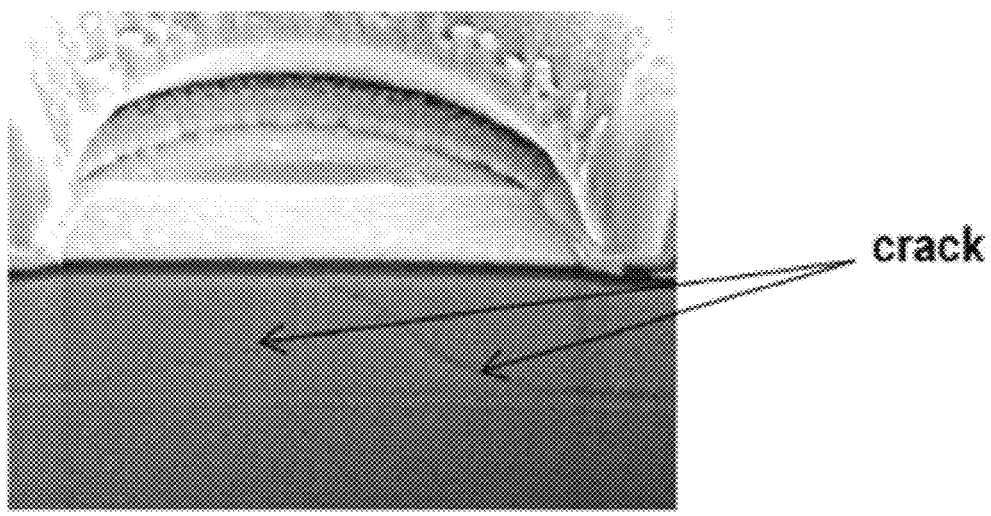

[Figure 11a]
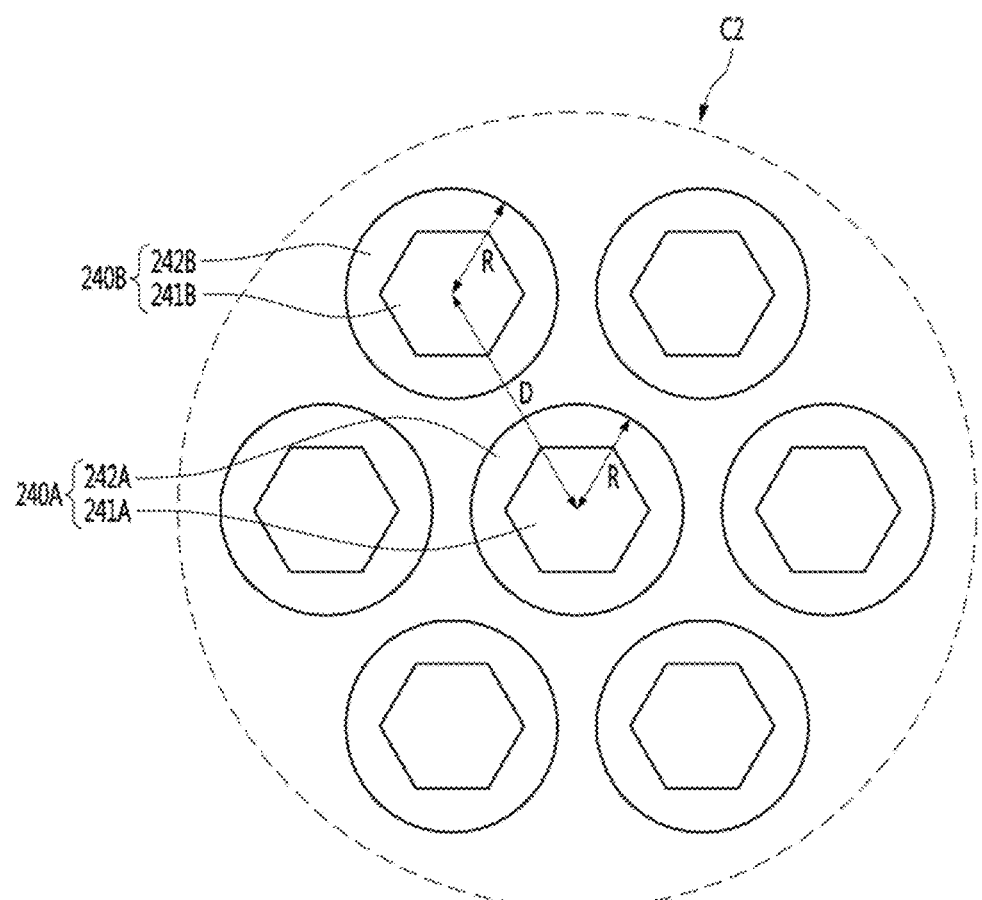

[Figure 11b]
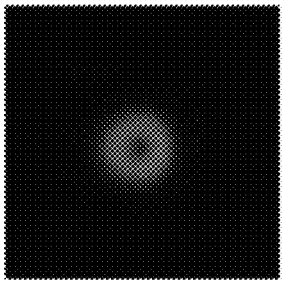

[Figure 12]
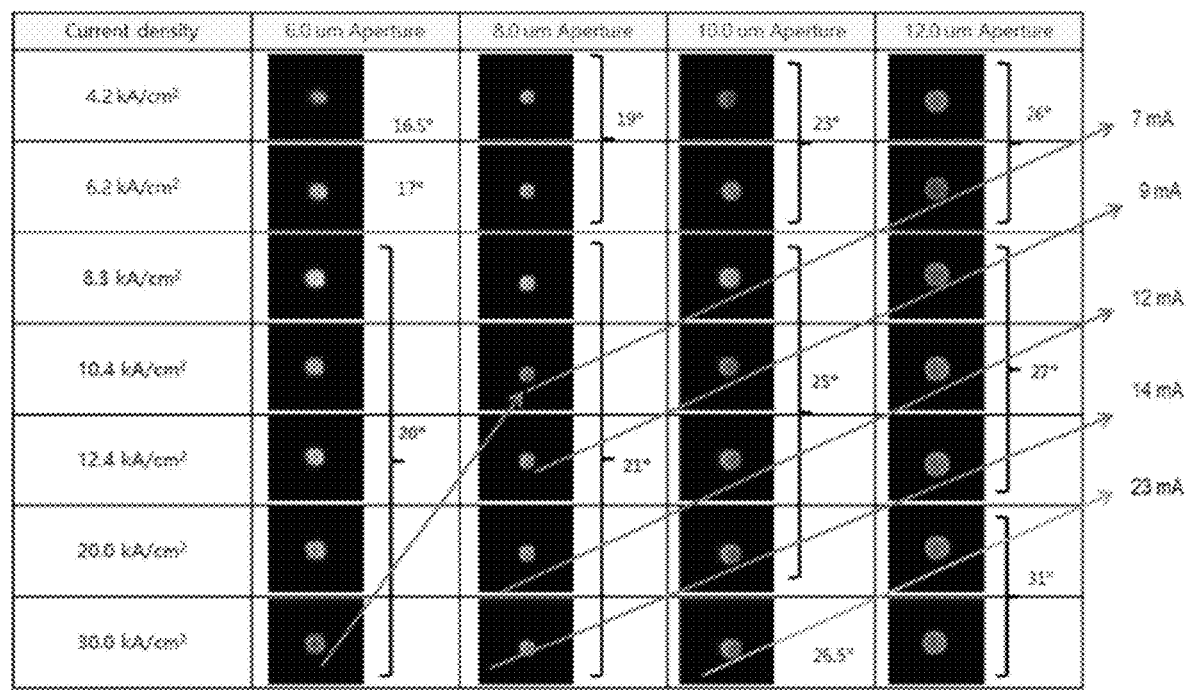

[Figure 13a]
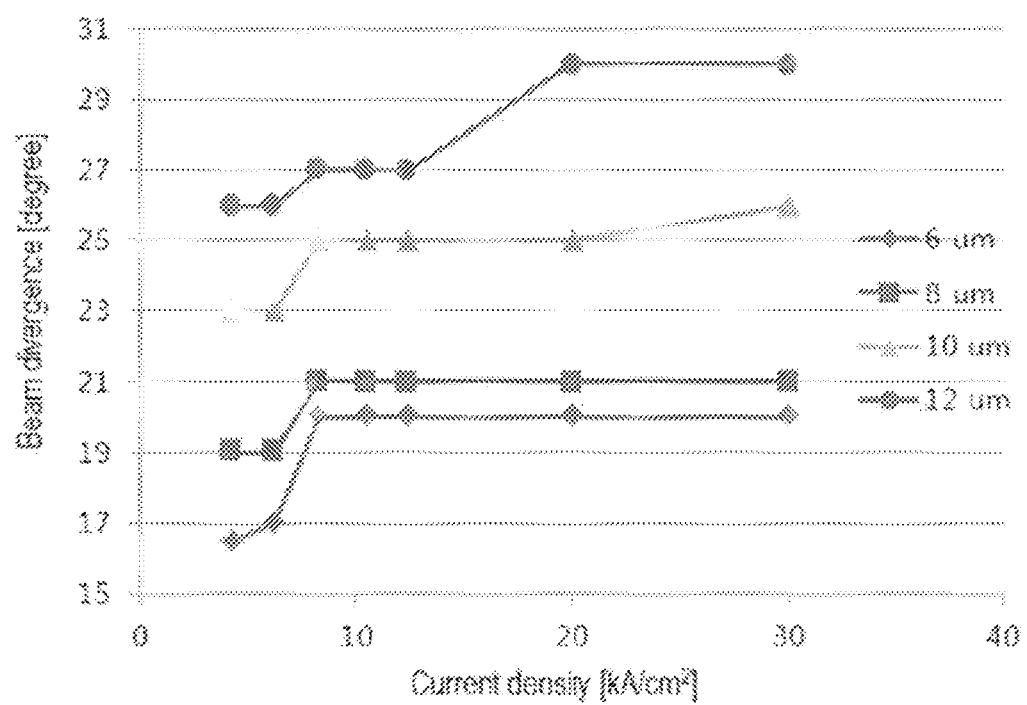

[Figure 13b]
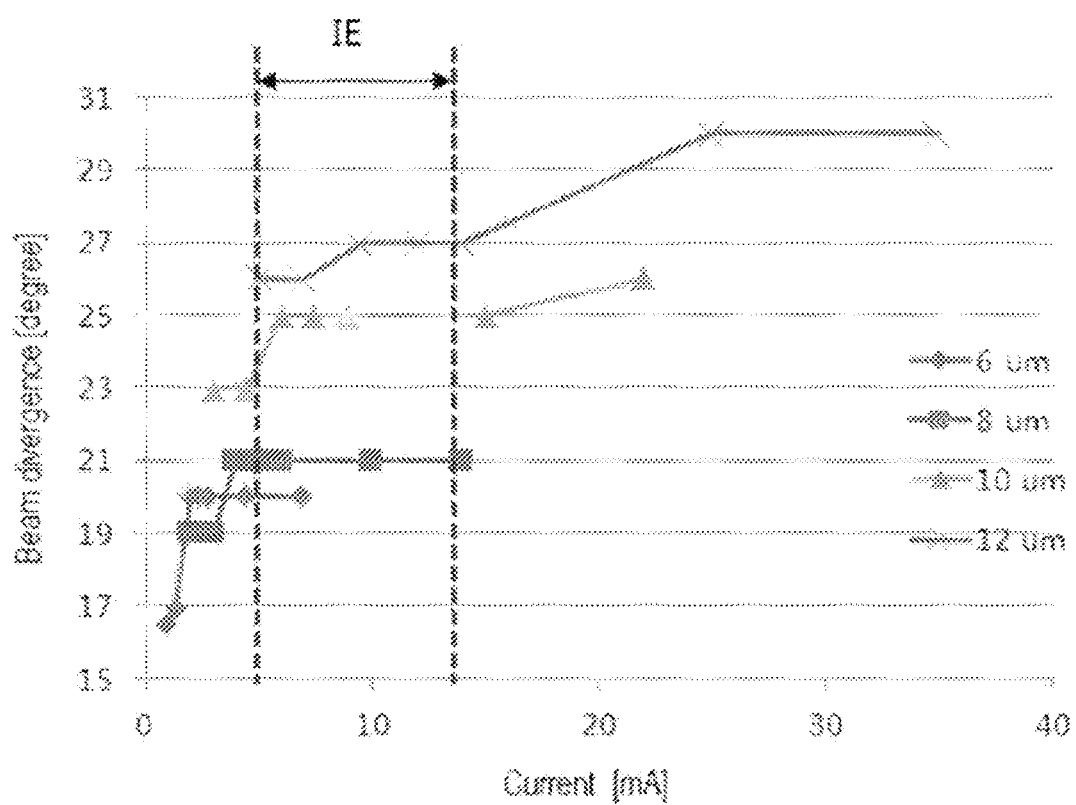

[Figure 14a]
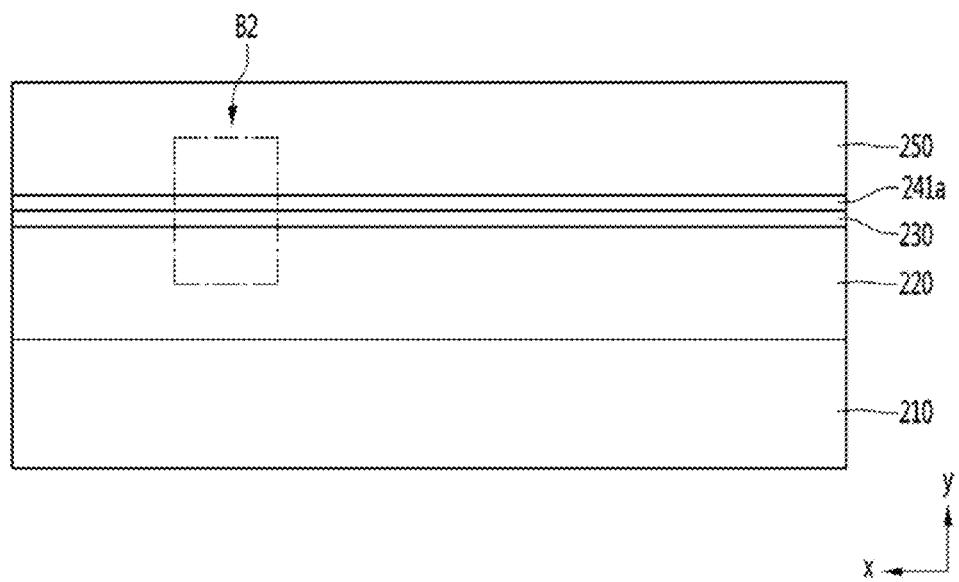

[Figure 14b]
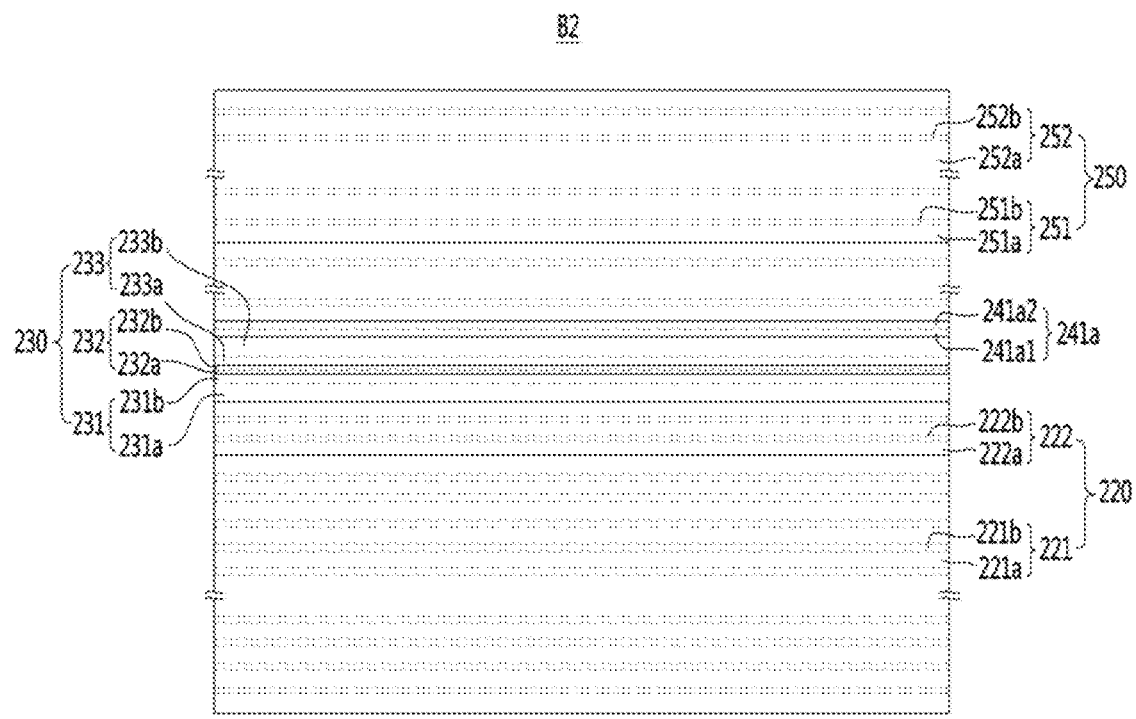

[Figure 15a]
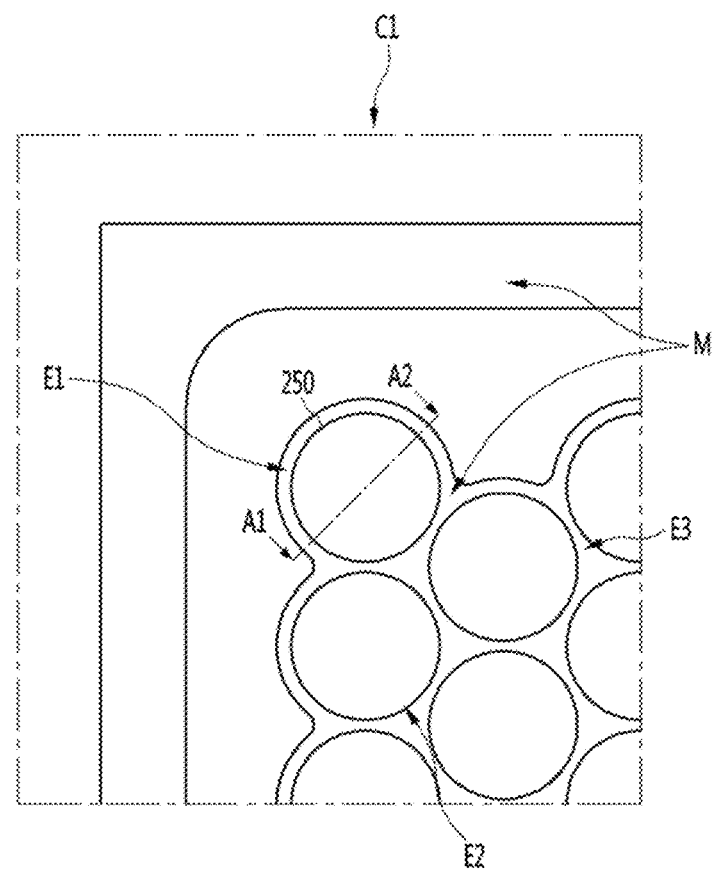

[Figure 15b]
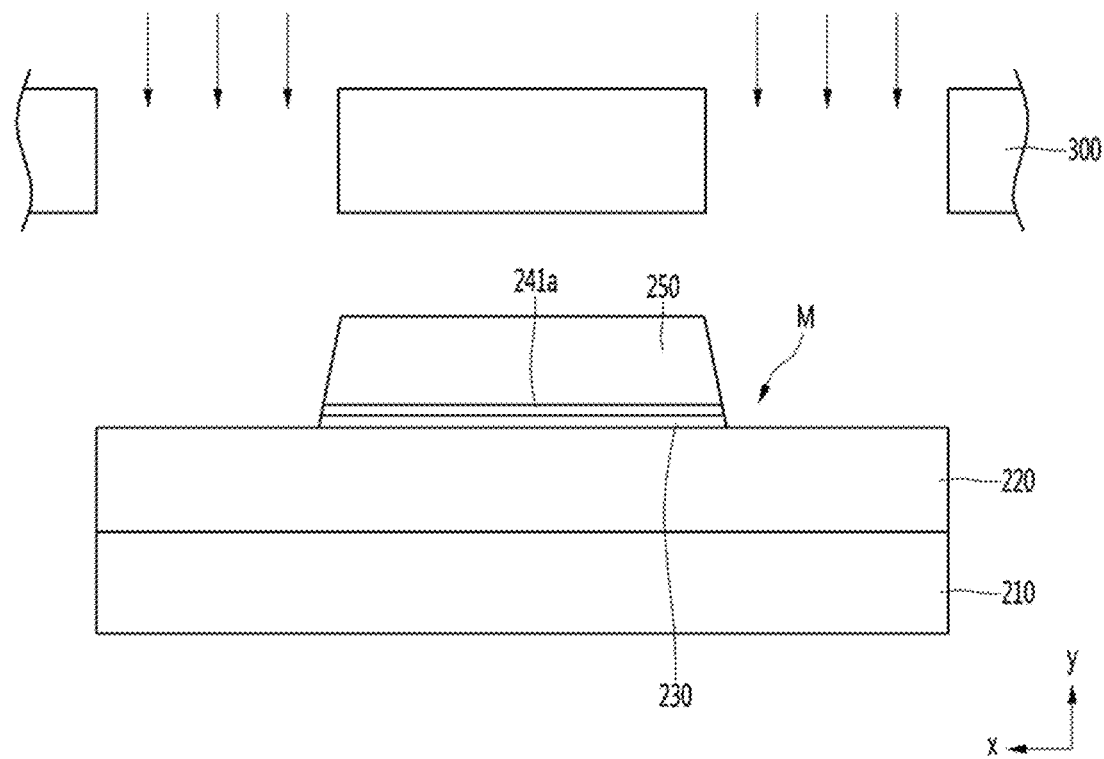

[Figure 16a]
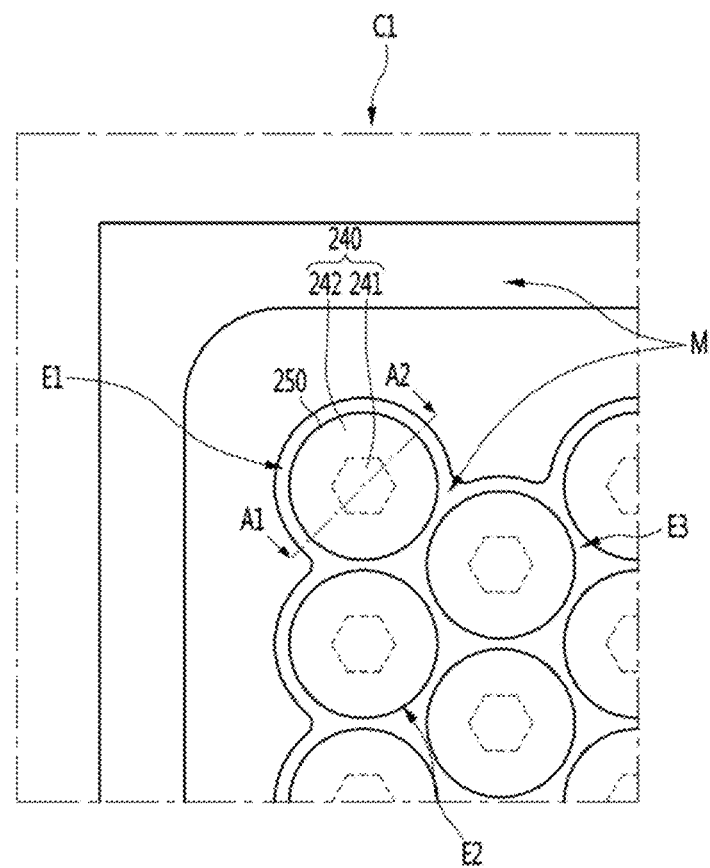

[Figure 16b]
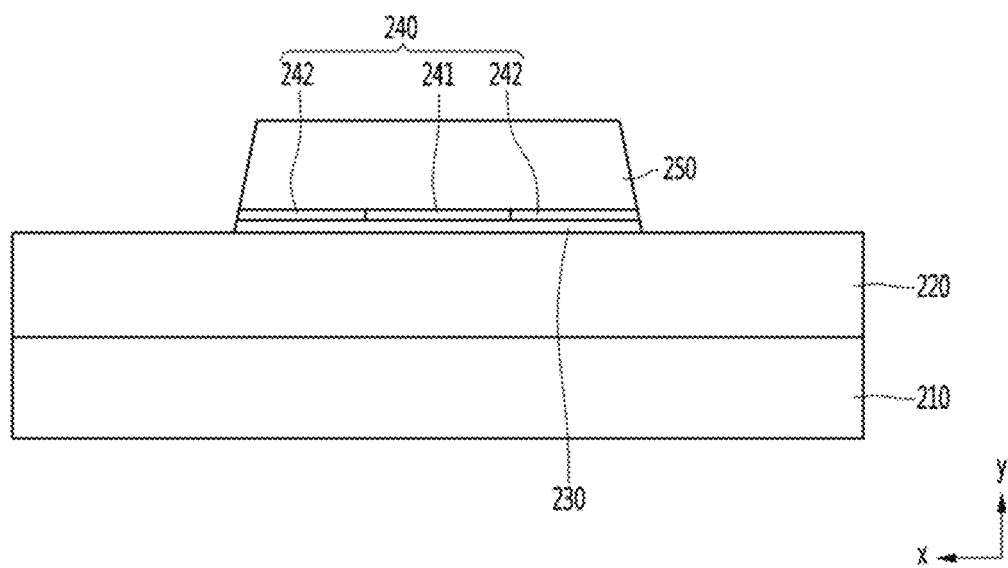

[Figure 17]
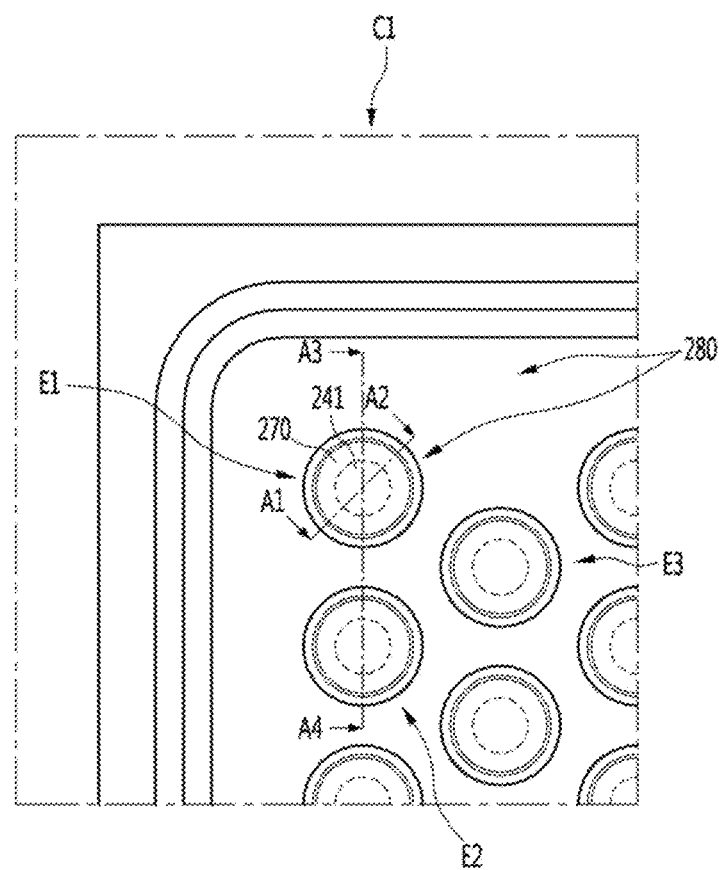

[Figure 18]
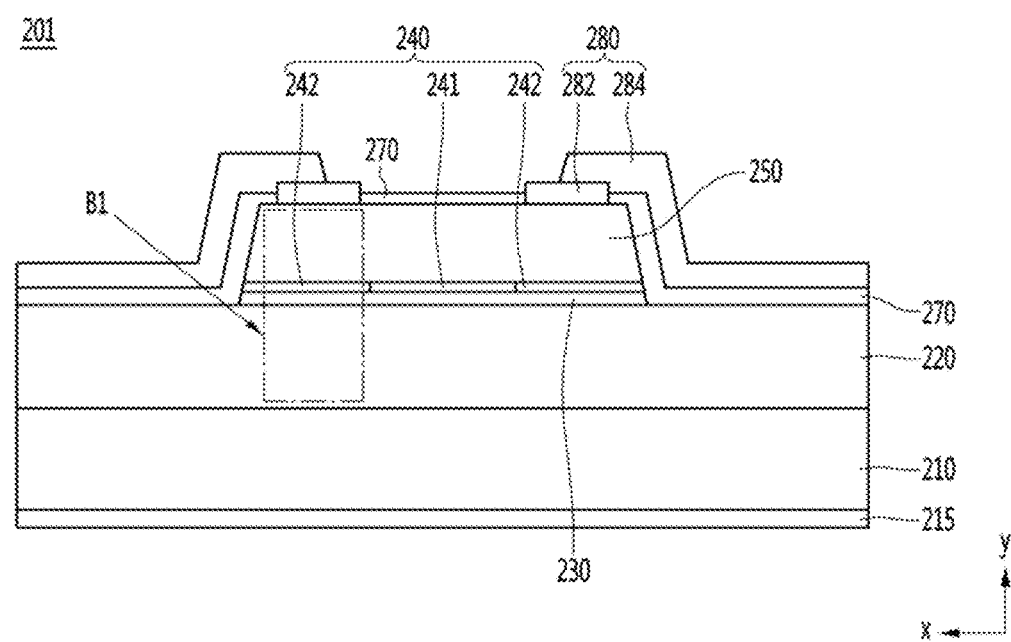

[Figure 19a]
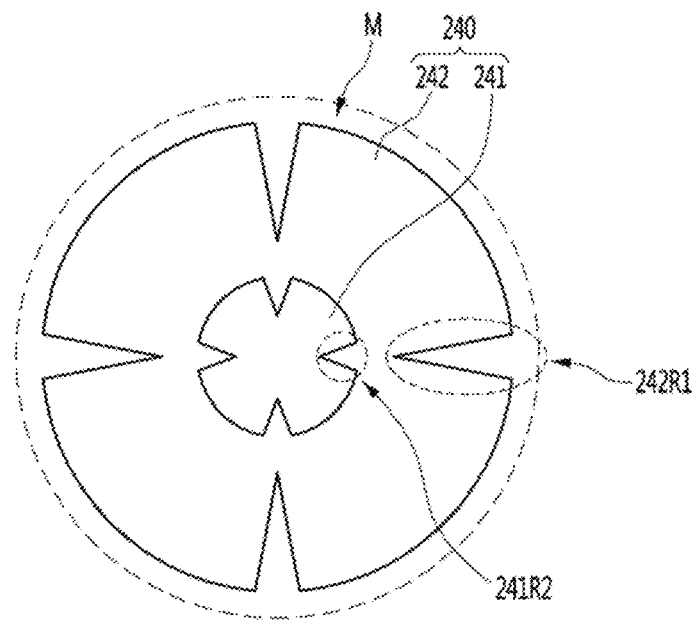
[Figure 19b]
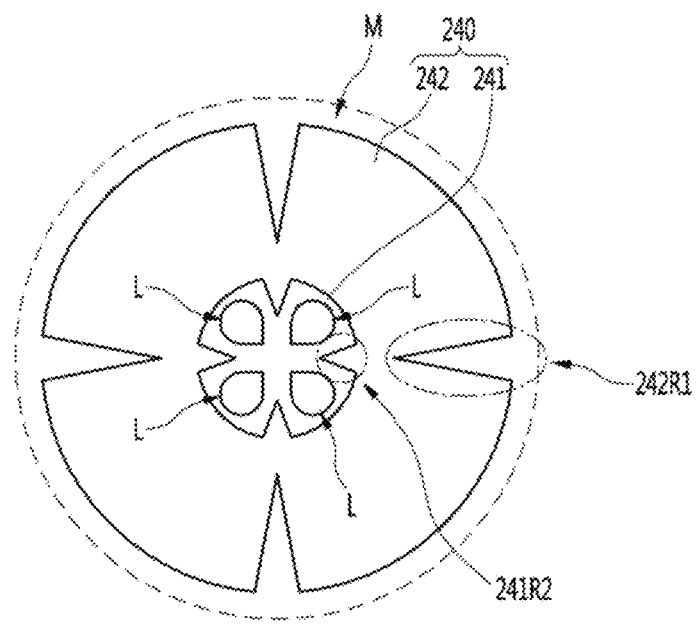

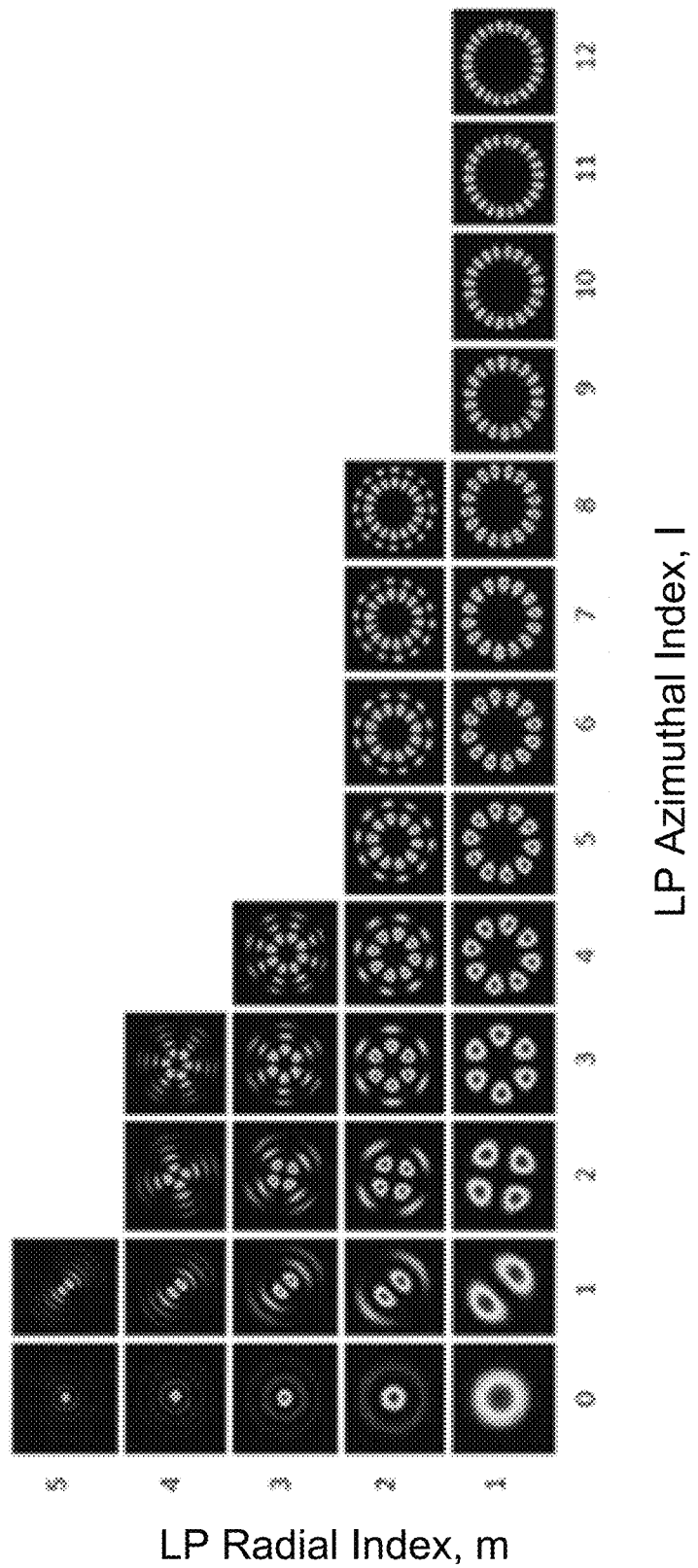
[Figure 20a]

[Figure 20b]
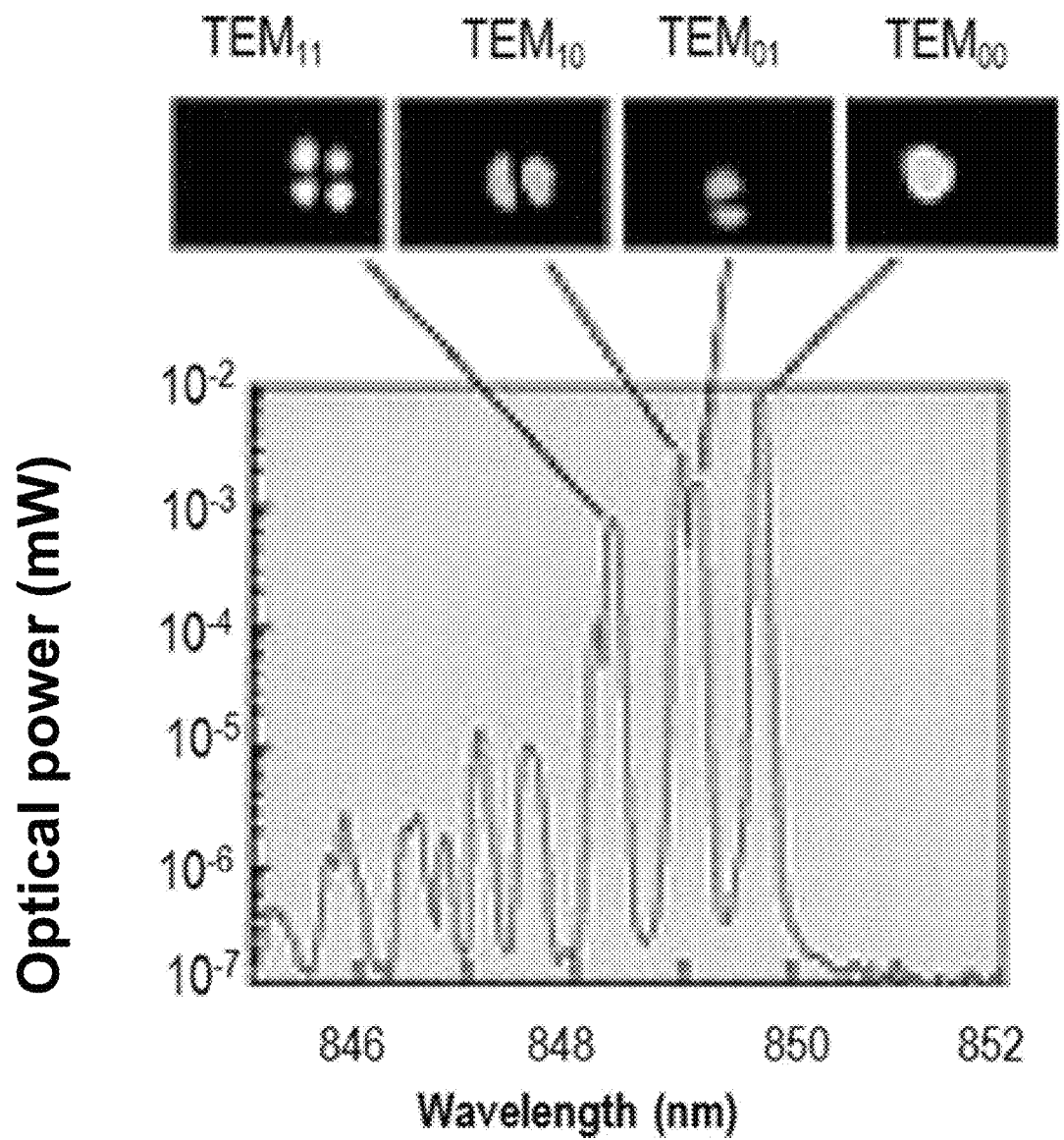

[Figure 20c]
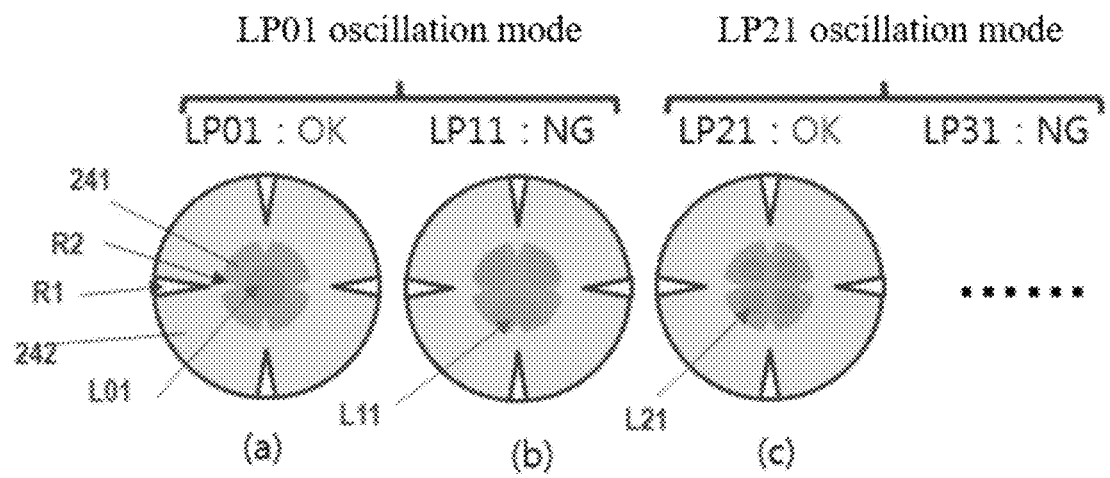
[Figure 21a]
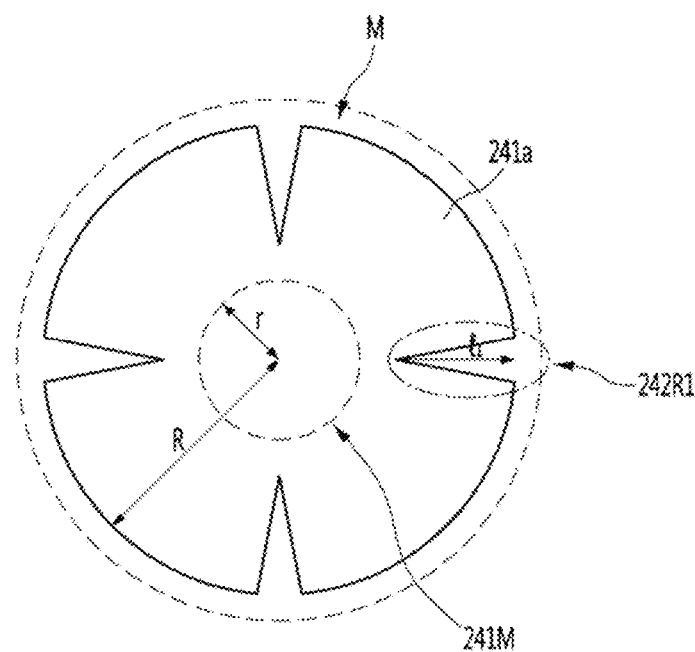

[Figure 21b]
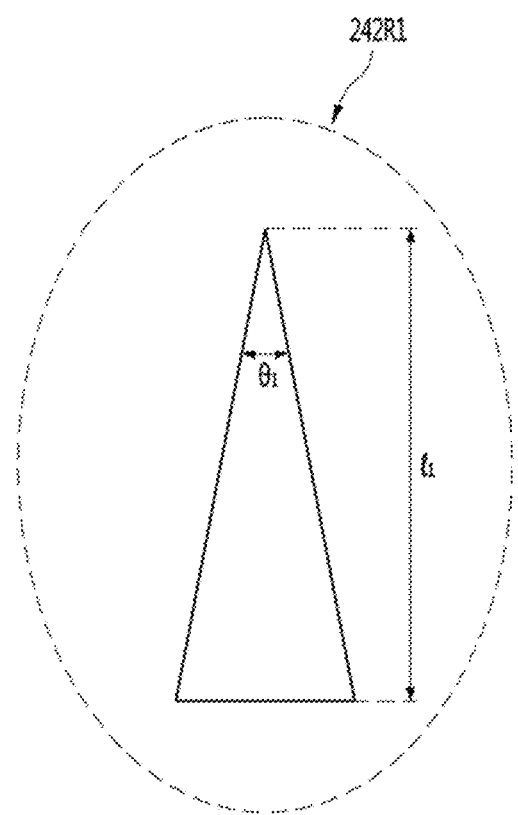

[Figure 21c]
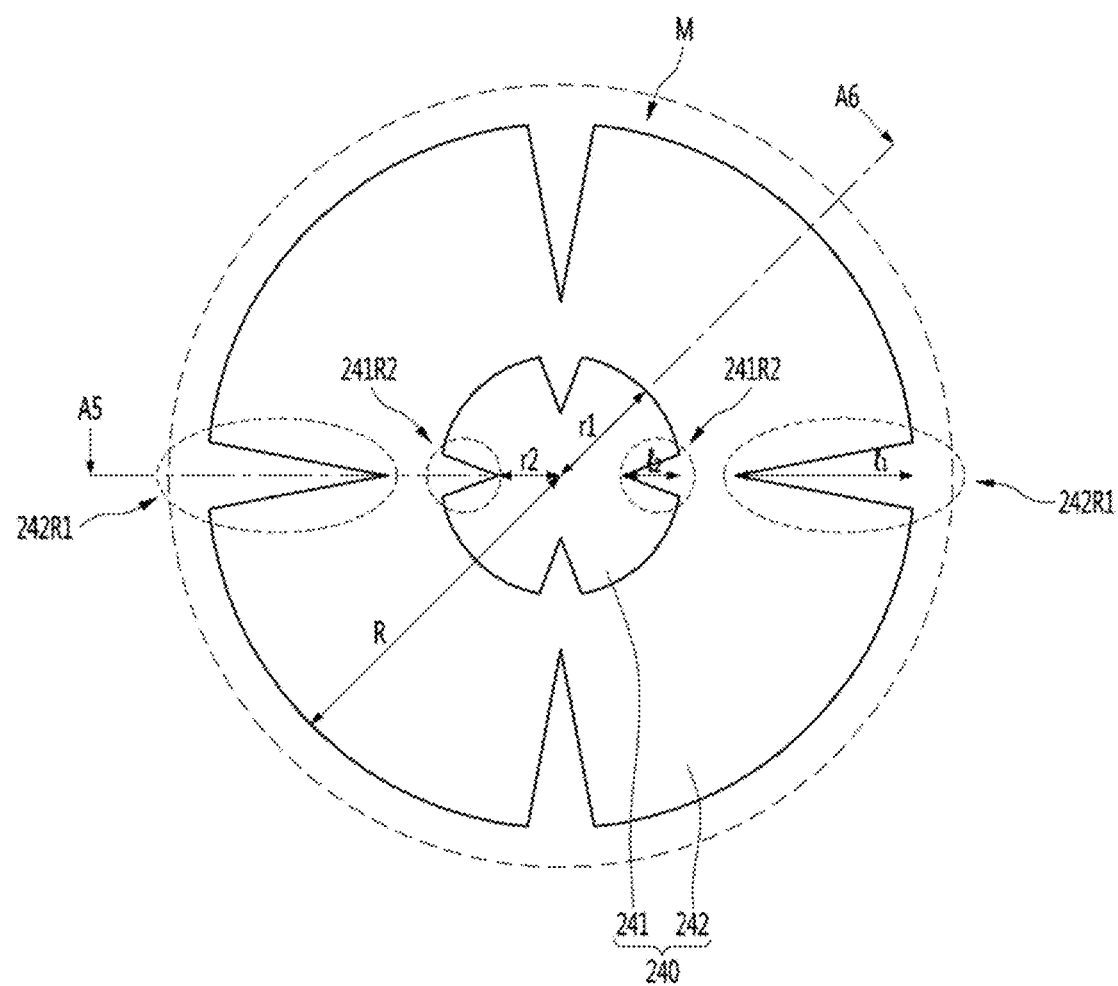

[Figure 21d]
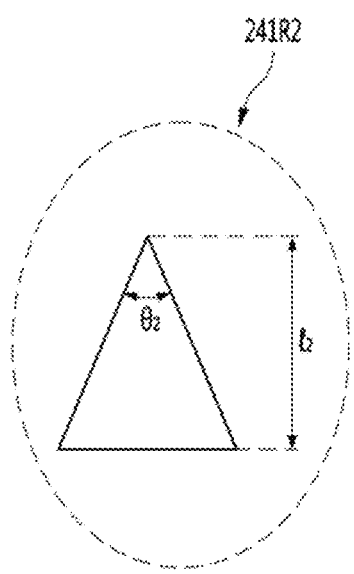

[Figure 22]
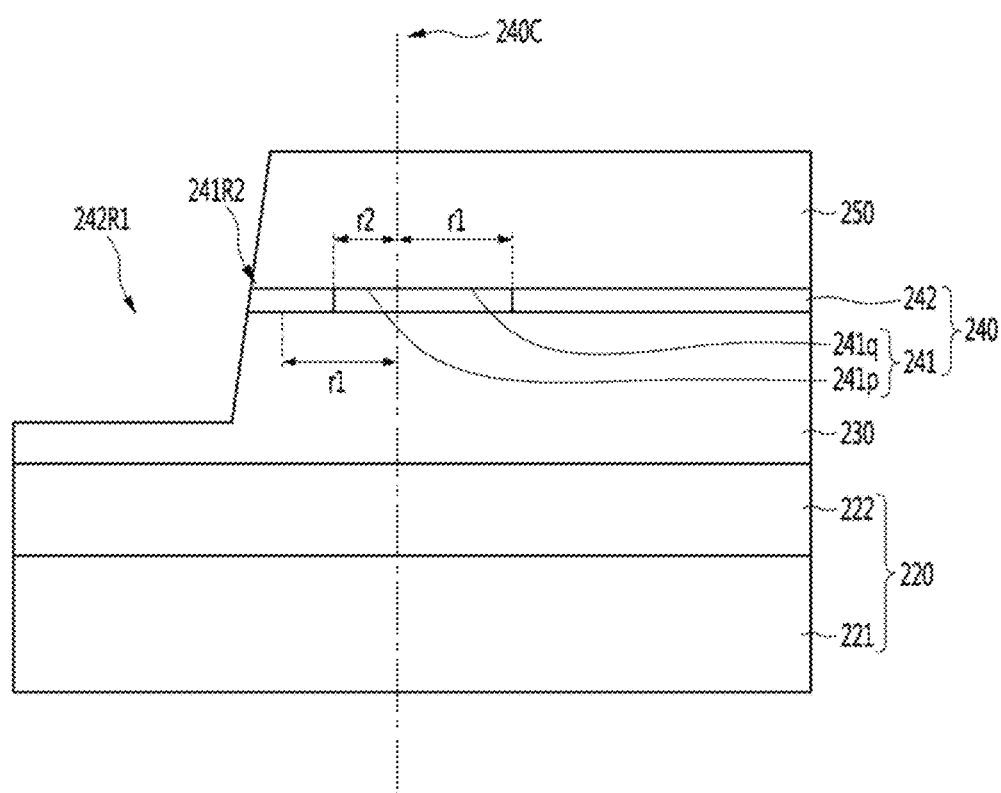

[Figure 23]
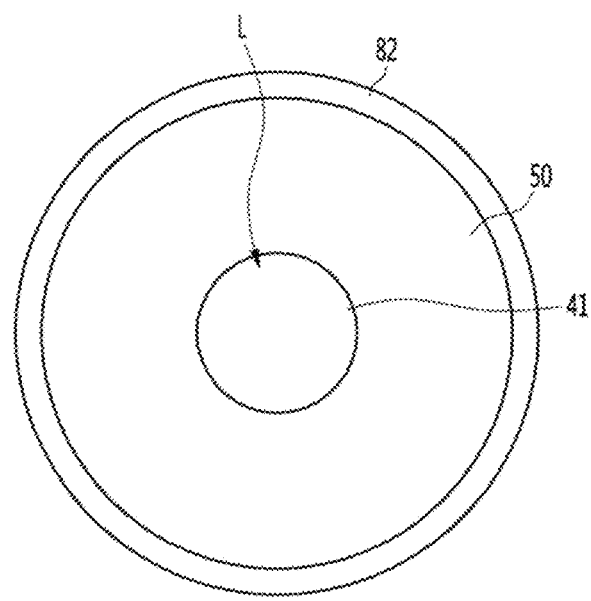

[Figure 24]
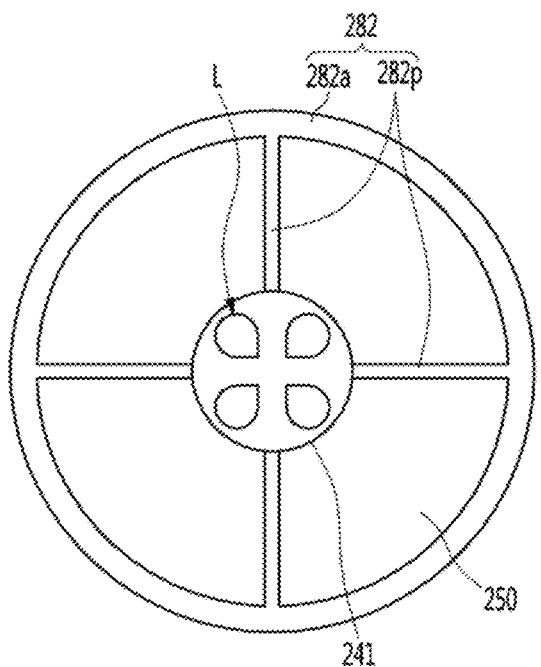

[Figure 25]
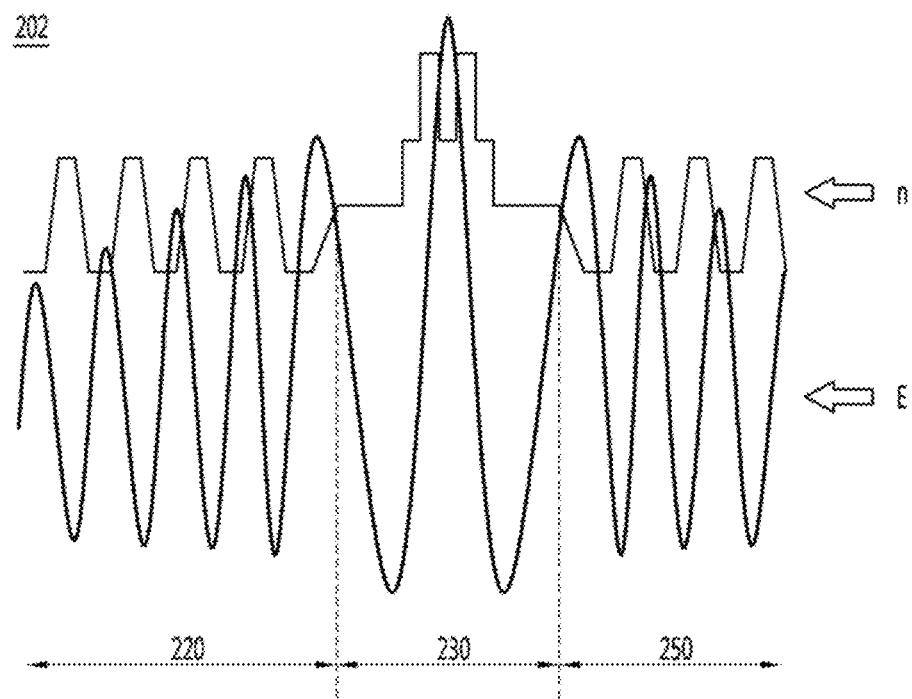
[Figure 26]
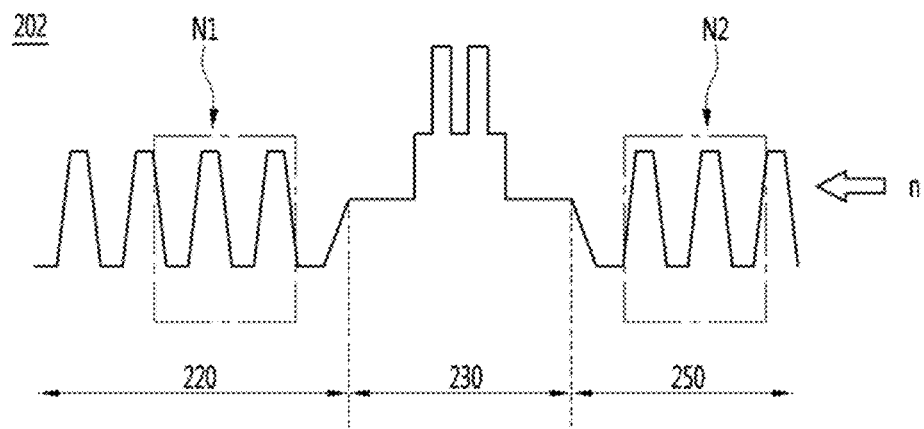

[Figure 27]
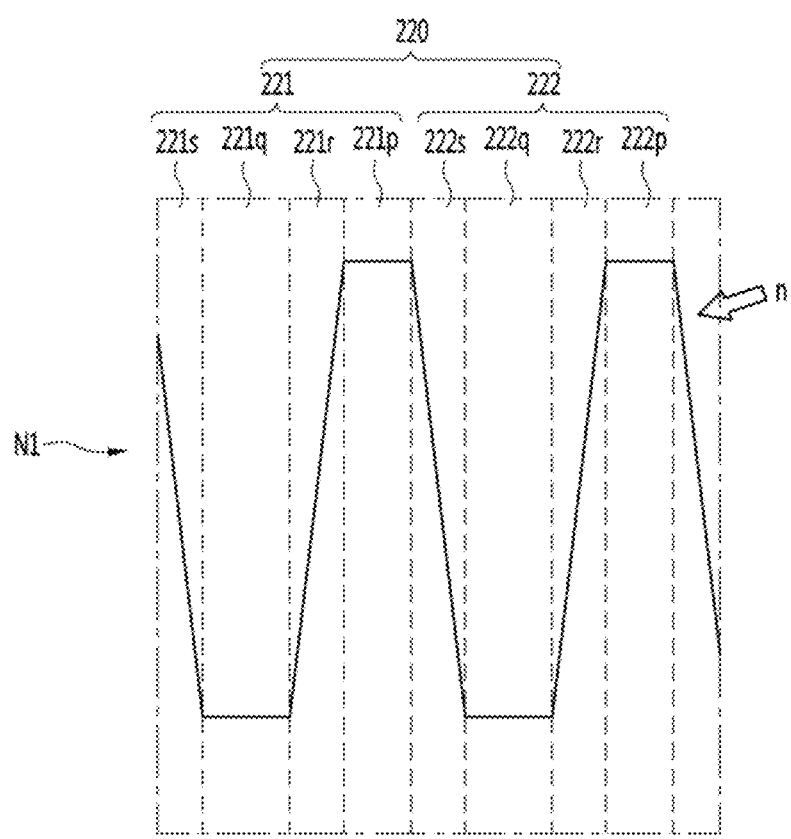

[Figure 28]
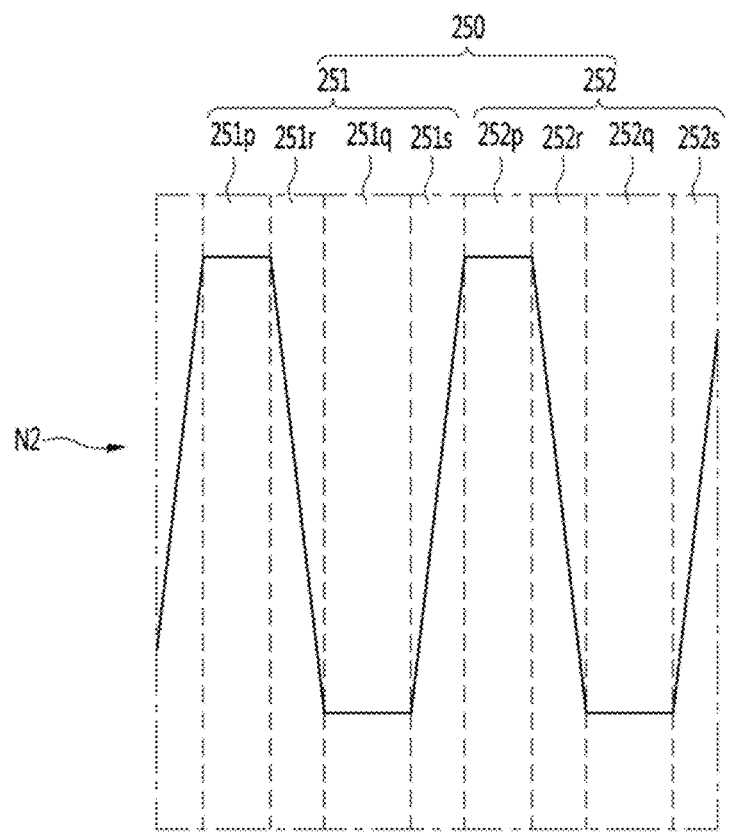

[Figure 29]
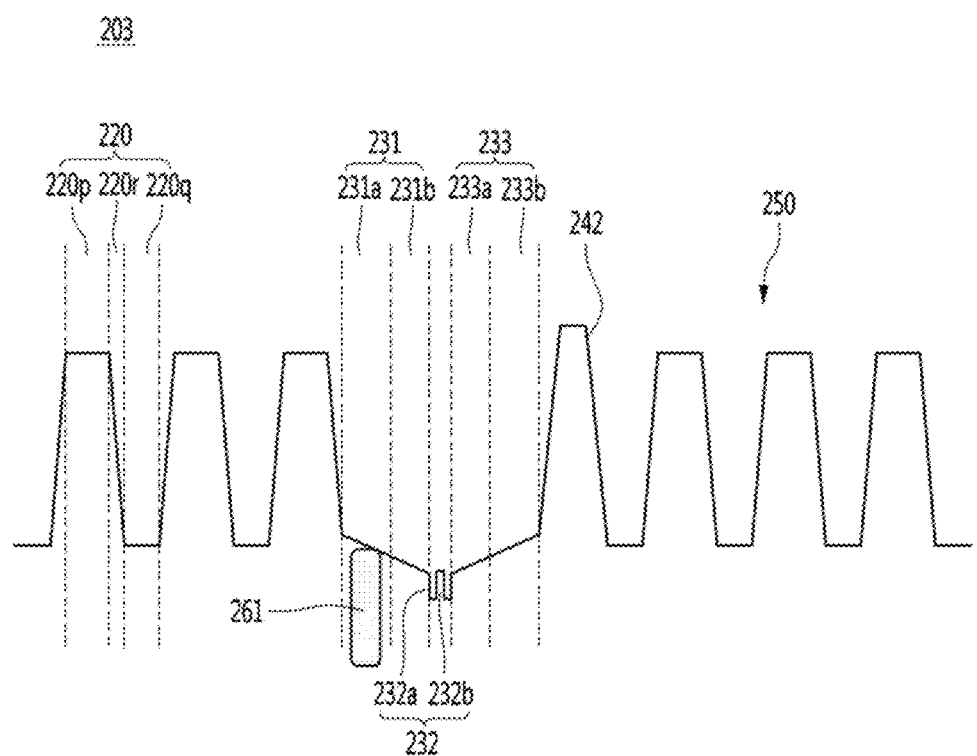

[Figure 30]
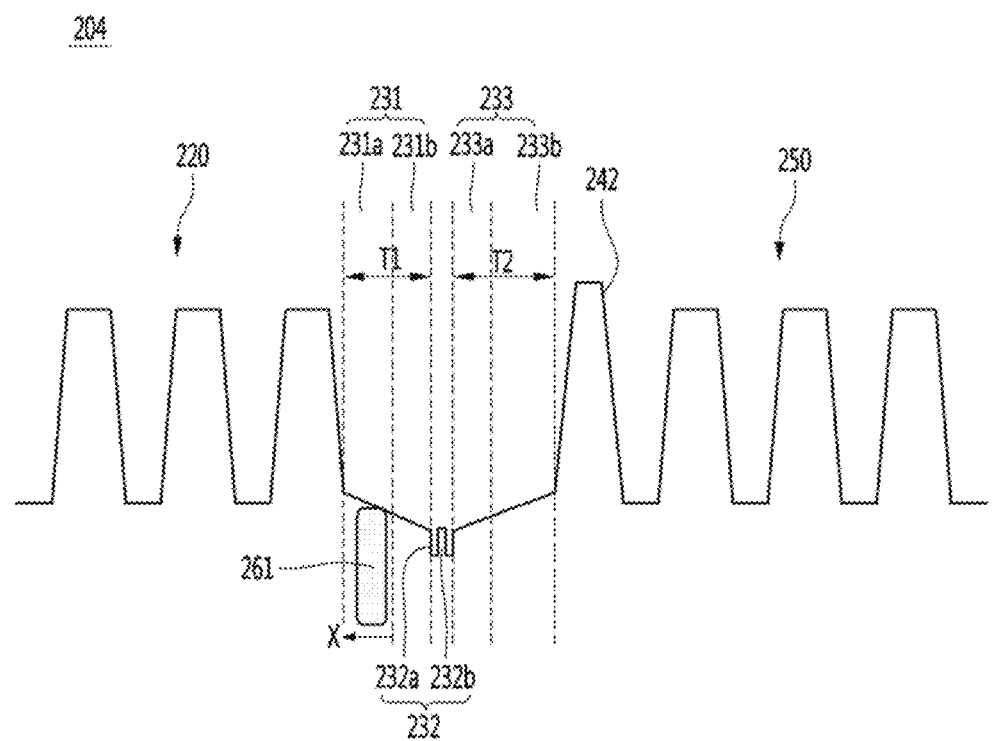

[Figure 31a]
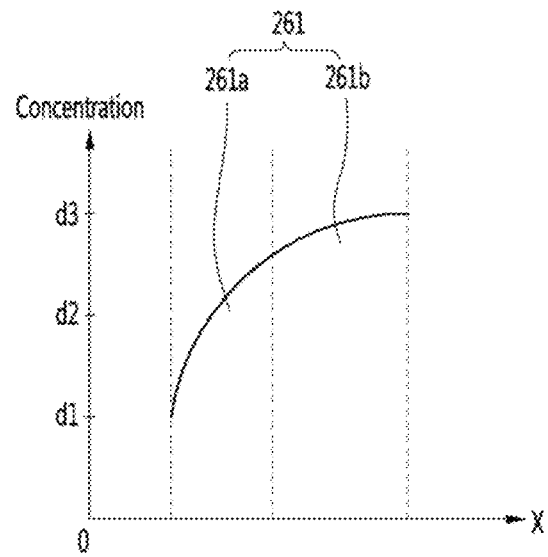
[Figure 31b]
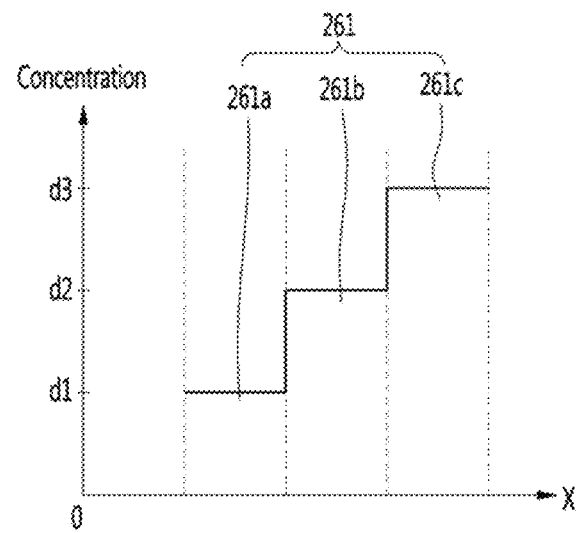

[Figure 32]
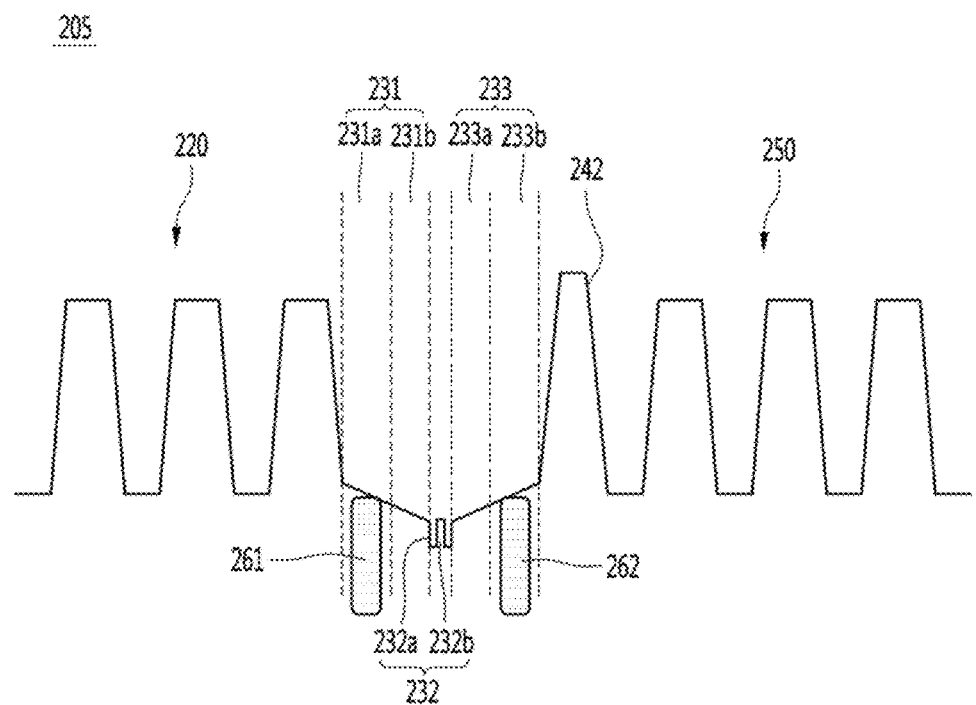

[Figure 33]
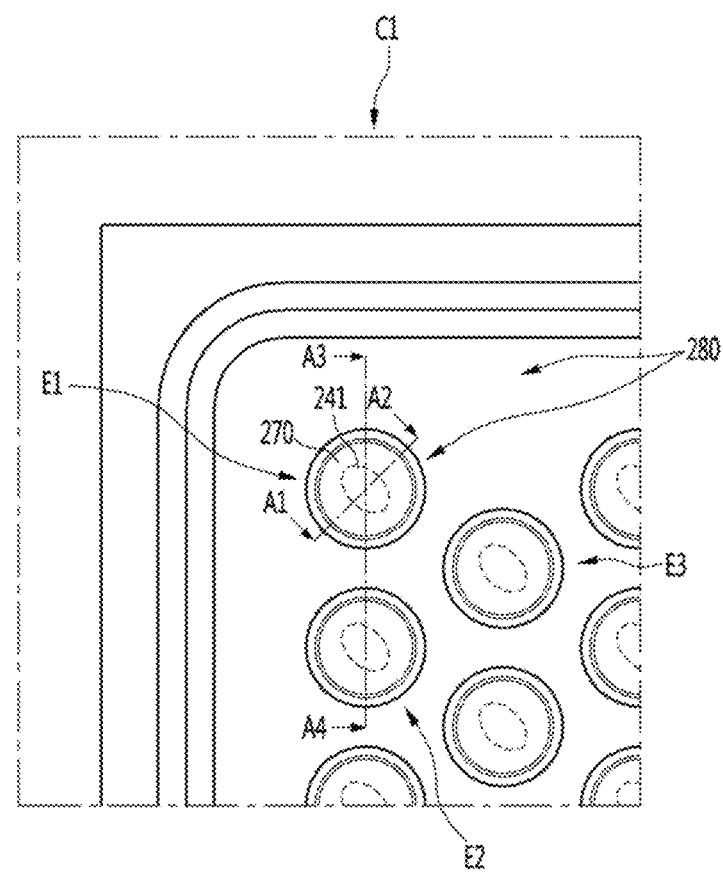

【Figure 34】
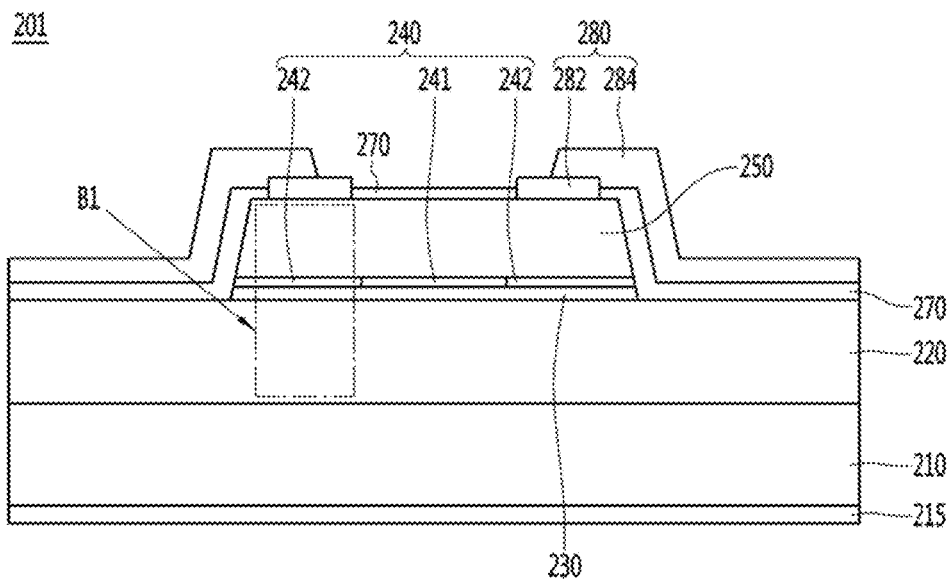
【Figure 35a】
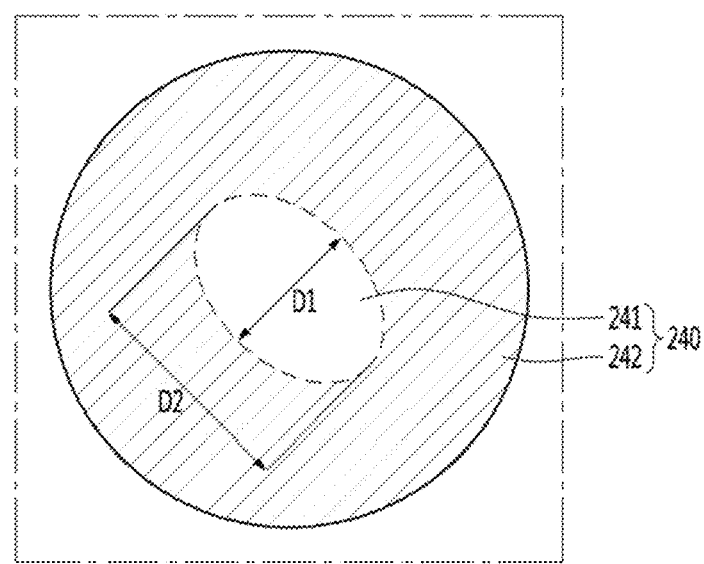

[Figure 35b]
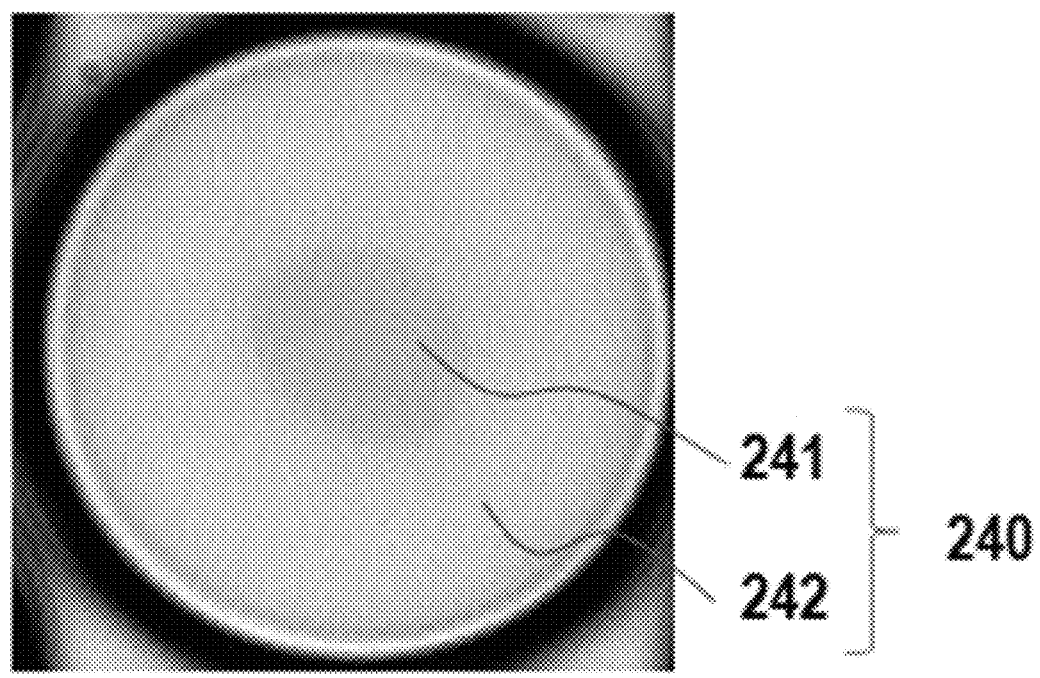

[Figure 36a]
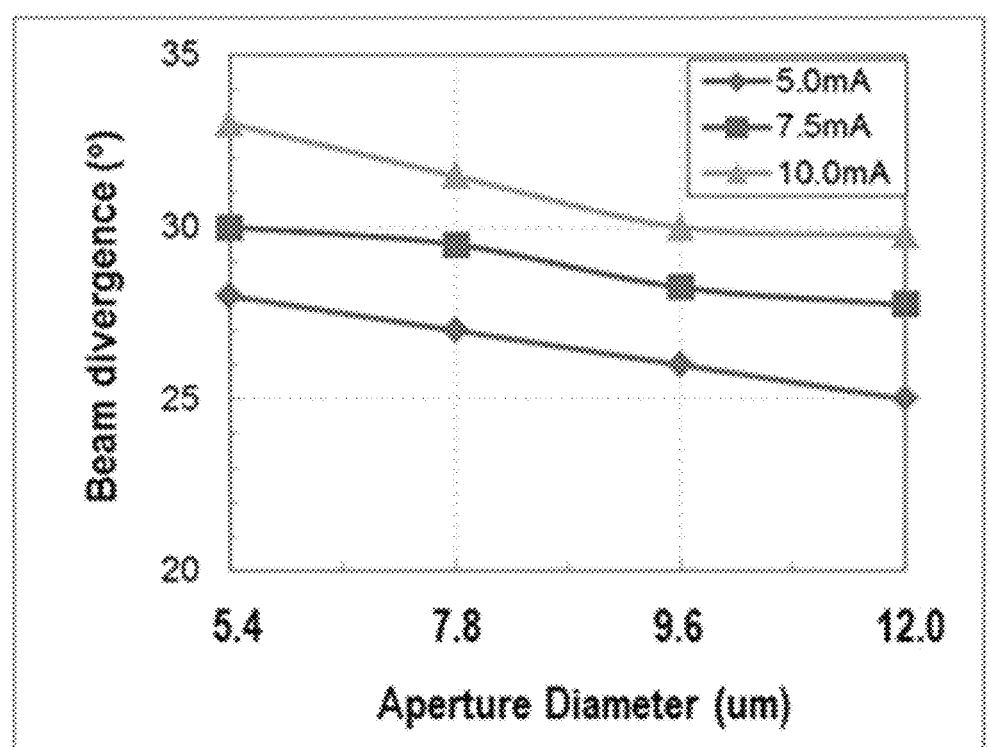

[Figure 36b]
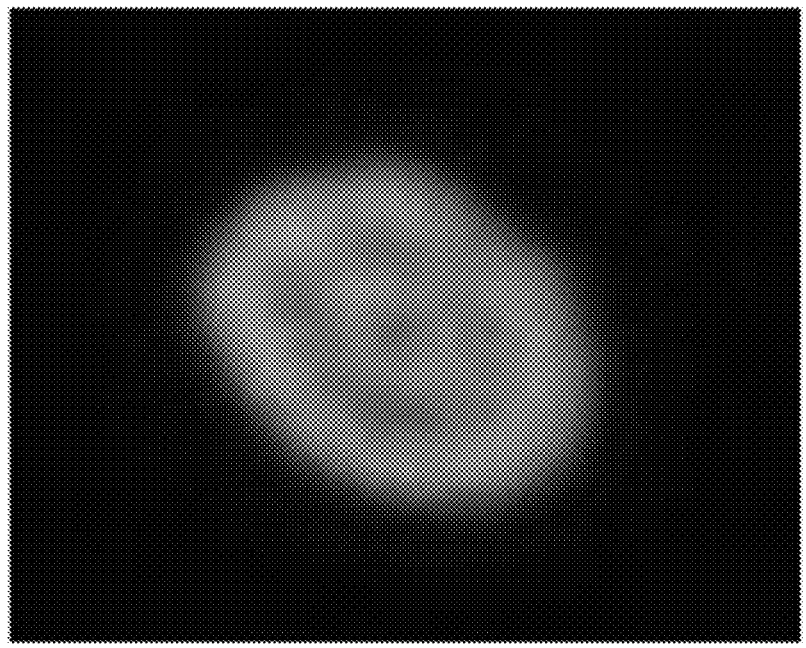
[Figure 36c]
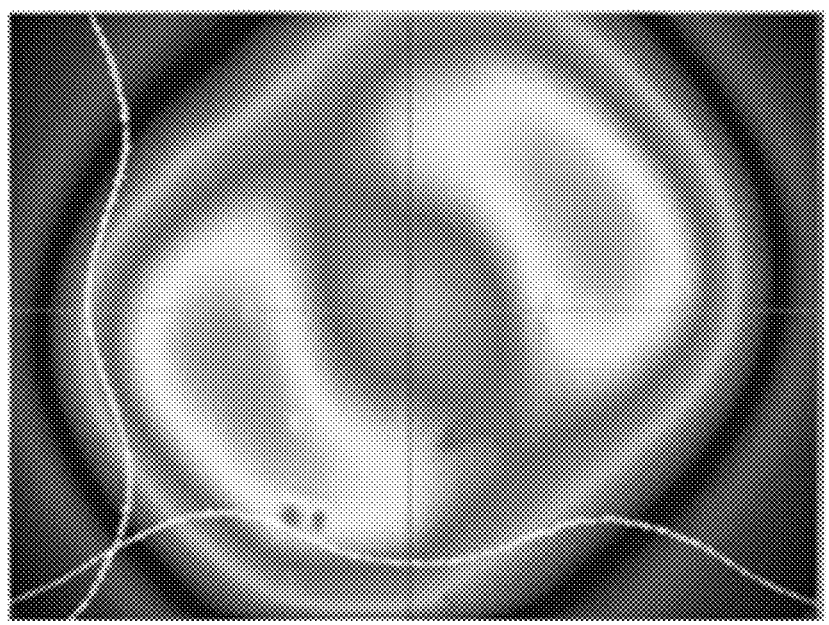

[Figure 37a]
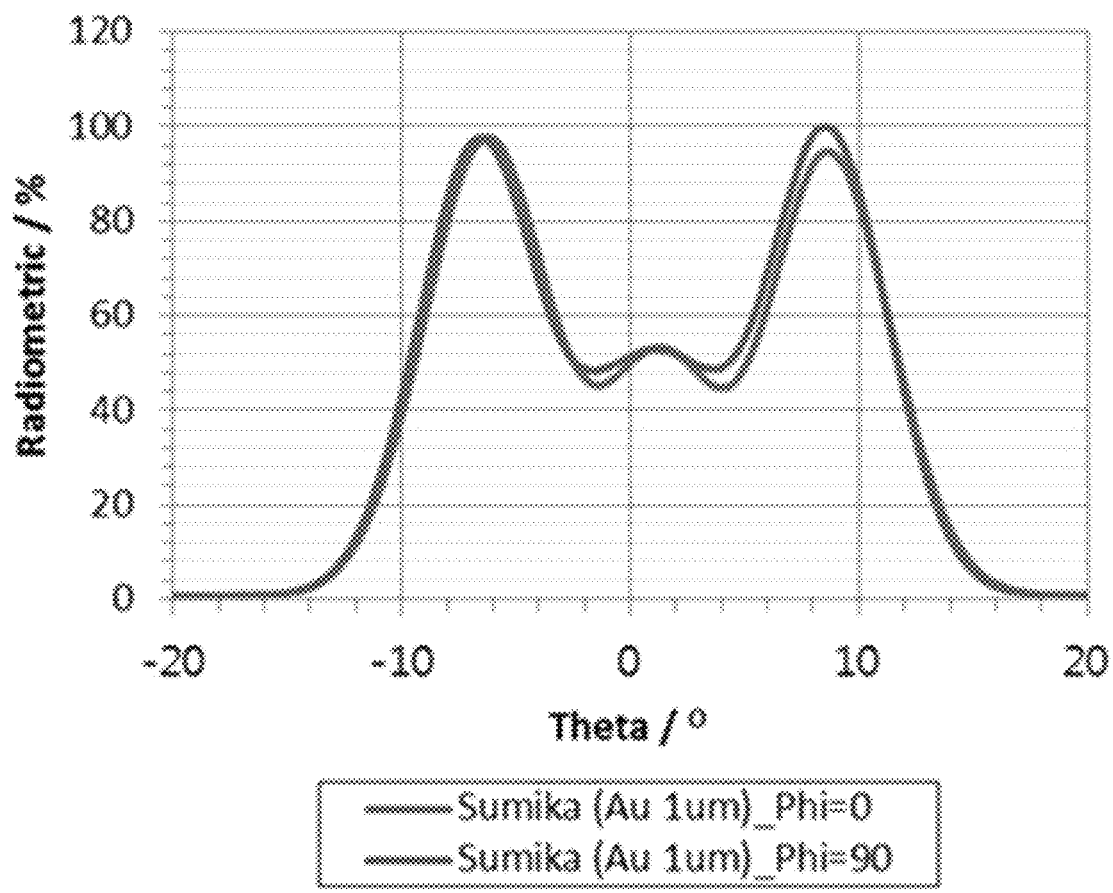

【Figure 37b】
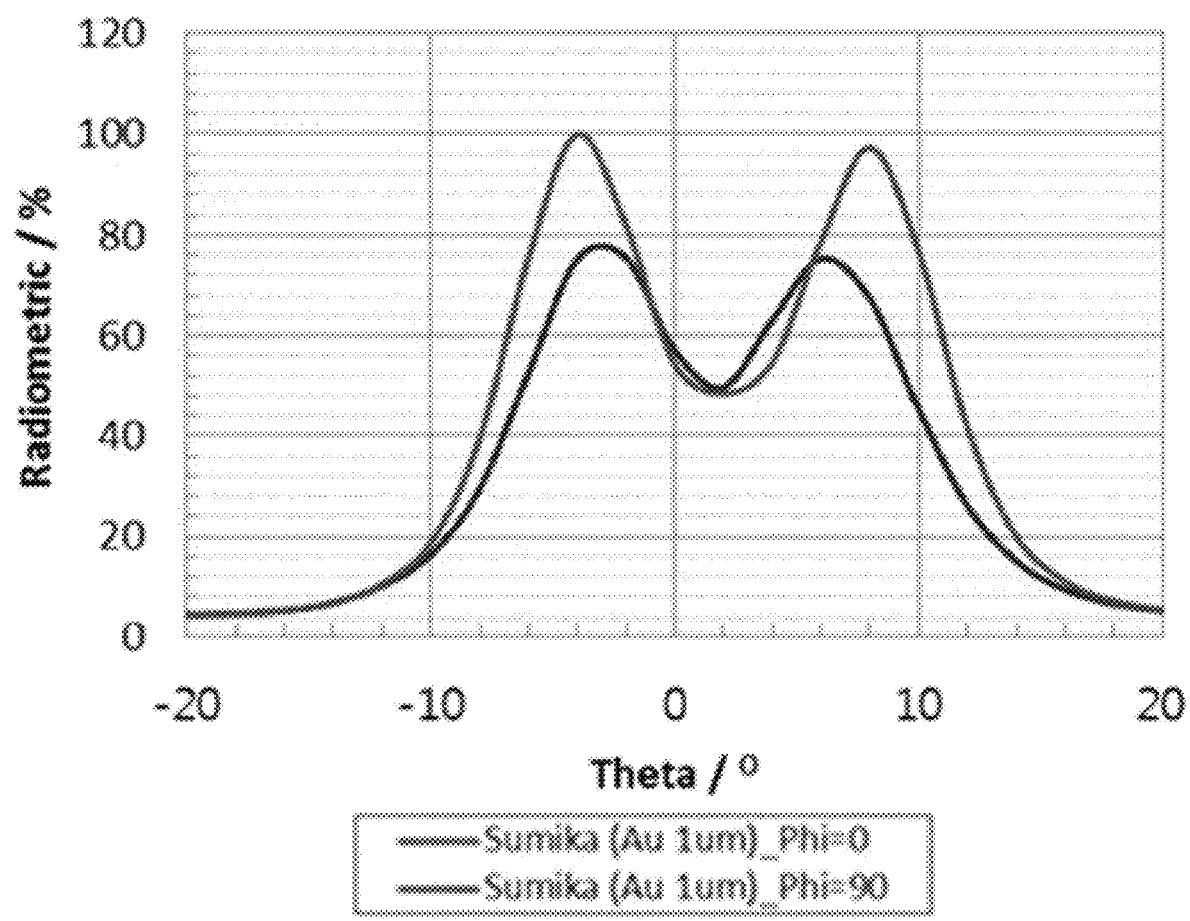

[Figure 38]
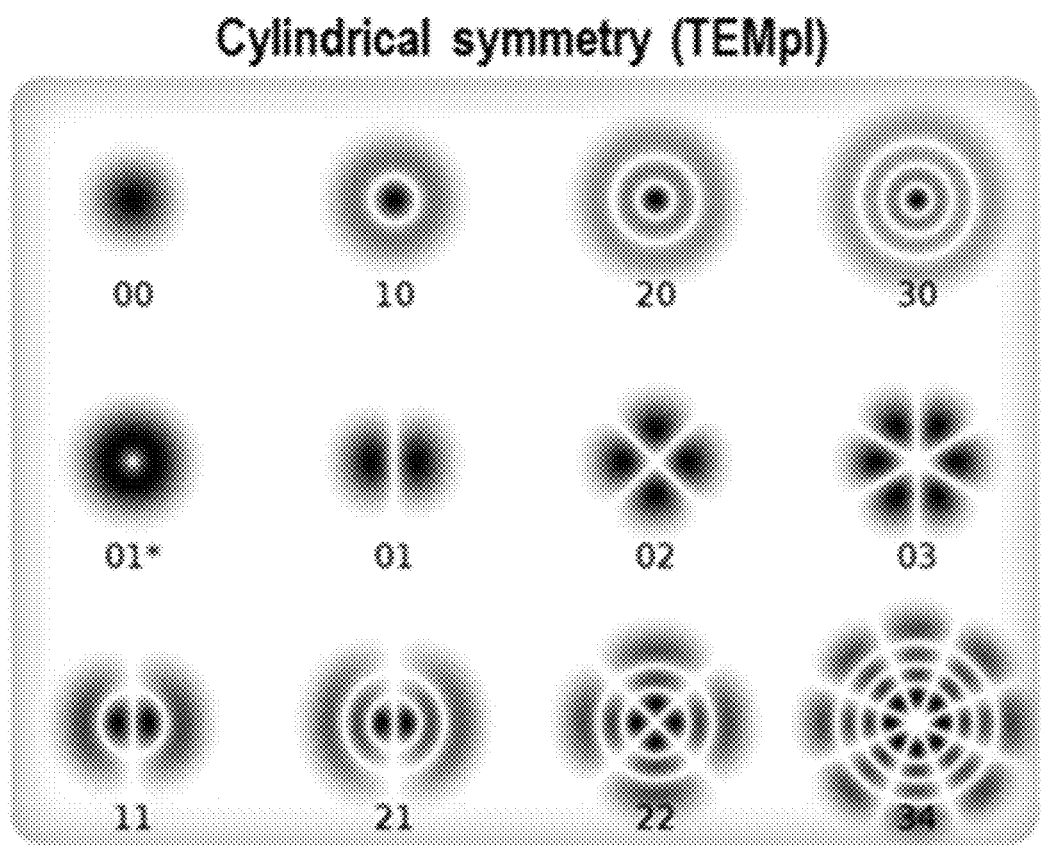

[Figure 39]
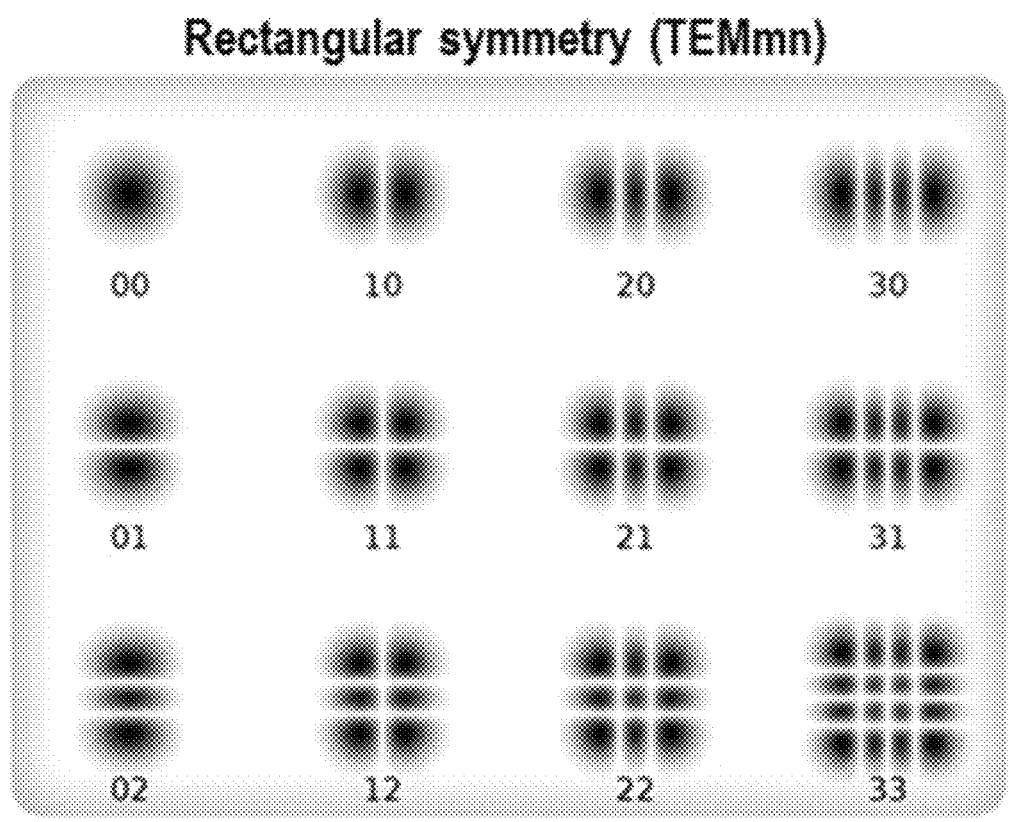

[Figure 40a]
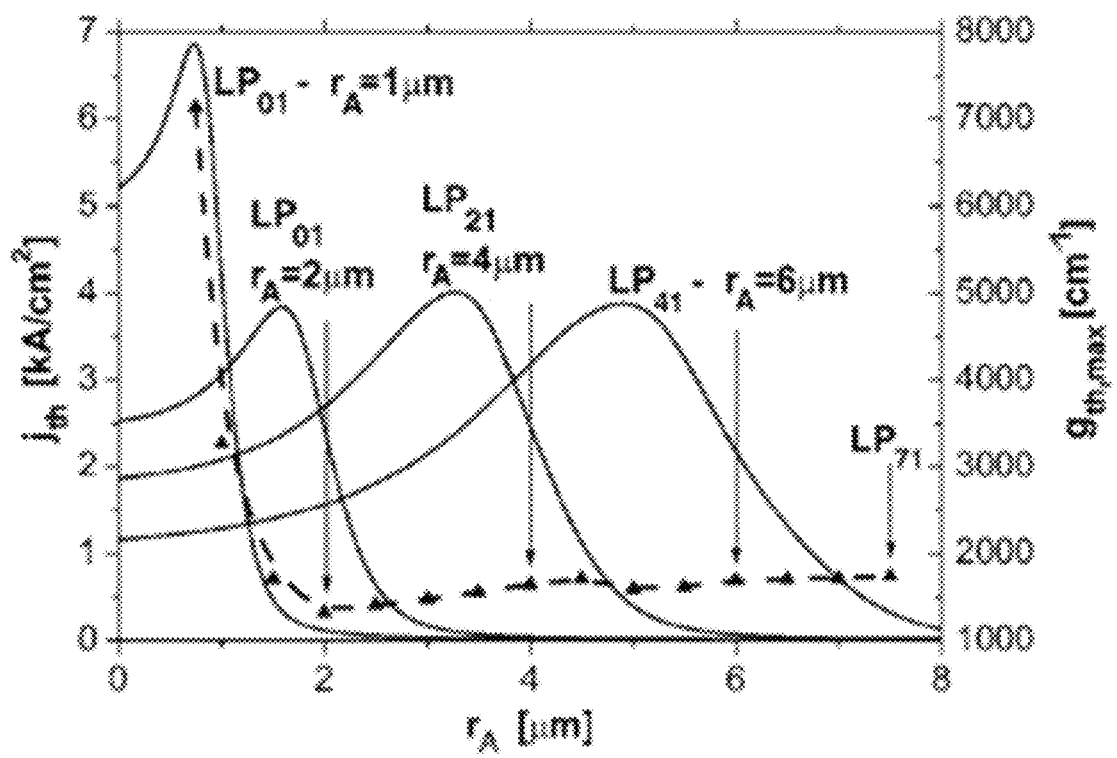

[Figure 40b]
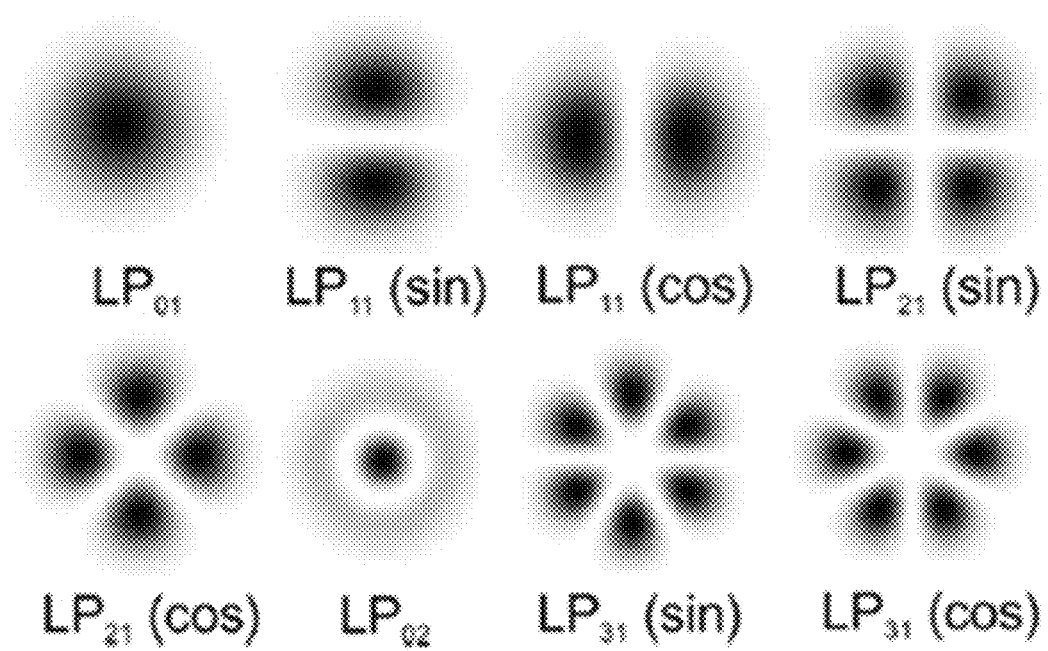

[Figure 40c]

| Items | (RC) Circle | (EE) Ellipsoidal | |
|---|---|---|---|
| Aperture | ○ | ○ | |
| 1mA | $LP_{01}$ | $LP_{11}$ | |
| 3mA | $LP_{22}$ | $LP_{32}$ | ⎫ |
| 5mA | $LP_{32}$ | $LP_{32}$ | ⎬ Mode maintained |
| 7mA | $LP_{33}$ | $LP_{32}$ | ⎭ |

[Figure 41a]
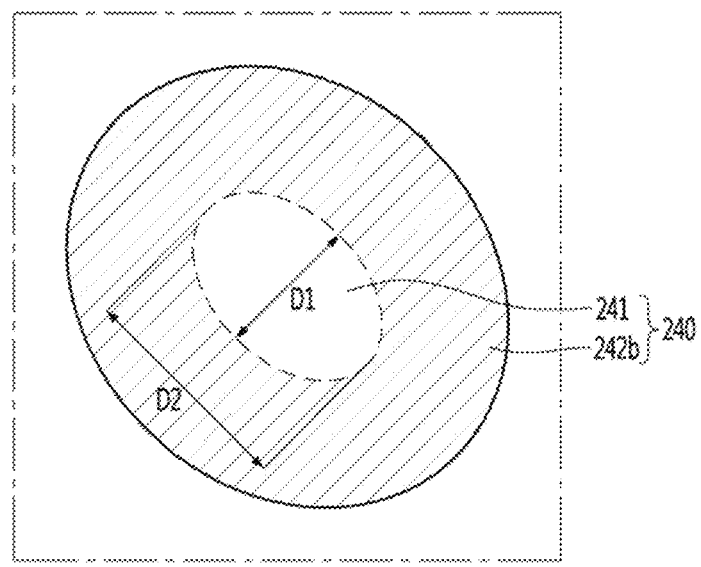
[Figure 41b]
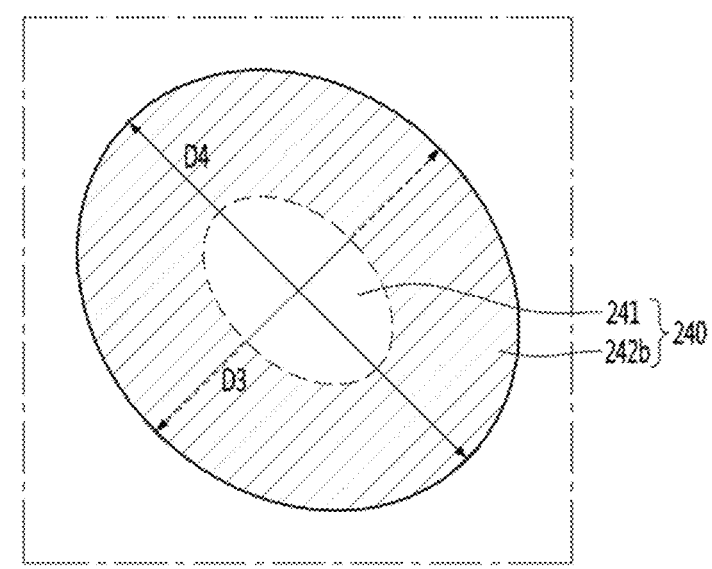

[Figure 42a]
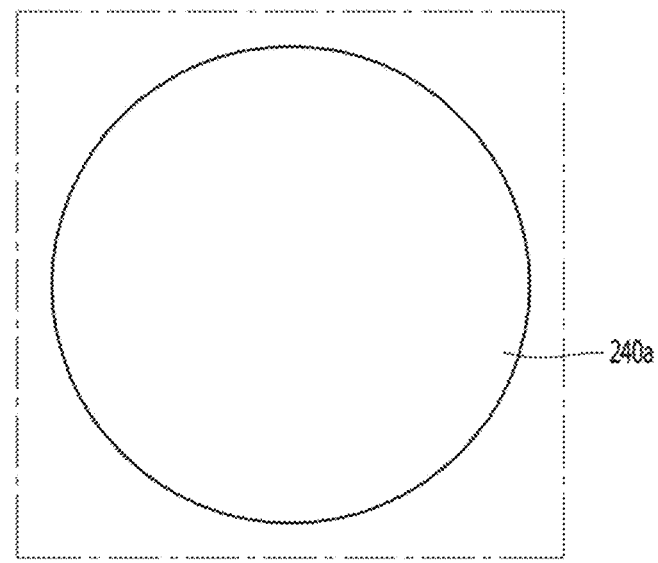
[Figure 42b]
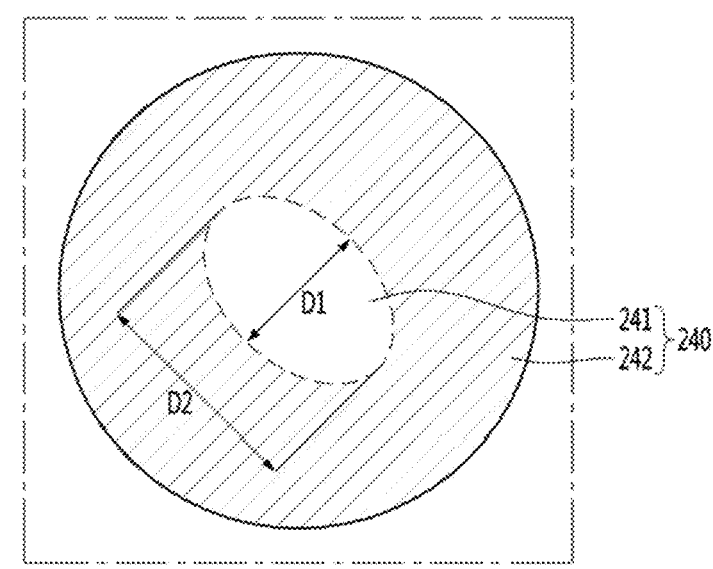

[Figure 43a]
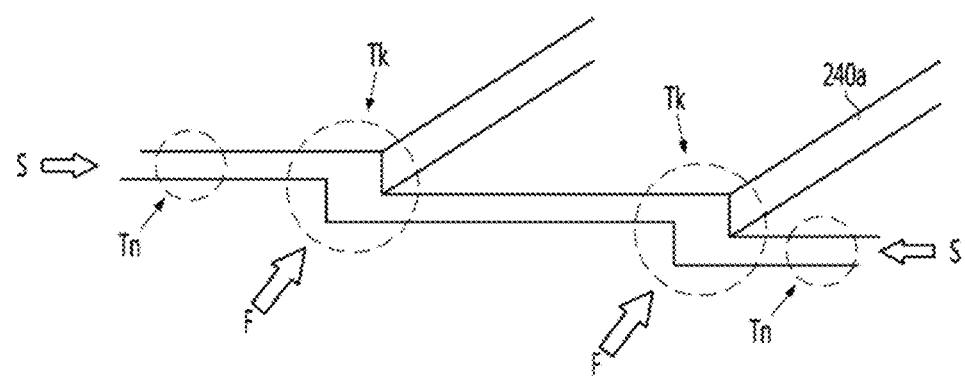

【Figure 43b】
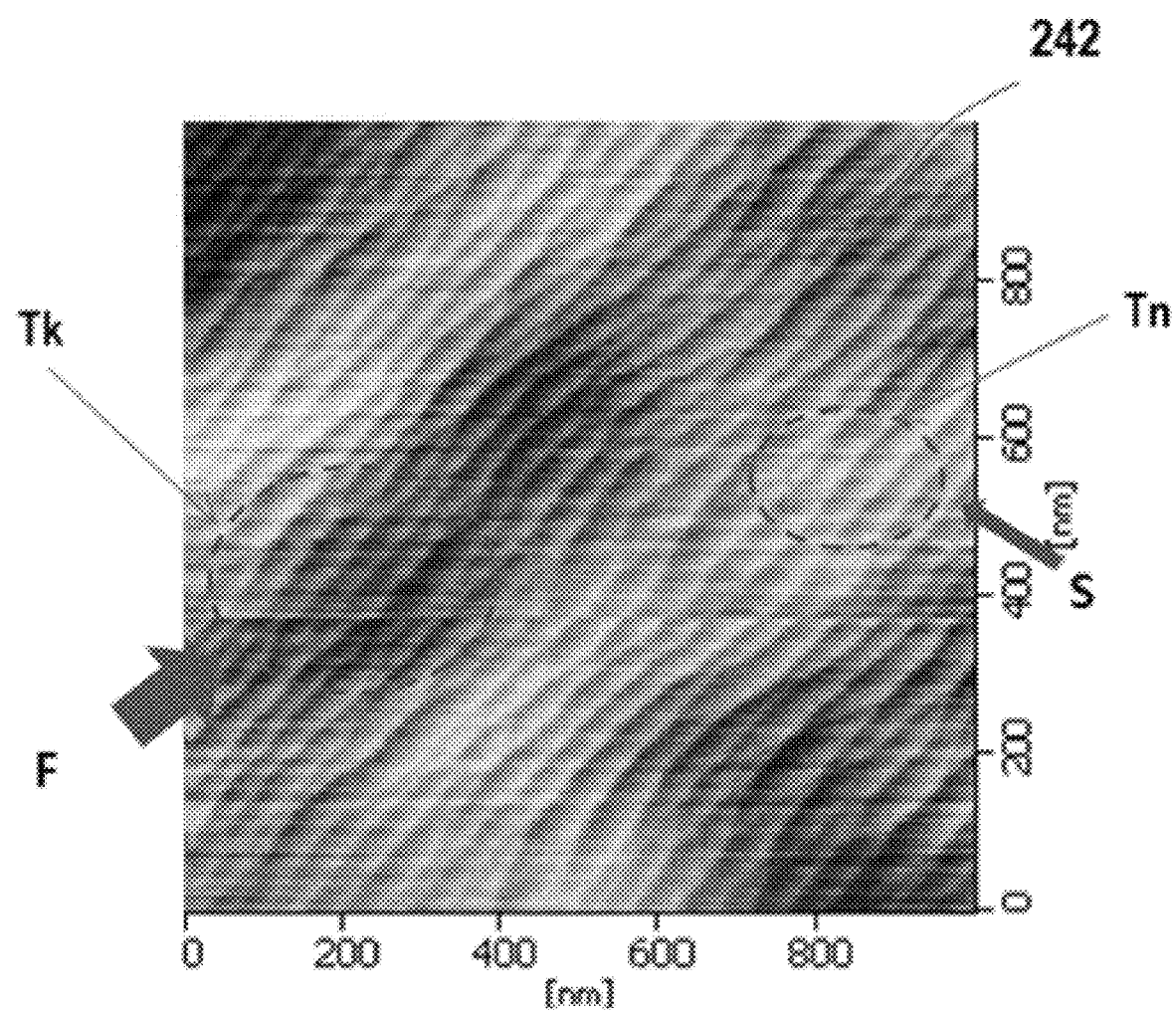

[Figure 44a]
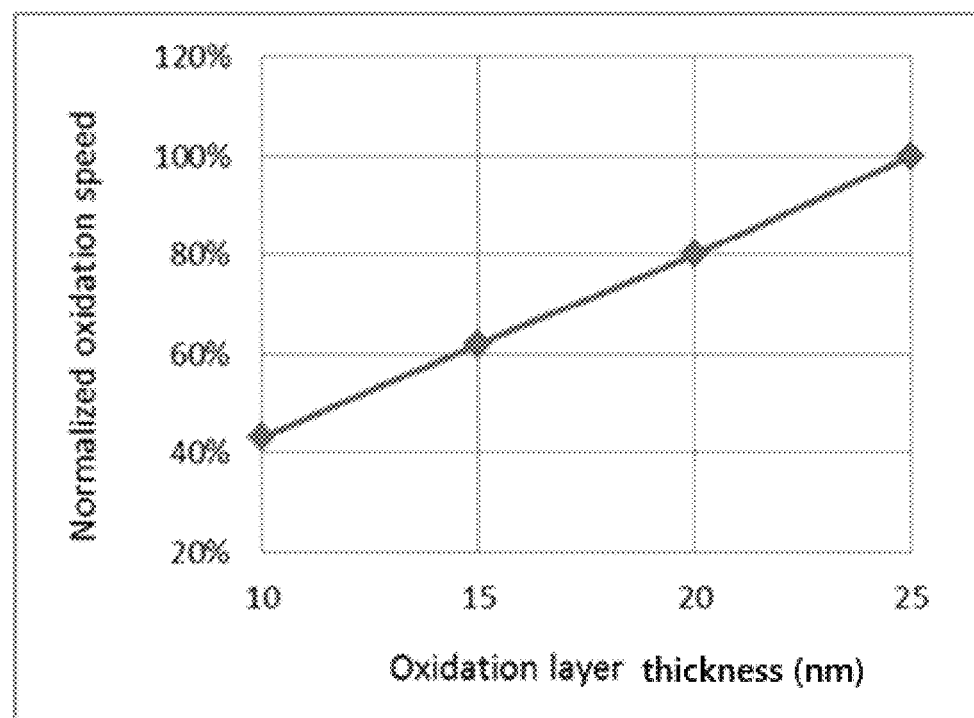
[Figure 44b]
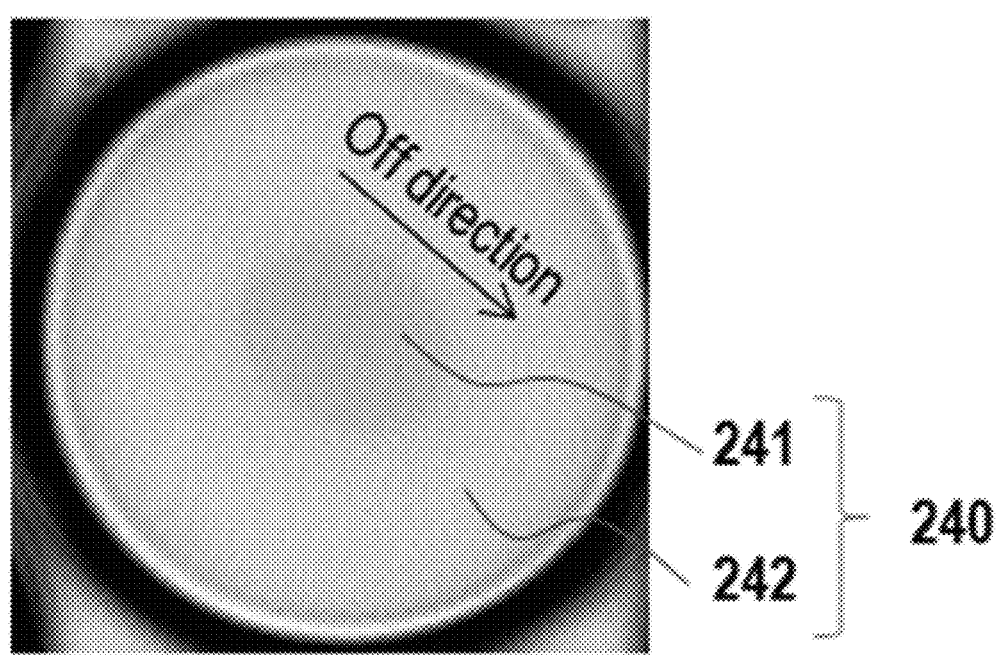

[Figure 45a]
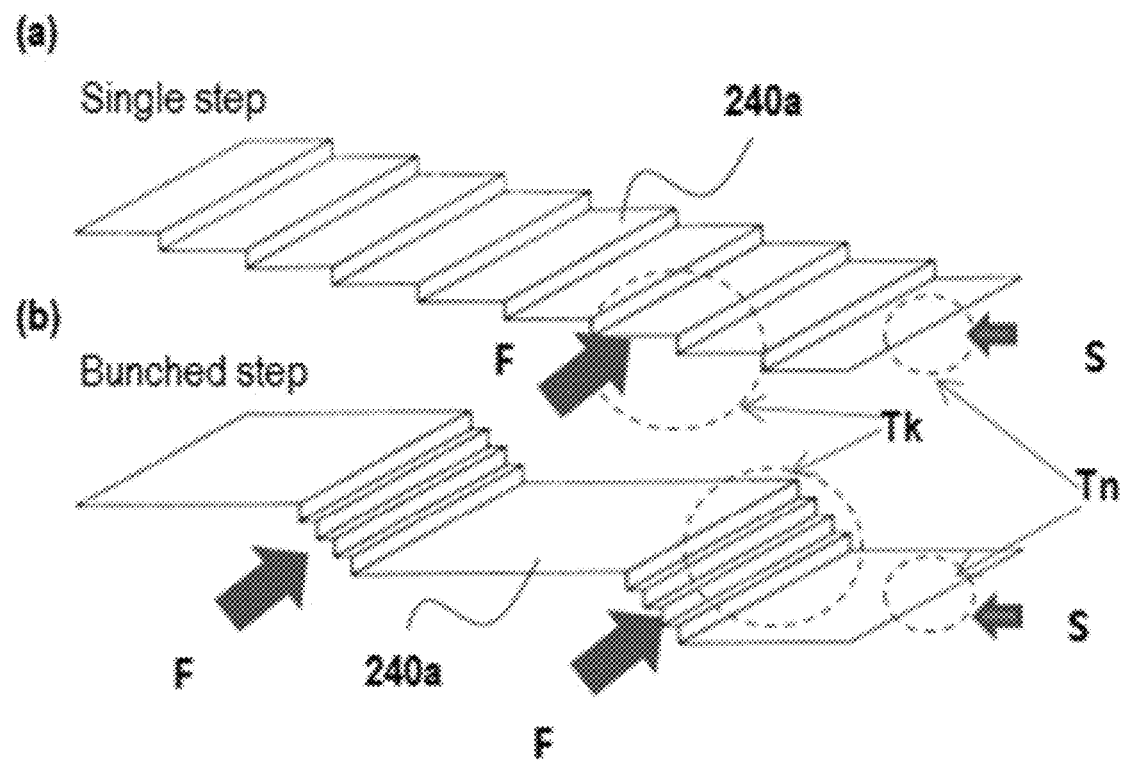

[Figure 45b]
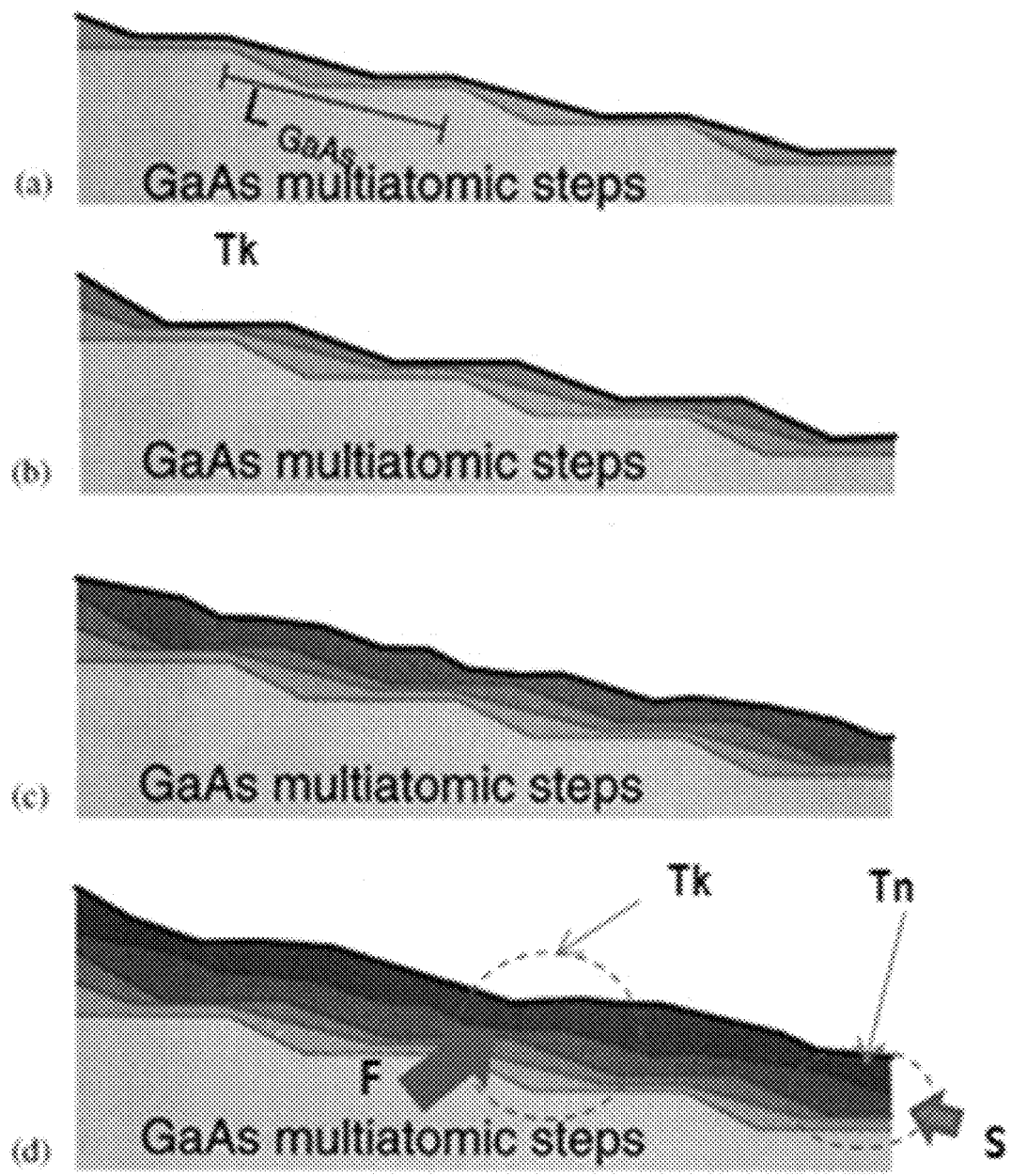

[Figure 45c]
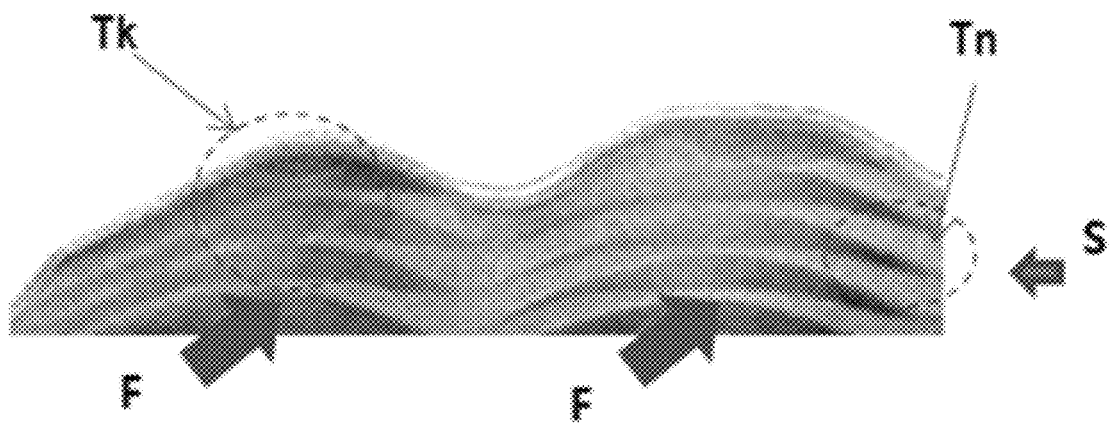
[Figure 46a]
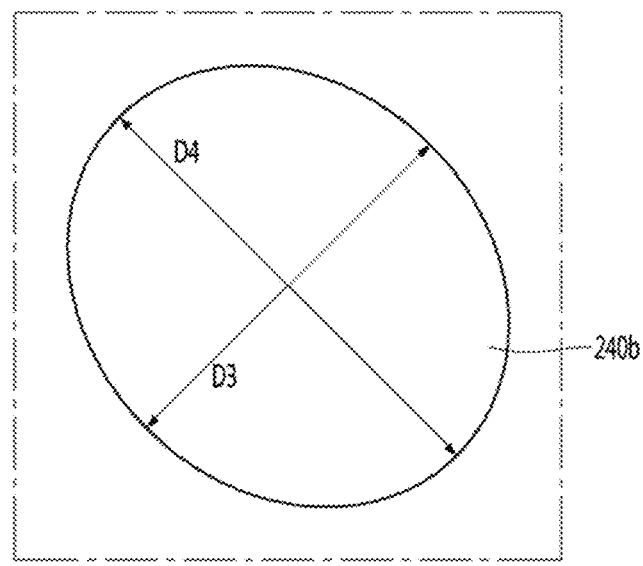

[Figure 46b]
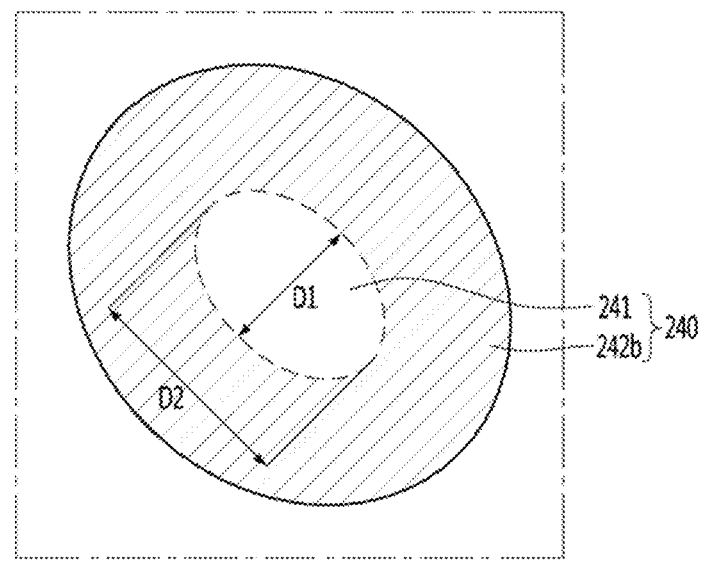
[Figure 47]
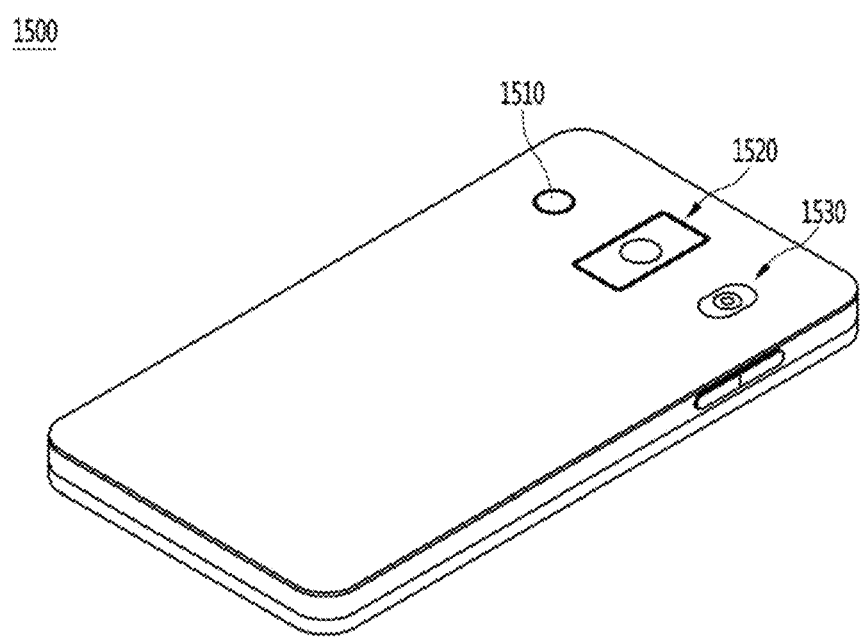

SURFACE EMITTING LASER DEVICE AND A LIGHT EMITTING DEVICE INCLUDING THE SAME

CROSS REFERENCE TO RELATED APPLICATIONS

This application is the National Phase of PCT International Application No. PCT/KR2019/005621, filed on May 10, 2019, which claims priority under 35 U.S.C. 119(a) to Patent Application Nos. 10-2018-0053703, filed in the Republic of Korea on May 10, 2018, 10-2018-0053706, filed in the Republic of Korea on May 10, 2018, and 10-2018-0100340, filed in the Republic of Korea on Aug. 27, 2018., all of which are hereby expressly incorporated by reference into the present application.

TECHNICAL FIELD

The embodiment relates to a semiconductor device, and more particularly, to a surface emitting laser device and a light emitting device including the same.

BACKGROUND ART

A semiconductor device including a compound such as GaN or AlGaN has many advantages, such as having a wide and easily adjustable band gap energy, and thus can be used in various ways as a light emitting device, a light receiving device, and various diodes.

In particular, light emitting devices such as light emitting diodes and laser diodes using a group III-V or II-VI compound semiconductor material of semiconductors can be implemented various colors such as blue, red, green, and ultraviolet light. In addition, it is possible to implement highly efficient white light rays by using fluorescent materials or by combining colors. In addition, it has advantages of low power consumption, semi-permanent life, fast response speed, safety and environmental friendliness compared to conventional light sources such as fluorescent lamps and incandescent lamps.

In addition, when light-receiving devices such as photodetectors and solar cells are also manufactured using compound semiconductor materials of Groups III-V or II-VI of semiconductors, the development of device materials generates photocurrent by absorbing light in various wavelength ranges. By doing so, light in various wavelength ranges from gamma rays to radio wavelength ranges can be used. In addition, it has the advantages of fast response speed, safety, environmental friendliness, and easy control of device materials, so it can be easily used for power control or ultra-high frequency circuits or communication modules.

Accordingly, a light-emitting diode backlight is replacing a cold cathode fluorescent lamp (CCFL) constituting a transmission module of an optical communication means and a backlight of a liquid crystal display (LCD) display device. Applications are expanding to white light-emitting diode lighting devices that can replace fluorescent or incandescent bulbs, automobile headlights and traffic lights, and sensors that detect gas or fire.

In addition, applications can be extended to high-frequency application circuits, other power control devices, and communication modules. For example, in the conventional semiconductor light source device technology, there is a vertical-cavity surface-emitting laser (VCSEL), which is used for optical communication, optical parallel processing, and optical connection. On the other hand, in the case of a laser diode used in such a communication module, it is designed to operate at a low current.

Meanwhile, response speed was important in the existing structure for data optical communication, but as it is recently applied to a high power PKG for a sensor, optical output and voltage efficiency become important characteristics.

For example, a 3D sensing camera is a camera capable of capturing depth information of an object, and has recently been in the spotlight in conjunction with augmented reality. On the other hand, for sensing the depth of the camera module, a separate sensor is mounted, and it is divided into two types: Structured Light (SL) method and Time of Flight (ToF) method.

In the structured light (SL) method, a laser of a specific pattern is radiated onto a subject, and the depth is calculated by analyzing the degree of deformation of the pattern according to the shape of the subject surface, and then combining it with a picture taken by an image sensor to obtain a 3D photographing result.

In contrast, the ToF method is a method in which a 3D photographing result is obtained by calculating the depth by measuring the time the laser is reflected off the subject and returning, and then combining it with the picture taken by the image sensor.

Accordingly, the SL method has an advantage in mass production in that the laser must be positioned very accurately, while the ToF technology relies on an improved image sensor, and it is possible to adopt either method or both methods in one mobile phone.

For example, a 3D camera called True Depth can be implemented in the front of a mobile phone in the SL method, and the ToF method can be applied in the rear.

Meanwhile, when a VCSEL is applied to a structured light sensor, a time of flight (ToF) sensor, or a laser diode autofocus (LDAF), it operates at a high current. Accordingly, problems such as a decrease in luminous intensity output or an increase in threshold current occur.

As described above, in the VCSEL package technology, the ToF method extracts Depth by calculating the time difference of the reflected pulse beam by the flash-type pulse projection through the VCSEL chip as a light source and the diffuser.

For example, FIG. 1 is an exemplary diagram of a method of determining a field of interest (FOI) and a field of view (FOV) by a combination of beam divergence and diffuser beam angle in a VCSEL chip. Accordingly, it is important to control the beam divergence in the VCSEL chip to determine the FOI and FOV.

Next, FIG. 2A shows mode change data according to an aperture size in the related art.

In the related art, the aperture size is increasing in accordance with the demand for a high-output VCSEL package.

In VCSEL technology, a small size aperture, for example, an aperture with a diameter ($r_A$) of 3 μm or less is preferable for stabilization in a single fundamental mode, but in a high-power VCSEL package, a large size aperture (Large size aperture) is required.

On the other hand, as shown in FIG. 2A, when the aperture size, for example, the diameter $r_A$ of the aperture is increased, a problem occurs in that the light emission mode changes or the divergence angle changes due to mode hopping.

Specifically, referring to FIG. 2A, when the aperture diameter $r_A$ increases, the divergence mode changes, so that a higher mode shift occurs.

For example, in the related art, as the aperture size increases, a higher mode shift occurs in LP01 ($r_A$=2 µm), LP21 ($r_A$=4 µm), and LP41 ($r_A$=6 µm).

However, such a phenomenon of changing to a higher-order mode causes a problem in that the beam pattern is split or the divergence angle of beams is increased.

For example, FIG. 2B shows beam profile data in a far field of a conventional VCSEL, and a beam pattern of an outgoing beam is split with an increase in applied current. For example, FIG. 2B is a condition in which the threshold current $I_{th}$ is 1.2 mA. At this time, the applied current increases from 1.2 mA (b1) to 3.0 mA (b2) and 5.0 mA (b3) in the VICSEL having an aperture with a diameter ($r_A$) of 4.5 µm in a circular shape. Accordingly, it can be seen that a problem occurs in that the beam pattern of the outgoing beam is split by changing the oscillation mode to a higher-order mode.

Meanwhile, FIG. 2C is beam profile data in a far field of a conventional VCSEL, and the aperture diameter $r_A$ is 6.0 µm. At this time, immediately after lasing, the oscillation was in a higher-order mode, and the multi-mode oscillation became more intense as the current increased.

On the other hand, in this application, the far field beam profile of the surface-emitting laser device was measured using a beam profiler measuring instrument 8050M-GE-TE (Thorlabs, Inc.) (8050M-GE-TE specification information: 8 Megapixels Monochrome Scientific CCD Camera, Hermetically Sealed Cooled Package, GigE Interface). However, the measuring equipment of the far field beam profile is not limited thereto.

On the other hand, as shown in FIG. 2A, when the aperture size, for example, the radius $r_A$ of the aperture increases, a problem arises in that the emission mode changes or the divergence angle changes due to mode hopping.

Specifically, referring to FIGS. 2A and 2D, when the radius $r_A$ of the aperture is increased, the divergence mode is changed, so that a higher mode shift occurs.

For example, in the related art, as the aperture size increases, a higher mode shift occurs in LP01 ($r_A$=2 µm), LP21 ($r_A$=4 µm), and LP41 ($r_A$=6 µm).

However, the change to the higher-order mode causes a problem in that the divergence angle of beams is increased or the beam pattern is split.

For example, as shown in FIG. 2B, as the aperture size increases, a change to the higher-order mode occurs in LP01 ($r_A$=2 µm), LP21 ($r_A$=4 µm), and LP41 ($r_A$=6 µm), there is a problem that the splitting phenomenon of the beam pattern increases.

Next, FIG. 2E shows that the oscillation mode changes from (a) to (d) according to an increase in applied current or an increase in aperture size of the conventional VCSEL. Accordingly, it can be seen that a problem in which the beam pattern of the exit beam is split occurs.

Next, with respect to another technical problem, according to the related art, when a current crowding occurs at an aperture edge as a high current is applied, damage to the aperture, which is a laser emission area, may occur. In addition, as the dominant mode is oscillated at a low current and a high current is applied, the divergence angle of beams is increased due to the oscillation of the higher mode.

In addition, in the conventional VCSEL structure, reflectance is increased through a large number of reflective layers, for example, distributed Bragg reflectors (DBRs). For example, in the related art, DBR, which is a reflective layer, increases reflectance by alternately arranging AlxGaAs-based materials with different Al compositions.

However, there is an issue in which series resistance occurs in the DBR, and in the related art, there is an attempt to improve voltage efficiency by lowering the resistance by increasing the doping concentration in order to prevent the occurrence of resistance in the DBR. However, when the doping concentration is increased, internal light absorption is generated by the dopant, resulting in a technical contradiction in which the light output decreases.

In addition, in the conventional DBR, which is a reflective layer, as AlxGaAs-based materials are alternately arranged with different compositions of Al, an electric field is generated by energy band bending at the interface between adjacent DBR layers. In addition, such an electric field becomes a carrier barrier, resulting in a problem of lowering the light output.

In addition, when developing a VCSEL's high-voltage package, optical output and voltage efficiency are important characteristics, but there is a limit to simultaneously improving the optical output and voltage efficiency.

For example, the VCSEL structure of the related art has an active region including an active layer and a predetermined cavity, and the active region has a technical problem in that a driving voltage increases due to a high internal resistance and a voltage efficiency decrease.

In addition, in order to improve light output in the related art, optical confinement is required around the active layer, but there is no suitable solution for this in the related art.

Meanwhile, FIG. 2F is an IR micrograph of an aperture shape in a VCSEL chip, and a circular aperture (A) may be defined by an oxide aperture (O).

Meanwhile, FIG. 2G is a near field image in the VCSEL chip, and FIG. 2H is a beam profile in the far field in the VCSEL chip.

Referring to FIGS. 2G and 2H, the light emission distribution of the circle aperture of the VCSEL chip is circular, and the horizontal and vertical ratio is 1. It is a situation where the divergence angle of the diffuser must be designed differently according to the FOI spec of the module.

On the other hand, according to the related art, when high current is applied, current crowding at the aperture edge may cause damage to apertures, which are the laser emission areas. As a high current is applied after a dominant mode is oscillated, an optical problem occurs in that the divergence angle of beams is increased due to the higher mode oscillation.

In addition, in the conventional VCSEL structure, reflectance is increased through a large number of reflective layers, for example, distributed Bragg reflectors (DBRs). For example, in the related art, DBR, which is a reflective layer, increases reflectance by alternately arranging AlxGaAs-based materials with different Al compositions.

However, there is an issue that series resistance occurs in such a DBR, and in the related art, there is an attempt to improve voltage efficiency by lowering the resistance by increasing the doping concentration to prevent the occurrence of resistance in the DBR. However, when the doping concentration is increased, internal light absorption is generated by the dopant, resulting in a technical contradiction in which the light output decreases.

In addition, in the conventional DBR, which is a reflective layer, an electric field is generated by energy band bending at the interface between adjacent DBR layers as AlxGaAs-based materials are alternately arranged with different compositions of Al. In addition, such an electric field becomes a carrier barrier, resulting in a problem of lowering the light output.

In addition, when developing a VCSEL's high-voltage package, optical output and voltage efficiency are important characteristics, but there is a limit to simultaneously improving the optical output and voltage efficiency.

For example, the VCSEL structure of the related art has an active region including an active layer and a predetermined cavity, and the active region has a technical problem in that a driving voltage increases due to a high internal resistance and a voltage efficiency decrease.

In addition, in the related art, in order to improve the light output, optical confinement is required around the active layer, but there is no suitable solution for this in the related art.

Next, FIG. 3 shows near field image data according to an increase in applied current in a conventional VCSEL, and also shows data of a divergence angle of beams according to each applied current. Referring to FIG. 3, as the applied current increases from 3 mA (d1) to 5 mA (d2), 7.5 mA (d3) and 12 mA (d4), a mode division occurs as the emission point increases. Meanwhile, the divergence angle of beams increased rapidly to 21.0° 25.0° and 31.0°, respectively.

That is, according to the related art, when high current is applied, current crowding at the aperture edge may cause damage to the aperture, which is a laser emission area. The optical problem that the divergence angle of beams increases due to the oscillation of the higher mode as the dominant mode oscillates at a low current and then a high current is applied.

In particular, according to the related art, there is a problem in that the wavelength and the divergence angle change due to divergence mode hopping. In addition, for stabilization of the divergence mode, the aperture diameter is preferably less than about 5.0 μm, but a large aperture is required for high output. However, in an aperture of a larger size of 5.0 μm or more, a technical contradiction occurs in which the divergence angle of beams increases due to the instability of the oscillation mode.

DISCLOSURE

Technical Problem

The embodiment is to provide a surface-emitting laser device and a light emitting device including the same to prevent the problem of increasing the divergence angle of beams or splitting the beam pattern according to the higher mode shift despite input of a high current or an increase of the aperture size.

In addition, the embodiment is to provide a surface-emitting laser device and a light emitting device including the same capable of improving light output while improving voltage efficiency.

In addition, the embodiment is to provide a surface-emitting laser device and a light emitting device including the same capable of improving light output by minimizing the influence of a carrier barrier due to generation of an electric field in a reflective layer.

In addition, the embodiment is to provide a surface-emitting laser device and a light emitting device including the same capable of improving light output by improving optical confinement efficiency around an active layer.

In addition, the embodiment is to provide a surface-emitting laser device and a light emitting device including the same capable of controlling a divergence angle according to a field of interest (FOI) specification of a module.

Technical Solution

The surface-emitting laser device according to the embodiment includes a first reflective layer, an active region disposed on the first reflective layer, and disposed on the active region, a plurality of aperture regions 240 including an aperture 241 and an insulating region 242, a second reflective layer disposed on the aperture region, a first electrode and a second electrode electrically connected to the first reflective layer and the second reflective layer, respectively.

In the aperture region 240, an outer periphery of the insulating region 242 may be circular, and an outer periphery of the aperture 241 may have a polygonal shape.

The outer periphery of the aperture 241 may be one of a triangular to hexagonal polygonal shape.

The size S1 of the aperture 241, which is a length of the long diagonal line of the polygon, may be 6.0 μm to 12 μm.

The current density of the aperture 241 may be 8.3 kA/cm$^3$ to 30.0 kA/cm$^3$.

In an embodiment, the distance D between the centers of the apertures closest to each other in the plurality of aperture regions may be greater than twice of the radius R of each aperture region 240A and 240B, and less than 3 times.

The size R of the aperture region is a sum of a half S2 of the size of the aperture 241 and the shortest distance S2 from the polygonal edge of the aperture 241 to the outside of the insulating region 242.

The divergence angle of the aperture may be 20° to 27°.

The surface emitting laser device according to the embodiment includes a first electrode 215; a substrate 210 disposed on the first electrode 215; a first reflective layer 220 disposed on the substrate 210; an active region 230 disposed on the first reflective layer 220 and including a cavity region; an aperture region 240 disposed on the active region 230 and including an aperture 241 and an insulating region 242; a second reflective layer 250 disposed on the aperture region 240; and a second electrode 280 disposed on the second reflective layer 250.

The insulating region 242 of the aperture region 240 may include a first recess 242R1 formed inward from the outer surface.

The aperture 241 of the aperture region 240 may include a second recess 241R2 in an area corresponding to the first recess 242R1.

A plurality of first recesses 242R1 in the insulating region 242 may be provided.

The first angle θ of the first recess 242R1 may be 5° to 30°.

The second angle θ of the second recess 241R2 may be 2° to 45°.

The aperture 241 may include a first aperture 241q spaced apart from the second recess 241R2 and a second aperture 241p adjacent to the second recess 241R2.

The first radius r1 of the first aperture 241q may be larger than the second radius r2 of the second aperture 241p based on the center 240C of the aperture region.

In addition, a surface emitting laser device according to another embodiment includes a first electrode 215; a substrate 210 disposed on the first electrode 215; a first reflective layer 220 disposed on the substrate 210; an active region 230 disposed on the first reflective layer 220 and including a cavity region; an aperture region 240 disposed on the active region 230 and including an aperture 241 and an insulating region 242; a second reflective layer 250 disposed on the aperture region 240; and a second electrode 280 disposed on the second reflective layer 250.

The second electrode 280 may include a contact electrode 282 on the second reflective layer 250 and a pad electrode 284 electrically connected to the contact electrode 282.

The contact electrode 282 may include a first contact electrode 82a disposed outside the aperture 41 and a plurality of protruding electrodes 282p extending in a direction of the aperture 241.

In addition, the surface emitting laser device according to the embodiment includes a first electrode 215; a substrate 210 disposed on the first electrode 215; a first reflective layer 220 disposed on the substrate 210; an active region 230 disposed on the first reflective layer 220 and including a cavity region; an aperture region 240 disposed on the active region 230 and including an aperture 241 and an insulating region 242; a second reflective layer 250 disposed on the aperture region 240; and a second electrode 280 disposed on the second reflective layer 250.

The aperture 241 may include a round shape in which a horizontal cross section has a predetermined long axis D2 and a shorter short axis D1 than the predetermined long axis D2.

The long axis D2 of the horizontal section may range from 1.1 to 2.5 times than the short axis D1 of the horizontal section.

The round shape of the aperture 241 may include an ellipse.

In the aperture region 240, an outer edge of the horizontal cross section of the insulating area 242 may be circular.

In the embodiment, the first thickness of the insulating region in a direction parallel to the direction of the short axis D1 of the elliptical cross section of the aperture 241 is thicker than the second thickness of the insulating region in a direction parallel to the direction of the long axis D2 of the elliptical cross section of the aperture 241.

In another embodiment, a cross section of the second insulating region 242b in the aperture region 240 may be an ellipse.

The outer shape of the insulating region 242b disposed outside of the aperture 241 may include a round shape having a second long axis D4 and a shorter second short axis D3 than the second long axis D4.

The light emitting device of the embodiment may include the surface emitting laser device.

Advantageous Effects

The embodiment is possible to provide a surface-emitting laser device and a light emitting device including the same capable of solving the problem of increasing the divergence angle of beams or splitting the beam pattern according to the higher mode shift when a high current is applied or despite an increase in the aperture size.

For example, according to the embodiment, by controlling the available mode by being optical confinement at the edge of the polygon of the aperture 241 having excellent crystal quality, a higher mode shift is delayed, thereby delaying the mode has a special technical effect.

In addition, the embodiment of a surface-emitting laser device and a light-emitting device including the same can prevent the problem that the beam pattern of the outgoing beam is split due to higher mode shift by controlling the beam mode when a high current is applied or despite an increase in the aperture size.

For example, according to an embodiment, by disposing a recess or a dip in the aperture region, the available mode is controlled due to optical confinement by the recess or dip so that there is a special technical effect that shift is delayed and the mode is maintained.

For example, in the embodiment, by arranging four recesses or dips in the aperture region, mode oscillation may be possible only when x is an even number in the LPxy mode. Through this, there is a special technical effect that can secure the stabilization of the oscillation mode by increasing the energy margin in which a specific mode stably oscillates.

In addition, according to the embodiment, it is possible to provide a surface-emitting laser device and a light emitting device including the same capable of improving light output while improving voltage efficiency.

In addition, according to the embodiment, it is possible to provide a surface-emitting laser device and a light emitting device including the same capable of improving light output by minimizing the influence of a carrier barrier due to generation of an electric field in a reflective layer.

In addition, according to the embodiment, it is possible to provide a surface-emitting laser device and a light emitting device including the same capable of improving light output by improving optical confinement efficiency around an emission layer.

In addition, the embodiment may provide a surface-emitting laser device and a light emitting device including the same capable of controlling a divergence angle according to a field of interest (FOI) specification of a module.

For example, according to an embodiment, a beam divergence angle may be relatively increased in a short axis region of an aperture having a small size, and a beam divergence angle may be relatively decreased in a long axis region of an aperture having a relatively large size. Through this, the embodiment has a special technical effect of designing the beam divergence angle in the VCSEL Chip according to the FOI shape of the module level.

In addition, the embodiment has a technical effect of controlling the degree of radiation (Radiometric %) as well as the divergence angle of the beam from the VCSEL chip in consideration of the FOI of the module stage.

In addition, it is possible to provide a surface-emitting laser device and a light emitting device including the same capable of preventing the divergence angle of beams increasing or the beam pattern splitting according to higher mode shift when a high current is applied or despite an increase in the aperture size.

For example, in the elliptical aperture of the embodiment, even if the applied current gradually increases from about 1 mA to 7 mA, there is a special technical effect in that the higher mode shift is delayed and the mode is maintained due to the size reduction effect due to the shortening of the asymmetric aperture.

DESCRIPTION OF DRAWINGS

FIG. 1 is an exemplary diagram of a method of determining a field of interest (FOI) and a field of view (FOV) by a combination of a beam divergence and a diffuser beam angle in a VCSEL chip.

FIG. 2A is a mode change data according to the aperture size in the related art.

FIG. 2B shows beam profile data in a far field according to an increase in applied current of a conventional VCSEL.

FIG. 2C shows beam profile data in a far field when the aperture diameter $r_A$ of a conventional VCSEL is about 6.0 μm.

FIG. 2D is data of a beam pattern for each mode in the related art.

FIG. 2E is data of a higher mode shift according to an increase in applied current or an increase in aperture size in a conventional VCSEL.

FIG. 2F is an IR micrograph for the aperture shape in the VCSEL chip.

FIG. 2G is a near field image in the VCSEL chip.

FIG. 2H is a beam profile in a far field in a VCSEL chip.

FIG. 3 is a near field image data according to an increase in applied current and data of a divergence angle of beams according to each applied current in a conventional VCSEL.

FIG. 4 is a plan view of a surface emitting laser device according to an embodiment.

FIG. 5 is an enlarged view of a first area C1 of the surface-emitting laser device according to the embodiment illustrated in FIG. 4.

FIG. 6A is a first cross-sectional view taken along line A1-A2 of the surface-emitting laser device according to the embodiment shown in FIG. 5.

FIG. 6B is a second cross-sectional view taken along line A3-A4 of the surface-emitting laser device according to the embodiment shown in FIG. 5.

FIG. 7 is a cross-sectional view of a first portion B1 of the surface-emitting laser device according to the embodiment shown in FIG. 6A.

FIG. 8A is a schematic plan view of an aperture region of the surface-emitting laser device according to the embodiment shown in FIG. 6A.

FIG. 8B is an IR micrograph of an aperture region of the surface-emitting laser device according to the embodiment shown in FIG. 6A.

FIG. 8C is a near field image data of an aperture region of the surface-emitting laser device according to the embodiment shown in FIG. 6A.

FIG. 9A is an exemplary view of a low Miller index plane of GaAs in a surface emitting laser device according to an embodiment.

FIG. 9B is another IR micrograph of the aperture region of the surface-emitting laser device according to the embodiment.

FIG. 10A is an IR micrograph of an aperture region in a comparative example.

FIG. 10B is a cross-sectional photograph of an aperture region in a comparative example.

FIG. 11A is a second enlarged view of an aperture region in the surface emitting laser device according to the embodiment.

FIG. 11B is a near field image data according to an aperture shape and current and data of a divergence angle of beams according to each applied current in the surface-emitting laser device according to the comparative example and the example.

FIG. 12 is a near field image data according to an aperture size and a current density and data of a divergence angle of beams according to each applied current in the surface emitting laser device according to the embodiment.

FIG. 13A is data of change in divergence angle according to current density for each aperture size in the data of FIG. 12.

FIG. 13B is data of change in divergence angle according to current for each aperture size in the data of FIG. 12.

FIGS. 14A to 16B are manufacturing process diagrams of a surface emitting laser device according to an embodiment.

FIG. 17 is an enlarged view of a first area C1 of the surface-emitting laser device according to the embodiment illustrated in FIG. 4.

FIG. 18 is a first cross-sectional view taken along line A1-A2 of the surface-emitting laser device according to the embodiment shown in FIG. 17.

FIGS. 19A and 19B are schematic plan views of a first aperture region of the surface-emitting laser device according to the embodiment shown in FIG. 18 and an exemplary view of a light emission mode.

FIG. 20A is a light emission image data according to a mode in a surface emitting laser device.

FIG. 20B is data of a wavelength of peak energy according to a mode in a surface emitting laser device.

FIG. 20C is a conceptual diagram of a mode stabilization mechanism in a surface emitting laser device according to an embodiment.

FIGS. 21A to 21D are diagrams illustrating a manufacturing process of an aperture region of the surface-emitting laser device according to the embodiment shown in FIG. 19A.

FIG. 22 is a cross-sectional view of an aperture region of the surface emitting laser device according to the embodiment shown in FIG. 21C.

FIG. 23 is an exemplary view of a pad electrode structure in the related art.

FIG. 24 is an exemplary view of a structure of a second electrode in a surface emitting laser device according to an embodiment.

FIG. 25 is a first distribution data of a refractive index and light energy in the surface emitting laser device according to the second embodiment.

FIG. 26 is a second distribution data of the refractive index in the surface emitting laser device according to the second embodiment.

FIG. 27 is data on the refractive index in the first reflective layer of the surface-emitting laser device according to the second embodiment.

FIG. 28 is data on the refractive index of the second reflective layer of the surface-emitting laser device according to the third embodiment.

FIG. 29 is an exemplary diagram of an energy band diagram in the semiconductor device according to the third embodiment.

FIG. 30 is an exemplary diagram of an energy band diagram in the semiconductor device according to the fourth embodiment.

FIGS. 31A and 31B are doping concentration data in a cavity region of a semiconductor device according to the embodiment.

FIG. 32 is an exemplary diagram of an energy band diagram in the semiconductor device according to the fifth embodiment.

FIG. 33 is another enlarged view of the first area C1 of the surface-emitting laser device according to the embodiment shown in FIG. 4.

FIG. 34 is a cross-sectional view taken along line A1-A2 of the surface emitting laser device according to the embodiment shown in FIG. 33;

FIG. 35A is a schematic plan view of an aperture region of the surface-emitting laser device according to the embodiment shown in FIG. 34.

FIG. 35B is a photograph of an aperture region of the surface-emitting laser device according to the embodiment shown in FIG. 34.

FIG. 36A is divergence angle data according to the aperture size of the surface-emitting laser device according to the embodiment.

FIG. 36B is a near field image of a surface emitting laser device according to an embodiment.

FIG. 36C is a far field beam profile of a surface emitting laser device according to an embodiment.

FIGS. 37A and 37B are divergence angle and radiation (Radiometric %) data of a surface-emitting laser device according to a comparative example and an example.

FIGS. 38 and 39 are beam pattern change data according to an aspect ratio change of an ellipse aperture in a surface emitting laser device according to Examples and Comparative Examples.

FIG. 40A is a mode change data according to the aperture size in the related art.

FIG. 40B is data of a beam pattern for each mode in the related art.

FIG. 40C is data of oscillation mode change according to a change in high power in the surface emitting laser device according to Comparative Example (RC) and Embodiment (EE).

FIGS. 41A and 41B are a second plan view conceptual diagram of an aperture region of a surface-emitting laser device according to an embodiment.

FIGS. 42A to 46B are manufacturing process diagrams of a surface emitting laser device according to an embodiment.

FIG. 47 is a perspective view of a mobile terminal to which a surface-emitting laser device is applied according to an embodiment.

MODE FOR INVENTION

Hereinafter, embodiments that can be realized specifically for solving the above problems will be described with reference to the accompanying drawings.

In the description of the embodiment, in the case where it is described as being formed in "on or under" of each element, the upper or lower, both elements can be in direct contact with each other or one or more other elements can be formed indirectly between the two elements. In addition, when expressed as "on or under", the meaning of not only an upward direction but also a downward direction based on one element may be included.

EMBODIMENT

FIG. 4 is a plan view of the surface-emitting laser device 201 according to the embodiment, and FIG. 5 is an enlarged view of a first area C1 of the surface-emitting laser device according to the embodiment shown in FIG. 4.

Referring to FIG. 4, the surface-emitting laser device 201 according to the embodiment may include a light emitting part E and a pad part P, and the light emitting part E includes a plurality of light emitting emitters as shown in FIG. 5. The emitters E1, E2, E3 may be arranged.

Referring to FIG. 5, in an embodiment, in the surface-emitting laser device 201, a second electrode 280 is disposed in an area other than the aperture 241, which is an opening, and a passivation layer 270 is disposed on the surface corresponding to the aperture 241.

Next, FIG. 6A is a first cross-sectional view along line A1-A2 of the surface-emitting laser device according to the embodiment shown in FIG. 5, and FIG. 6B is a second cross-sectional view along line A3-A4 of the surface-emitting laser device according to the embodiment shown in FIG. 5.

Referring to FIGS. 6A and 6B, in the embodiment, the surface-emitting laser device 201 includes a first electrode 215, a substrate 210, a first reflective layer 220, an active region 230, and an aperture region 240, the second reflective layer 250, the second electrode 280, and the passivation layer 270.

The aperture region 240 may include an aperture 241 and an insulating area 242. The insulating area 242 may be referred to as an oxide layer, and the aperture region 240 may be referred to as an oxidation region, but is not limited thereto.

The second electrode 280 may include a contact electrode 282 and a pad electrode 284.

Next, FIG. 7 is an enlarged cross-sectional view of the first part B1 of the surface-emitting laser device according to the embodiment shown in FIG. 6A.

Hereinafter, the technical features of the surface-emitting laser device 201 according to the embodiment will be described with reference to FIGS. 6A and 7, and technical effects will be described with reference to the drawings. In the drawings of the embodiment, the direction of the x-axis may be a direction parallel to the longitudinal direction of the substrate 210, and the y-axis may be a direction perpendicular to the x-axis.

<Substrate, First Electrode>

Referring to FIG. 6A, in an embodiment, the substrate 210 may be a conductive substrate or a non-conductive substrate. When a conductive substrate is used, a metal having excellent electrical conductivity can be used, and since it must be able to sufficiently dissipate heat generated when the surface-emitting laser device 201 is operated, a GaAs substrate with high thermal conductivity, a metal substrate etc. can be used.

When a non-conductive substrate is used, an AlN substrate, a sapphire ($Al_2O_3$) substrate, or a ceramic-based substrate may be used.

In an embodiment, the first electrode 215 may be disposed under the substrate 210, and the first electrode 215 may be disposed as a single layer or multiple layers of a conductive material. For example, the first electrode 215 may be a metal, and at least one of aluminum (Al), titanium (Ti), chromium (Cr), nickel (Ni), copper (Cu), and gold (Au). The first electrode 215 is formed in a single-layer or multi-layer structure to improve electrical properties, thereby increasing light output.

<First Reflective Layer, Second Reflective Layer>

Referring to FIG. 7, the first reflective layer 220 may be doped with a first conductivity type dopant. For example, the first conductivity-type dopant may include an n-type dopant such as Si, Ge, Sn, Se, and Te.

In addition, the first reflective layer 220 may include a gallium-based compound, for example, AlGaAs, but is not limited thereto. The first reflective layer 220 may be a Distributed Bragg Reflector (DBR). For example, the first reflective layer 220 may have a structure in which a first layer and a second layer made of materials having different refractive indices are alternately stacked at least once or more.

For example, as shown in FIG. 7, the first reflective layer 220 includes a first group first reflective layer 221 disposed on a substrate 210 and a second group first reflective layer 222 disposed on the first group first reflective layer 221.

The first group first reflective layer 221 and the second group first reflective layer 222 may include a plurality of layers made of a semiconductor material having a composition formula of $Al_xGa_{(1-x)}As_{(0<x<1)}$. When Al composition in each layer increases, the refractive index of each layer decreases, and when Ga composition increases, the refractive index of each layer may increase.

In addition, the thickness of each layer may be λ and λ may be a wavelength of light generated in the active region 230, and n may be a refractive index of each layer with respect to the light of the above-described wavelength. Here, λ may be 650 to 980 nanometers (nm), and n may be the refractive index of each layer. The first reflective layer 220 having such a structure may have a reflectance of 99.999% for light in a wavelength region of about 940 nanometers.

The thickness of the layer in each of the first reflective layers 220 may be determined according to a respective refractive index and a wavelength λ of light emitted from the active region 230.

In addition, as shown in FIG. 7, the first group first reflective layer 221 and the second group first reflective layer 222 may be formed of a single layer or a plurality of layers, respectively.

For example, the first group first reflective layer 221 may include about 30 to 40 pairs of the first group 1-1st layer 221a and the first group 1-2nd layer 221b. The first group 1-1st layer 221a may be formed to be thicker than the first group 1-2nd layer 221b. For example, the first group 1-1st layer 221a may be formed to be about 40 to 60 nm, and the first group 1-2nd layer 221b may be formed to be about 20 to 30 nm.

In addition, the second group first reflective layer 222 may also include about 5 to 15 pairs of the second group 1-1st layer 222a and the second group 1-2nd layer 222b. The second group 1-1st layer 222a may be formed to be thicker than the second group 1-2nd layer 222b. For example, the second group 1-1st layer 222a may be formed to be about 40 to 60 nm, and the second group 1-2nd layer 222b may be formed to be about 20 to 30 nm.

In addition, as shown in FIG. 7, the second reflective layer 250 may include a gallium-based compound, for example, AlGaAs, and the second reflective layer 250 may be doped with a second conductivity type dopant. The second conductivity-type dopant may be a p-type dopant such as Mg, Zn, Ca, Sr, Ba, or the like. Meanwhile, the first reflective layer 220 may be doped with a p-type dopant, and the second reflective layer 250 may be doped with an n-type dopant.

The second reflective layer 250 may also be a Distributed Bragg Reflector (DBR). For example, the second reflective layer 250 may have a structure in which a plurality of layers made of materials having different refractive indices are alternately stacked at least once or more.

Each layer of the second reflective layer 250 may include AlGaAs, and in detail, may be formed of a semiconductor material having a composition formula of $Al_xGa_{(1-x)}As_{(0<x<1)}$. Here, when Al composition increases, the refractive index of each layer decreases, and when Ga composition increases, the refractive index of each layer may increase. In addition, the thickness of each layer of the second reflective layer 250 may be λ, λ may be a wavelength of light emitted from the active layer, and n may be a refractive index of each layer with respect to the above-described light.

The second reflective layer 250 having such a structure may have a reflectance of 99.9% for light in a wavelength region of about 940 nanometers.

The second reflective layer 250 may be formed by alternately stacking layers, and the number of pairs of layers in the first reflective layer 220 may be greater than the number of pairs of layers in the second reflective layer 250. In this case, as described above, the reflectance of the first reflective layer 220 is about 99.999%, which may be greater than the reflectance of 99.9% of the second reflective layer 250.

In an embodiment, the second reflective layer 250 is spaced apart from the active region 230 than the first group second reflective layer 251 and a second reflective layer 252 on the first group second reflective layer 252 disposed adjacent to the active region 230.

As shown in FIG. 7, the first group second reflective layer 251 and the second group second reflective layer 252 may also be formed of a single layer or a plurality of layers, respectively.

For example, the first group second reflective layer 251 may include about 1 to 5 pairs of the first group 2-1st layer 251a and the first group 2-2nd layer 251b. The first group 2-1st layer 251a may be formed to be thicker than the first group 2-2nd layer 251b. For example, the first group 2-1st layer 251a may be formed to be about 40 to 60 nm, and the first group 2-2nd layer 251b may be formed to be about 20 to 30 nm.

In addition, the second group second reflective layer 252 may also include about 5 to 15 pairs of the second group 2-1st layer 252a and the second group 2-2nd layer 252b. The second group 2-1st layer 252a may be formed to be thicker than the second group 2-2nd layer 252b. For example, the second group 2-1st layer 252a may be formed to be about 40 to 60 nm, and the second group 2-2nd layer 252b may be formed to be about 20 to 30 nm.

<Active Region>

With continued reference to FIG. 7, the active region 230 may be disposed between the first reflective layer 220 and the second reflective layer 250.

The active region 230 may include an active layer 232 and at least one or more cavities 231 and 233. For example, the active region 230 may include an active layer 232, a first cavity 231 disposed below the active layer 232, and a second cavity 233 disposed above the active layer 232. The active region 230 according to the embodiment may include both the first cavity 231 and the second cavity 233, or may include only one of the two.

The active layer 232 may include any one of a single well structure, a multiple well structure, a single quantum well structure, a multi quantum well (MQW) structure, a quantum dot structure, or a quantum wire structure.

The active layer 232 may include a quantum well layer 232a and a quantum barrier layer 232b using a compound semiconductor material of a group III-V element. The quantum well layer 232a may be formed of a material having an energy band gap smaller than the energy band gap of the quantum barrier layer 232b. The active layer 232 may be formed in 1 to 3 pair structure such as InGaAs/AlxGaAs, AlGaInP/GaInP, AlGaAs/AlGaAs, AlGaAs/GaAs, GaAs/InGaAs, but is not limited thereto. A dopant may not be doped into the active layer 232.

Next, the first cavity 231 and the second cavity 233 may be formed of $Al_yGa_{(1-y)}As_{(0<y<1)}$, but are not limited thereto. For example, the first cavity 231 and the second cavity 233 may each include a plurality of layers of $Al_yGa_{(1-y)}As$.

For example, the first cavity 231 may include a 1-1st cavity layer 231a and a 1-2nd cavity layer 231b. The 1-1st cavity layer 231a may be further spaced apart from the active layer 232 than the 1-2nd cavity layer 231b. The 1-1st cavity layer 231a may be formed to be thicker than the 1-2nd cavity layer 231b, but is not limited thereto.

For example, the 1-1st cavity layer 231a may be formed to be about 60 to 70 nm, and the 1-2nd cavity layer 231b may be formed to be about 40 to 55 nm, but the present invention is not limited thereto.

In addition, the second cavity 233 may include a 2-1st cavity layer 233a and a 2-2nd cavity layer 233b. The 2-2nd cavity layer 233b may be further spaced apart from the active layer 232 compared to the 2-1st cavity layer 233a. The 2-2nd cavity layer 233b may be formed to be thicker than the 2-1st cavity layer 233a, but is not limited thereto. For example, the 2-2nd cavity layer 233b may be formed to be about 60 to 70 nm, and the 2-1st cavity layer 233a may be formed to be about 40 to 55 nm, but the present invention is not limited thereto.

<Aperture Region>

Referring back to FIG. 6A, in the embodiment, the aperture region 240 may include an insulating region 242 and an aperture 241. The aperture 241 may be referred to as an opening, and the aperture region 240 may be referred to as an opening region.

The insulating region 242 may be formed of an insulating layer, for example, aluminum oxide, and may function as a current blocking region, and an aperture 241 that is a light emission region may be defined by the insulating region 242.

For example, when the aperture region 240 includes aluminum gallium arsenide (AlGaAs), the insulating region 242 (as AlGaAs of the aperture region 240 reacts with $H_2O$ and the edge turns into aluminum oxide ($Al_2O_3$)) may be formed, and the central region not reacted with $H_2O$ may be an aperture 241 made of AlGaAs.

According to the embodiment, light emitted from the active region 230 through the aperture 241 may be emitted to the upper region, and the aperture 241 may have excellent light transmittance compared to the insulating region 242.

Referring to FIG. 7, the insulating region 242 may include a plurality of layers. For example, the insulating region 242 may include a first insulating layer 242a and a second insulating layer 242b. The first insulating layer 242a may have a thickness equal to or different from that of the second insulating layer 242b.

One of the technical problems of the embodiment is intended to provide a surface-emitting laser device and a light emitting device including the same capable of preventing the problem from occurring an increase in the divergence angle of beams according to a higher mode shift or the beam pattern is split despite the application of a high current or an increase in the aperture size.

FIG. 8A is a schematic plan view of an aperture region 240 of the surface-emitting laser device according to the embodiment shown in FIG. 6A, and FIG. 8B is a plan view showing IR micrograph of the aperture region 240 of the surface-emitting laser device according to the embodiment shown in FIG. 6A., and FIG. 8C is near field image data of an aperture region of the surface-emitting laser device according to the embodiment shown in FIG. 6A.

Referring to FIGS. 8A and 8B, in an embodiment, the aperture region 240 may include an insulating region 242 and an aperture 241, and the aperture 241 may include a polygonal in horizontal cross section.

For example, in the embodiment, the polygonal cross section of the aperture 241 may be in any one of a triangular to a hexagonal shape. For example, the outer angle of the aperture 241 may be in any one of a triangular shape, a quadrangular shape, a pentagonal shape, a hexagonal shape, or a hexagonal shape, and the outer shape of the aperture 241 in FIG. 8A is a hexagonal shape and although the case is illustrated, it is not limited thereto.

In addition, in the embodiment, the outer periphery of the insulating region 242 among the aperture regions 240 may be circular.

In an embodiment, the size S1 of the aperture 241 may be a polygonal to a diagonal length. For example, when the aperture 241 has a hexagonal shape as shown in FIG. 8A, the maximum or long-axis diagonal length may be the size S1 of the aperture 241. Meanwhile, half (½) of the size of the aperture 241 may be represented by S2.

In the embodiment, the size R of the aperture region 240 including the aperture 241 and the insulating region 242.

The size R of the aperture region 240 may be the sum of the shortest distance half the size S2 of the aperture 241 and the outside distance S3 of the insulating region 242.

As described above, the embodiment is intended to provide a surface-emitting laser device and a light emitting device including the same capable of preventing the problem of splitting a beam pattern and an increase in the divergence angle of beams or a beam pattern according to a higher mode shift despite the application of a high current or an increase in the aperture size.

Referring to FIG. 8C, in the surface-emitting laser device according to the embodiment, an aperture having a polygonal outer shape may be formed by controlling an oxidation condition in a circular mesa state. Through this, when a high current is applied or despite an increase in the aperture size, there is a pinning effect at the edge of the polygonal aperture, and as a result, there is a technical effect that can prevent increase in the emission point, so that the divergence angle of beams increases or the beam pattern is disrupted according to a higher mode shift.

For example, FIG. 9A is an exemplary diagram of a low Miller index plane of GaAs in the surface-emitting laser device according to the embodiment, and FIG. 9B is another IR micrograph of the aperture region of the surface-emitting laser device according to the embodiment.

FIG. 9A is an exemplary view of a GaAs (Zinc-blende crystal) low Miller index plane in the surface emitting laser device according to the embodiment, and in the Zinc-blende structure, low Miller index planes appear at 45° intervals with respect to the (001) plane surface. The Low Miller index plane feature is chemically and mechanically stable because of its low bond density.

Accordingly, the Low Miller index plane has a low etching rate or a low growth rate, so that cleavage is easy and the surface defect density is low.

Accordingly, referring to FIG. 9B, an aperture of a quadrangular outer edge may be formed by {110} side-wall termination, but the outer shape is not limited to a quadrangular shape, and the aperture can also be formed to have a hexagonal outer shape as shown in FIG. 8B.

According to an embodiment, a mesa for forming an aperture region is designed in a circular shape to increase symmetry, thereby suppressing the occurrence of local stress or an increase in defects, and reducing the speed contrast. Through the control, the aperture shape can be controlled in a polygonal shape.

Meanwhile, FIG. 10A is an IR micrograph of an aperture region in a comparative example, and FIG. 10B is a cross-sectional photograph of an aperture region in a comparative example.

FIGS. 10A and 10B are photographs of a comparative example that are not published, and indicate that there is a problem that a crack occurs in the aperture when a polygonal mesa is used for mode control.

According to a comparative example, when forming a hexagonal mesa for implementing a closed packed structure, a side wall is formed by a combination of high/low indexes, and the surface quality difference is increased due to an increase in defects in the high index plane surface. In contrast, there is a problem that a reliability issue occurs due to the occurrence of a crack due to the concentration of stress due to the propagation of defects during the aperture oxidation.

Accordingly, according to the embodiment, the outer periphery of the insulating region 242 of the aperture region 240 is circular, and the outer periphery of the aperture 241 may be controlled in a polygonal shape. In particular, the surface-emitting laser device and the light emitting device including the same according to the embodiment have excellent crystal quality at the polygonal corners of the aperture 241. Therefore, it is possible to prevent the problem that the divergence angle of beams increases or the beam pattern is split due to a higher mode shift when a high current is applied or despite an increase in the aperture size.

According to the embodiment, the increase of the light emission point is suppressed by pinning by the aperture of the edge of the polygon having excellent crystal quality, and the available mode is controlled due to this optical confinement, thereby allowing a higher mode shift. There is a special technical effect that mode shift is delayed and the mode is maintained.

For example, according to an embodiment, an available mode is controlled by optical confinement at the edge of a polygon of the aperture 241 having excellent crystal quality, thereby delaying a higher mode shift, thereby delaying the mode has a special technical effect.

Accordingly, according to the embodiment, the beam mode can be controlled even when a high current is applied despite an increase in the aperture size. Therefore, it is possible to provide a surface-emitting laser device, and a light emitting device including the same capable of solving a problem of splitting a beam pattern according to a higher mode shift and a problem of increasing a divergence angle.

Next, FIG. 11A is a second enlarged view C2 of the aperture region in the surface emitting laser device according to the embodiment.

According to the embodiment, by increasing the symmetry of the mesa for forming the aperture region in a circular shape, the occurrence of local stress or defect increase is suppressed, and oxidation is performed by controlling the distance between adjacent aperture regions. By controlling the speed contrast, an aperture shape can be formed in a polygonal shape.

For example, referring to FIG. 11A, the distance D between the centers of the apertures closest to each other in the plurality of aperture areas may be controlled to be greater than twice the radius R of each aperture area and less than 3 times. This allows the oxidation rate to proceed relatively slowly between adjacent aperture regions, thereby forming an aperture shape in a polygonal shape.

For example, the first aperture region 204A includes the first insulating region 242A and the first aperture 241A, and as described in FIG. 8A, the size of the first aperture region 240A is R. The size of the first aperture region 240A may mean a radius, but is not limited thereto.

In addition, the second aperture region 240B adjacent to the first aperture region 204A includes a second insulating region 242B and a second aperture 241B, and the size of the second aperture region 240B can be R.

In this case, according to the embodiment, the distance D between the nearest first aperture 241A and the second aperture 241B may be controlled to be greater than twice the radius R of each aperture area and less than three times. Accordingly, the oxidation rate is relatively slow between adjacent aperture regions, so that an aperture shape can be formed in a polygonal shape.

Next, FIG. 11B is a near field image data according to an aperture shape and current and data of a divergence angle of beams according to each applied current in the surface emitting laser device according to the comparative example and the embodiment.

The comparative example is a case with a circular aperture, and as the current increases from 0.5 A to 1 A and 2 A, the light emission mode is divided as the emission point increased sharply from 19.5° to 26.0° and 32.5°.

On the other hand, when the aperture of the embodiment has a polygonal, eg, hexagonal aperture, there is a pinning effect on the edge of the aperture. Through this, the increase in the emission point can be suppressed and the increase in the divergence angle due to mode division can be reduced.

For example, in the embodiment, even if the current increases from 0.5 A to 1 A and 2 A, there is a technical effect that the divergence angle is controlled from 19.0° to 23.5° and 27.5° by preventing the emission mode division (H standard).

That is, according to the embodiment, pinning occurs at the edge of the aperture due to optical confinement by an aperture having a polygonal edge having excellent crystal quality, thereby suppressing an increase in light emission points. By controlling the available modes through this, there is a special technical effect in that the higher mode shift is delayed and the mode is maintained.

In addition, according to the embodiment, the beam mode is controlled even when a high current is applied, so that it is possible to provide a surface emitting laser device and a light emitting device including the same capable of solving the problem that the beam pattern of the outgoing beam is split due to a higher mode shift and the divergence angle increases.

Next, FIG. 12 is data of near field image data according to aperture size and current density and divergence angle of beams according to each applied current in the surface emitting laser device according to the embodiment.

In addition, FIG. 13A shows Beam divergence change data according to current density for each aperture size in the data of FIG. 12, and FIG. 13B shows current for each aperture size in the data of FIG. 12.

According to the embodiment, there is a special technical effect that the oscillation mode and the divergence angle can be stably controlled according to the current range (IE) according to the aperture size in the wavelength region of about 810 nm to 980 nm.

For example, referring to FIGS. 12 and 13A, in the case where the aperture size S1 is 6.0 μm to 12 μm and the current density is 8.3 kA/cm$^3$ to 30.0 kA/cm$^3$, there is a special technical effect that the oscillation mode and the divergence angle can be stably controlled.

In the embodiment, the beam divergence angle of the surface-emitting laser device was measured using an LEDGON-100 goniophotometer (Instrument Systems Optische Messtechnik GmbH, Germany), but is not limited thereto.

For example, referring to FIGS. 12, 13A, and 13B, in the embodiment, when the aperture size S1 is 6.0 μm, the current density is controlled to 8.3 kA/cm$^3$ to 30.0 kA/cm$^3$, the oscillation mode is the secondary mode and the divergence angle is about 20 degrees, and it is stably controlled in the current region (7 mA).

In addition, in the embodiment, when the aperture size S1 is 8.0 μm, when the current density is controlled from 8.3 kA/cm$^3$ to 30.0 kA/cm$^3$, even if the current is changed to 7 mA, 9 mA, 12 mA, and 14 mA. There is a special technical effect that the oscillation mode is the secondary mode and the divergence angle is stably controlled at about 21°.

In addition, in the embodiment, when the aperture size S1 is 10.0 μm and the current density is controlled to 8.3 kA/cm$^3$ to 30.0 kA/cm$^3$, even if the current is changed to 7 mA, 9 mA, 12 mA, and 14 mA, there is a special technical effect that the oscillation mode is the secondary mode and the divergence angle is stably controlled at about 25°.

In addition, in the embodiment, when the aperture size S1 is 12.0 μm and the current density is controlled to 8.3 kA/cm³ to 30.0 kA/cm³, the oscillation mode even if the current is changed to 9 mA, 12 mA, or 14 mA, there is a special technical effect of stably controlling the secondary mode, the divergence angle to about 27°.

Accordingly, in the embodiment, when a high current is applied or despite an increase in the aperture size, it is possible to provide a surface-emitting laser device and a light-emitting device including the same capable of preventing a problem that the divergence angle of beams is increased or the beam pattern is split according to a higher mode shift.

In addition, the embodiment suppresses the increase of the light emission point by pinning in the aperture of the polygonal corner having excellent crystal quality despite the increase in the aperture size or when a high current is applied, thereby preventing a higher mode shift. Accordingly, it is possible to provide a surface-emitting laser device, and a light emitting device including the same capable of preventing a problem in which a divergence angle of beams of an emission beam is increased or a beam pattern is split.

<Second Electrode, Ohmic Contact Layer, Passivation Layer>

Referring back to FIG. 6A, the emitter may be defined by mesa etching from the second reflective layer 250 to the aperture region 240 and the active region 230 in the surface emitting laser device 201 according to the embodiment. In addition, even a part of the first reflective layer 220 may be mesa etched.

A second electrode 280 may be disposed on the second reflective layer 250, and the second electrode 280 may include a contact electrode 282 and a pad electrode 284.

A passivation layer 270 may be disposed in an area between the contact electrodes 282 where the second reflective layer 250 is exposed, and may correspond to the above-described aperture 241 and the upper and lower sides. The contact electrode 282 may improve ohmic contact characteristics between the second reflective layer 250 and the pad electrode 284.

The second electrode 280 may be made of a conductive material, for example, a metal. For example, the second electrode 280 includes at least one of aluminum (Al), titanium (Ti), chromium (Cr), nickel (Ni), copper (Cu), and gold (Au) and can be formed into a structure.

In FIG. 6A, the passivation layer 270 may be disposed on side surfaces and top surfaces of the light emitting structure mesa etched and on the top surface of the first reflective layer 220. The passivation layer 270 is also disposed on a side surface of the surface-emitting laser device 201 separated by device units, and protects and insulates the surface-emitting laser device 201. The passivation layer 270 may be made of an insulating material, for example, a nitride or an oxide. For example, the passivation layer 270 may include at least one of polyimide, silica ($SiO_2$), or silicon nitride ($Si_3N_4$).

The passivation layer 270 may have a thickness smaller than that of the contact electrode 282 on the upper surface of the light emitting structure, through which the contact electrode 282 may be exposed over the passivation layer 270. The pad electrode 284 may be disposed in electrical contact with the exposed contact electrode 282, and the pad electrode 284 may extend and be disposed above the passivation layer 270 to receive current from the outside.

(Embodiment Manufacturing Method)

Hereinafter, a method of manufacturing the surface-emitting laser device according to an embodiment will be described with reference to FIGS. 14A to 16B.

First, as shown in FIG. 14A, a light emitting structure including a first reflective layer 220, an active region 230, and a second reflective layer 250 which are formed on a substrate 210.

The substrate 210 may be formed of a material suitable for growth of semiconductor materials or a carrier wafer, and may be formed of a material having excellent thermal conductivity, and may include a conductive substrate or an insulating substrate.

For example, when the substrate 210 is a conductive substrate, a metal having excellent electrical conductivity can be used, and since it could sufficiently dissipate heat generated when the surface-emitting laser device 200 is operated, a GaAs substrate having high thermal conductivity. Alternatively, a metal substrate or a silicon (Si) substrate may be used.

In addition, when the substrate 210 is a non-conductive substrate, an AlN substrate, a sapphire ($Al_2O_3$) substrate, or a ceramic-based substrate may be used.

In addition, in the exemplary embodiment, the same type of substrate as the first reflective layer 220 may be used as the substrate 210. For example, when the substrate 210 is a GaAs substrate of the same kind as the first reflective layer 220, the first reflective layer 210 and the lattice constant match, so that defects such as lattice mismatch do not occur in the first reflective layer 220.

Next, the first reflective layer 220 may be formed on the substrate 210, and FIG. 14B is an enlarged cross-sectional view of the second region B2 of the surface-emitting laser device according to the embodiment illustrated in FIG. 14A.

Hereinafter, a surface emitting laser device according to an embodiment of the embodiment will be described with reference to FIGS. 14A and 14B together.

The first reflective layer 220 may be grown using a method such as chemical vapor deposition (CVD), molecular beam epitaxy (MBE), sputtering, or hydroxide vapor phase epitaxy (HVPE).

The first reflective layer 220 may be doped with a first conductivity type. For example, the first conductivity-type dopant may include an n-type dopant such as Si, Ge, Sn, Se, and Te.

The first reflective layer 220 may include a gallium-based compound, for example, AlGaAs, but is not limited thereto. The first reflective layer 220 may be a Distributed Bragg Reflector (DBR). For example, the first reflective layer 220 may have a structure in which layers made of materials having different refractive indices are alternately stacked at least once or more.

For example, as shown in FIG. 14B, the first reflective layer 220 is disposed on the first group first reflective layer 221 and the first group first reflective layer 221 on the substrate 210. The second group may include a first reflective layer 222.

The first group first reflective layer 221 and the second group first reflective layer 222 may include a plurality of layers made of a semiconductor material having a composition formula of $Al_xGa_{(1-x)}As_{(0<x<1)}$. In addition, when Al in each layer increases, the refractive index of each layer decreases, and when Ga increases, the refractive index of each layer may increase.

In addition, as shown in FIG. 14B, the first group first reflective layer 221 and the second group first reflective layer 222 may be formed of a single layer or a plurality of layers, respectively. For example, the first group first reflective layer 221 may include about 30 to 40 pairs of the first group 1-1st layer 221a and the first group 1-2nd layer 221b. In addition, the second group first reflective layer 222 may also include about 5 to 15 pairs of the second group 1-1st layer 222a and the second group 1-2nd layer 222b.

Next, an active region 230 may be formed on the first reflective layer 220.

As shown in FIG. 14B, the active region 230 may include an active layer 232, a first cavity 231 disposed below the active layer 232, and a second cavity 233 disposed above the active layer 232. The active region 230 according to the embodiment may include both the first cavity 231 and the second cavity 233, or may include only one of the two.

The active layer 232 may include a quantum well layer 232a and a quantum barrier layer 232b using a compound semiconductor material of a group III-V element. The active layer 232 may be formed in a 1 to 3 pair structure such as InGaAs/AlxGaAs, AlGaInP/GaInP, AlGaAs/AlGaAs, AlGaAs/GaAs, GaAs/InGaAs, but is not limited thereto. A dopant may not be doped into the active layer 232.

The first cavity 231 and the second cavity 233 may be formed of $AlyGa_{(1-y)}As_{(0<y<1)}$, but are not limited thereto. For example, the first cavity 231 and the second cavity 233 may each include a plurality of layers of $AlyGa_{(1-y)}As$.

For example, the first cavity 231 may include a 1-1st cavity layer 231a and a 1-2nd cavity layer 231b. In addition, the second cavity 233 may include a 2-1st cavity layer 233a and a 2-2nd cavity layer 233b.

Next, an AlGa-based layer 241a for forming the aperture region 240 may be formed on the active region 230. The AlGa-based layer 241a may include a plurality of layers. For example, the AlGa-based layer 241a may include a first AlGa-based layer 241a1 and a second AlGa-based layer 241a2.

The AlGa-based layer 241a may include a material such as $AlzGa(1-z)As(0<z<1)$, but is not limited thereto.

The AlGa-based layer 241a may include a conductive material, and may include the same material as the first reflective layer 220 and the second reflective layer 250, but is not limited thereto.

For example, when the AlGa-based layer 241a includes an AlGaAs-based material, the AlGa-based layer 241a is made of a semiconductor material having a composition formula of $AlxGa_{(1-x)}As_{(0<x<1)}$. It may, for example, may have a composition formula of $Al_{0.98}Ga_{0.02}As$, but is not limited thereto.

Next, a second reflective layer 250 may be formed on the AlGa-based layer 241a.

The second reflective layer 250 may include a gallium-based compound, for example, AlGaAs. For example, each layer of the second reflective layer 250 may include AlGaAs, and in detail, may be formed of a semiconductor material having a composition formula of $AlxGa_{(1-x)}As_{(0<x<1)}$.

The second reflective layer 250 may be doped with a second conductivity type dopant. For example, the second conductivity-type dopant may be a p-type dopant such as Mg, Zn, Ca, Sr, Ba, or the like. Meanwhile, the first reflective layer 220 may be doped with a p-type dopant, and the second reflective layer 250 may be doped with an n-type dopant.

The second reflective layer 250 may also be a Distributed Bragg Reflector (DBR). For example, the second reflective layer 250 may have a structure in which a plurality of layers made of materials having different refractive indices are alternately stacked at least once or more.

For example, the second reflective layer 250 is the active region 230 than the first group second reflective layer 251 and the first group second reflective layer 251 disposed adjacent to the active region 230. the second reflective layer 250 may include a second group of second reflective layers 252 spaced apart from each other.

In addition, the first group second reflective layer 251 and the second group second reflective layer 252 may be formed of a single layer or a plurality of layers, respectively. For example, the first group second reflective layer 251 may include about 1 to 5 pairs of the first group 2-1st layer 251a and the first group 2-2nd layer 251b. In addition, the second group second reflective layer 252 may also include about 5 to 15 pairs of the second group 2-1st layer 252a and the second group 2-2nd layer 252b.

Next, FIG. 15A is an enlarged view of a first area Cl of the surface-emitting laser device according to the embodiment, and FIG. 15B is a cross-sectional view taken along line A1-A2 of the surface-emitting laser device according to the embodiment shown in FIG. 15A.

In the embodiment, as shown in FIG. 15B, a mesa region M may be formed by etching the light emitting structure using a predetermined mask 300. In this case, from the second reflective layer 250 to the AlGa-based layer 241a and the active region 230 may be mesa etched, and a portion of the first reflective layer 220 may be mesa etched. In the mesa etching, the AlGa-based layer 241a and the active region 230 can be removed from the second reflective layer 250 in the peripheral region by an inductively coupled plasma (ICP) etching method, and the side of the mesa etching region has a slope.

Next, FIG. 16A is an enlarged view of the first area Cl of the surface-emitting laser device according to the embodiment, and FIG. 16B is a cross-sectional view along line A1-A2 of the surface-emitting laser device according to the embodiment shown in FIG. 16A.

In the embodiment, as shown in FIG. 16B, the edge region of the AlGa-based layer 241a may be changed to the insulating region 242, for example, wet oxidation. Through this, an aperture region 240 including the insulating region 242 and the aperture 241 that is a non-oxidized region may be formed.

For example, when oxygen is supplied from the edge region of the AlGa-based layer 241a, AlGaAs of the AlGa-based layer reacts with $H_2O$ to form aluminum oxide $(Al_2O_3)$. At this time, the reaction time and the like are adjusted so that the central region of the AlGa-based layer does not react with oxygen and only the edge region reacts with oxygen to form the insulating region 242 of aluminum oxide.

In addition, the embodiment may change the edge region of the AlGa-based layer to the insulating region 242 through ion implantation, but is not limited thereto. During ion implantation, photons may be supplied with an energy of 300 keV or more.

After the above-described reaction process, conductive AlGaAs may be disposed in the central region of the aperture region 240 and non-conductive $Al_2O_3$ may be disposed in the edge region. AlGaAs in the central region is a portion in which light emitted from the active region 230 proceeds to the upper region and may be defined as an aperture 241.

Thereafter, referring to FIG. 6A, a passivation layer 270 may be formed on the upper surface of the light emitting structure. The passivation layer 270 may include at least one of polyimide, silica $(SiO_2)$, or silicon nitride $(Si_3N_4)$.

The passivation layer 270 may expose a part of the second reflective layer 250 to be electrically connected to the second electrode 280 formed thereafter.

In addition, according to the embodiment, the contact electrode 282 may be formed on the second reflective layer 250, and a central region between the contact electrodes 282 may correspond to the aperture 241. The contact electrode 282 may improve ohmic contact characteristics with the second reflective layer 250.

Next, a pad electrode 284 in electrical contact with the contact electrode 282 may be formed, and the pad electrode 284 may be extended and disposed above the passivation layer 270 to receive current from the outside.

The contact electrode 282 and the pad electrode 284 may be made of a conductive material. For example, the contact electrode 282 and the pad electrode 284 include at least one of aluminum (Al), titanium (Ti), chromium (Cr), nickel (Ni), copper (Cu), and gold (Au). Thus, it can be formed in a single-layer or multi-layer structure.

Next, a first electrode 215 may be disposed under the substrate 210. Before the first electrode 215 is disposed, a part of the bottom surface of the substrate 210 may be removed through a predetermined grinding process, so that heat dissipation efficiency may be improved. The first electrode 215 may be made of a conductive material, for example, a metal. For example, the first electrode 215 includes at least one of aluminum (Al), titanium (Ti), chromium (Cr), nickel (Ni), copper (Cu), and gold (Au) and the first electrode 215 can be formed into a structure.

Hereinafter, in addition to the above-described embodiments, (first embodiment) to (sixth embodiment) will be described.

First Embodiment

FIG. 17 is another enlarged view of the first region Cl of the surface-emitting laser device according to the embodiment shown in FIG. 4.

Referring to FIG. 17, in an embodiment, in the surface-emitting laser device 201, a second electrode 280 is disposed in an area other than the aperture 241, which is an opening, and a passivation layer is disposed on a surface corresponding to the aperture 241. 270 may be placed.

Next, FIG. 18 is a cross-sectional view along line A1-A2 of the surface-emitting laser device according to the embodiment shown in FIG. 17.

Referring to FIG. 18, in the embodiment, the surface-emitting laser device 201 includes a first electrode 215, a substrate 210, a first reflective layer 220, an active region 230, an aperture region 240, at least one of the reflective layer 250, the second electrode 280, and the passivation layer 270.

The aperture region 240 may include an aperture 241 that is an opening and an insulating region 242. The insulating area 242 serves as a current blocking function and may be referred to as an oxide layer, and the aperture region 240 may be referred to as an oxidation region, but is not limited thereto.

The second electrode 280 may include a contact electrode 282 and a pad electrode 284.

Hereinafter, the technical characteristics of the surface-emitting laser device 201 according to the embodiment will be described with reference to FIG. 18, and the technical effects will also be described with reference to FIGS. 19A to 24. In the drawings of the embodiment, the direction of the x-axis may be a direction parallel to the longitudinal direction of the substrate 210, and the y-axis may be a direction perpendicular to the x-axis.

Referring to FIG. 18, in an embodiment, the aperture region 240 may include an insulating region 242 and an aperture 241. The aperture 241 may be referred to as an opening, and the aperture region 240 may be referred to as an opening region.

The insulating region 242 may be formed of an insulating layer, for example, aluminum oxide, and may function as a current blocking region, and an aperture 241 that is a light emission region may be defined by the insulating region 242.

For example, when the aperture region 240 includes aluminum gallium arsenide (AlGaAs), the insulating region 242 (as AlGaAs of the aperture region 240 reacts with $H_2O$ and the edge turns into aluminum oxide ($Al_2O_3$)) may be formed, and the central region not reacted with $H_2O$ may be an aperture 241 made of AlGaAs.

According to the embodiment, light emitted from the active region 230 through the aperture 241 may be emitted to the upper region, and the aperture 241 may have excellent light transmittance compared to the insulating region 242.

On the other hand, the surface-emitting laser device and the light-emitting device including the same according to the embodiment is one of the technical problems of preventing the problem that the beam pattern is split due to a higher mode shift when a high current is applied or despite an increase in the aperture size.

FIG. 19A is a schematic plan view of an aperture region 240 of the surface-emitting laser device according to the embodiment illustrated in FIG. 18.

In the surface emitting laser device according to the embodiment, an aperture region 240 may be defined by a predetermined mesa region M, and the aperture region 240 includes an aperture 241 that is an opening or a diverging region and an insulating region 242.

In an embodiment, the insulating region 242 of the aperture region 240 may include a first recess 242R1 formed from an outer ring or an inward direction from the outer ring thereof, and the aperture 241 of the aperture region 240 may include a second recess 241R2 in a region corresponding to the first recess 242R1 of the insulating region 242.

A plurality of first recesses 242R1 of the insulating region 242 and second recesses 241R2 of the aperture 241 may be provided, for example, but are not limited thereto.

The first recess 242R1 and the second recess 241R2 may have a polygonal shape such as a triangle in horizontal cross section, but are not limited thereto. The first recess 242R1 or the second recess 241R2 may be referred to as a first dip or a second deep, but is not limited thereto.

FIG. 19B is an exemplary view of an emission mode in the aperture region 240 of the surface-emitting laser device according to the embodiment illustrated in FIG. 19A.

According to an embodiment, by arranging a recess or a deep in the aperture region 240, the mode has a special technical effect such that a higher mode shift is delayed by controlling an available mode due to optical confinement by the recess or dip.

For example, according to the embodiment, a plurality of second recesses 241R2 are disposed in the aperture 241 of the aperture region 240 to generate laser oscillation L at the aperture between the second recesses 241R2 so that optical confinement can be made. Through this, there is a special technical effect that the higher mode shift is delayed and the mode is maintained by controlling the available mode.

Accordingly, according to an embodiment, the beam mode can be controlled when a high current is applied or despite an increase in the aperture size. In addition, it is possible to provide a surface-emitting laser device, and a light emitting device including the same capable of preventing a problem in which a beam pattern of an emission beam is split according to a higher mode shift.

FIG. 20A is light emission image data according to a mode in a surface emitting laser device. It is a light emission image according to the light emission mode according to the LPxy notation, and the image becomes complicated as it becomes a higher mode as the xy index rises.

For reference, in relation to the measurement equipment, the far field beam profile of the surface-emitting laser device was measured using a beam profiler measuring instrument, 8050M-GE-TE (Thorlabs, Inc.) (8050M-GE-TE specification information: 8 Megapixel Monochrome Scientific CCD Camera, Hermetically Sealed Cooled Package, GigE Interface).

FIG. 20B is data of a wavelength of peak energy according to a mode in a surface emitting laser device.

In a surface-emitting laser device, the higher the mode, the higher the peak short wavelength shift occurs at higher energy, and this shift occurs sporadic rather than continuous shifts, resulting in energy discontinuity and hopping occurs.

FIG. 20C is a conceptual diagram illustrating a mode stabilization mechanism in a surface emitting laser device according to an embodiment.

According to the embodiment, by disposing the second recess R2 in the aperture 241, the available mode may be controlled due to the optical confinement of the second recess 241R2. Accordingly, there is a special technical effect that the higher mode shift is delayed and the mode is maintained.

For example, in the embodiment, when four second recesses 241R2 are disposed in the aperture 241, mode oscillation is possible only when x is an even number in LPxy mode, and when x is odd in LPxy mode, There is a special technical effect of securing the stabilization of the oscillation mode by increasing the energy margin at which a specific mode stably oscillates by controlling the oscillation mode to be interrupted by the oscillation mode in the second recess 241R2. However, the mode in which the oscillation is blocked is only exemplary and is not limited to the above.

Next, FIGS. 21A to 21D are diagrams illustrating a manufacturing process of the aperture region 240 of the surface-emitting laser device according to the embodiment shown in FIG. 19A, and FIG. 22 is a cross-sectional view of the aperture region 240 of the surface-emitting laser device according to the embodiment shown in FIG. 21C.

Referring to FIG. 21A, in order to form the aperture region 240, an AlGa-based layer 241a may be formed, and the AlGa-based layer 241a may be defined by mesa etching M.

Thereafter, a first recess 242R1 may be formed from the outer side to the inner side of the AlGa-based layer 241a. In this case, the aperture design area 241M corresponding to the aperture 241 may be scheduled in the center area.

The radius r of the aperture design region 241M may be smaller than the radius R of the AlGa-based layer 241a.

FIG. 21B is an enlarged view of the first recess 242R1, and the first recess 242R1 may be provided in plural and may have a polygonal shape, for example, an isosceles triangular shape, but is not limited thereto.

For example, the first height l1 of the first recess 242R1 may be less than or equal to a value obtained by subtracting the radius R of the aperture design region 241M from the radius R of the AlGa-based layer 241a.

In addition, the first angle θ of the first recess 242R1 may be 5° to 30°, and when the first angle θ is less than 5°, the formation of the second recess 241R2 that proceeds after may not be achieved properly, and if the first angle θ exceeds 30°, the area of the second recess 241R2 formed afterwards may be too wide, and thus it may be difficult to secure the width of the aperture 241 to be diverged.

Next, referring to FIG. 21C, in order to form the aperture region 240, an insulating region 242 is formed in the AlGa-based layer 241a through an oxidation process, and an aperture 241 can be defined.

In this case, the aperture 241 may include a second recess 241R2 in a region corresponding to the first recess 242R1.

FIG. 21D is an enlarged view of the second recess 241R2, and the second recess 241R2 may be provided in plural and may have a polygonal shape. For example, when the first recess 242R1 has an isosceles triangle shape, the second recess 241R2 may have an isosceles triangle shape, but is not limited thereto.

The second angle θ of the second recess 241R2 may be 2° to 45°. When the second angle θ is less than 2°, the light confinement effect may be insignificant. When the second angle θ exceeds 45°, the area of the second recess 241R2 formed thereafter may be too wide to secure the width of the aperture 241 to be diverged.

Next, FIG. 22 is a surface light emission according to the embodiment shown in FIG. 21C. It is a cross-sectional view of the aperture region 240 along the line A5-A6 of the laser device.

According to the embodiment, the first recess 242R1 may be formed by removing from the second reflective layer 250 to the active region 230. In order to form the first recess 242R1, a portion of the first reflective layer 220 may be partially removed through the active region 230, but is not limited thereto.

Thereafter, the insulating region 242 may be formed through an oxidation process to define the aperture 241. In this case, the insulating region 242 subjected to the oxidation process in the region corresponding to the first recess 242R1 may be defined as the second recess 241R2.

In an embodiment, the aperture 241 may include a first aperture 241q spaced apart from the second recess 241R2 and a second aperture 241p adjacent to the second recess 241R2. The first radius r1 of the first aperture 241q based on the center 240C of the aperture region may be larger than the second radius r2 of the second aperture 241p.

The embodiment has a special technical effect in that a higher mode shift is delayed and the mode is maintained by controlling an available mode due to optical confinement by the recess by arranging a recess in the aperture area.

The embodiment can control the beam mode when applying a high current or despite an increase in the aperture size. Accordingly, the embodiment can provide a surface-emitting laser device and a light emitting device including the same capable of preventing a problem in which a beam pattern of an emission beam is split according to a higher mode shift.

Hereinafter, a feature in which mode control is possible by improving the electrode structure in the embodiment will be described with reference to FIGS. 23 and 24.

FIG. 23 is a diagram illustrating an electrode structure in the related art. For example, in the related art, the second reflective layer 50 is disposed above the aperture 41 and the second electrode, for example, a contact electrode 82 is disposed outside the aperture 41.

Accordingly, in the related art, when a high current is applied or an aperture size is increased, a problem occurs in that a beam pattern is split due to a higher mode shift.

FIG. 24 is an exemplary diagram illustrating a structure of a second electrode in a surface emitting laser device according to an embodiment.

FIGS. 18 and 24, a surface light emitting device according to another exemplary embodiment includes a first electrode 215, a substrate 210 disposed on the first electrode 215, a first reflective layer 220 disposed on the substrate 210, the active region 230 disposed on the first reflective layer 220. And another exemplary embodiment includes a cavity area disposed on the active region 230, an aperture region 240 including an aperture 241 and an insulating region 242, a second reflective layer 250 disposed on the aperture region 240, and a second reflective layer 250 disposed on the second reflective layer 250. and two electrodes 280.

The second electrode 280 may include a contact electrode 282 on the second reflective layer 250 and a pad electrode 284 electrically connected to the contact electrode 282.

The contact electrode 282 may include a first contact electrode 82a disposed outside the aperture 41 and a plurality of protruding electrodes 282p extending in a direction of the aperture 241.

For example, according to the embodiment, the second reflective layer 250 may be disposed above the aperture 241, and the contact electrode 282 of the embodiment includes a first contact electrode 282a outside the aperture 41. It may include a plurality of protruding electrodes 282p disposed and extending in the direction of the aperture 241.

The plurality of protrusion electrodes 282p is illustrated as having four, but is not limited thereto, and may be formed in a plurality of two or more.

The embodiment has a special technical effect of controlling the light emission mode using current injection contrast by extending the protruding electrode 282p of the contact electrode 282 to be adjacent to the position of the aperture 241.

For example, in the embodiment, the first contact electrode 282a is disposed outside the aperture 41 and may include a plurality of protruding electrodes 282p extending in the direction of the aperture 241. As a result, there is a special technical effect that a higher mode shift is delayed and the mode is maintained by controlling an available mode for laser divergence L by inducing optical confinement between the plurality of protruding electrodes 282p.

Second Embodiment

Next, the technical effects of the surface-emitting laser device 202 according to the second embodiment will be described in detail with reference to FIGS. 25 to 28.

The second embodiment can adopt the technical features of the first embodiment, and the main features of the second embodiment will be described below.

FIG. 25 is a first distribution data of a refractive index and light energy in the surface emitting laser device 202 according to the second embodiment.

The distribution of light energy emitted from the surface-emitting laser device of the second embodiment has a maximum value around the active area 230 as shown in FIG. 25. Meanwhile, in the embodiment, the light energy distribution E is not limited to the distribution data shown in FIG. 25, and the light energy distribution in each layer may be different from that shown in FIG. 25 depending on the composition and thickness of each layer.

The distribution of light energy emitted from the surface-emitting laser device of the second embodiment may have a maximum value around the active area 230 as shown in FIG. 25. Also, as the distance from the active region 230 increases, the distribution of light energy may decrease in a predetermined period. Meanwhile, in the embodiment, the light energy distribution E is not limited to the distribution data shown in FIG. 25, and the light energy distribution in each layer may be different from that shown in FIG. 25 depending on the composition and thickness of each layer.

One of the technical problems of the embodiment is to provide a surface-emitting laser device, and a light emitting device including the same capable of improving light output by minimizing the influence of a carrier barrier due to generation of an electric field in a reflective layer.

Referring to FIG. 25, the light energy distribution according to the position in the surface-emitting laser device according to the embodiment can be seen. As described above, the light energy distribution decreases as the distance from the active region 230 increases. In consideration of energy distribution, the concentration of the first conductivity type dopant in the first reflective layer 221 of the first group may be controlled to be higher than the dopant concentration in the first reflective layer 222 of the second group.

For example, referring to FIG. 27, in an exemplary embodiment, the first reflective layer 220 includes a first group first reflective layer 221 and the first group second reflective layer 222 disposed on one side of the active region 230. The second group of first reflective layers 222 is disposed closer to the active region 230 than first group first reflective layer 221.

In this case, the light energy from the second group first reflective layer 222 disposed adjacent to the active region 230 is higher than the light energy from the first group first reflective layer 221.

In the embodiment, the concentration of the first conductivity type dopant in the second group first reflective layer 222 may be controlled to be lower than the dopant concentration in the first group first reflective layer 221 in consideration of light energy distribution. On the other hand, the first conductivity type dopant may be doped relatively high in the region of the first group first reflective layer 221 having relatively low light energy. Accordingly, in the second group first reflective layer 222, light absorption by the dopant may be minimized to improve light output. In addition, in the first group of first reflective layers 221, voltage efficiency may be improved by improving resistance due to a relatively high dopant. Through this, there is a special technical effect capable of providing a surface-emitting laser device and a light emitting device including the same capable of simultaneously improving light output and voltage efficiency.

For example, the concentration of the dopant in the first group first reflective layer 221 may be about 2.00E18, and in the second group first reflective layer 222 may be about 1.00E18, but is not limited thereto.

In addition, the second reflective layer 250 of the embodiment may include a first group of second reflective layers 251 disposed close to the active region 230. In addition, the second reflective layer 250 may include a second group second reflective layer 252 disposed farther from the active region 230 than the first group second reflective layer 251.

In this case, the light energy of the second reflective layer 251 of the first group disposed adjacent to the active region 230 is higher than that of the second reflective layer 252 of the second group.

Accordingly, in the embodiment, the concentration of the first conductivity type dopant in the second group first reflective layer 222 may be controlled to be lower than the dopant concentration in the first group first reflective layer 221 in consideration of light energy distribution and the first conductivity type dopant may be doped relatively high in the region of the first group first reflective layer 221 having relatively low light energy. Accordingly, in the second group first reflective layer 222, light absorption by the dopant may be minimized to improve light output, and in the first group of first reflective layers 221, voltage efficiency may be improved by improving resistance due to a relatively high dopant so that there is a special technical effect capable of providing a surface-emitting laser device and a light emitting device including the same capable of simultaneously improving light output and voltage efficiency.

In the embodiment, in consideration of the light energy distribution, the doping concentration can be lowered in the region of high light energy, and the doping concentration is controlled to be high in the region of low light energy, thereby minimizing the influence of carrier barrier due to the generation of electric field in the reflective layer such that it is possible to provide a surface emitting laser device and a light emitting device including the same capable of improving light output.

Next, one of the technical problems of the embodiment is to provide a surface-emitting laser device, and a light emitting device including the same capable of improving light output by minimizing the influence of a carrier barrier due to generation of an electric field in a reflective layer.

In the conventional VCSEL structure, there is a problem in that a carrier barrier is generated due to the generation of an electric field due to energy band bending at an interface between adjacent DBR layers, thereby reducing light output.

In addition, one of the technical problems of the embodiment is to provide a surface emitting laser device and a light emitting device including the same capable of improving light output while improving voltage efficiency.

That is, in the related art, in order to prevent the occurrence of resistance in the reflective layer DBR, there is an attempt to increase the voltage efficiency by lowering the resistance by increasing the doping concentration, but a technical contradiction is occurring in that when the doping concentration is increased, internal light absorption is generated by the dopant and the light output decreases.

In order to solve such a technical problem, the embodiment has a technical effect of improving voltage efficiency while improving light output by controlling the concentration of the first conductivity type dopant in the reflective layer in consideration of the light energy distribution mode.

FIG. 26 is a second distribution data of the refractive index n in the surface emitting laser device 202 according to the second embodiment.

FIG. 27 is data of a refractive index (N1) of the first reflective layer 220 of the surface-emitting laser device according to the second embodiment shown in FIG. 26, and FIG. 28 is a refractive index (N2) of the second reflective layer (250).

First, referring to FIG. 27, in an embodiment, the first reflective layer 220 may include a first group first reflective layer 221 and a second group first reflective layer 222.

At this time, the first group first reflective layer 221 may include a plurality of layers, for example, the 1-1st reflective layer 221p, the 1-2nd reflective layer 221q, and the 1-3 reflective layer 221r, and a 1-4th reflective layer 221s.

In an embodiment, the first group of first reflective layers 221 may include a plurality of pairs when the 1-1st reflective layers 221p to 1-4th reflective layers 221s are used as one pair. For example, in an embodiment, the first group first reflective layer 221 may include about 30 to 40 pairs of the 1-1st reflective layers 221p to 1-4th reflective layers 221s.

In addition, the second group first reflective layer 222 may include a plurality of layers, for example, the 1-5th reflective layer 222p, the 1-6th reflective layer 222q, and the 1-7th reflective layer 222r, and a 1-8th reflective layer 222s.

In addition, the second group first reflective layer 222 may also include a plurality of pairs when the 1-5th reflective layers 222p to 1-8th reflective layers 222s are used as one pair. For example, in the embodiment, when the first reflective layers 222 of the second group 222 have the 1-5th reflective layers 222p to the 1-8 reflective layers 222s as one pair, about 5 to 15 pairs.

In the conventional VCSEL structure, there is a problem in that a carrier barrier is generated due to the generation of an electric field due to energy band bending at an interface between adjacent DBR layers, thereby reducing light output.

Accordingly, one of the technical problems of the embodiment is to provide a surface-emitting laser device and a light emitting device including the same capable of improving light output by minimizing the influence of a carrier barrier due to generation of an electric field in a reflective layer.

Referring to FIG. 27, in an embodiment, the first group first reflective layers 221 include a 1-1st reflective layer 221p, a 1-2nd reflective layer 221q, a 1-3 reflective layer 221r, and a 1-4 reflective layer 221s may be included, and each layer may have a different refractive index.

For example, the first group first reflective layer 221 may have a 1-1st reflective layer 221p having a first refractive index, and a second refractive index lower than the first refractive index, and the 1-1st reflective layer 221p, and a third refractive index between the first refractive index and the second refractive index, and may include a 1-3th reflective layer 221r disposed between the 1-1st reflective layer 221p and the 1-2nd reflective layer 221q.

For example, the first group first reflective layer 221 has a 1-1st reflective layer 221p having a first aluminum concentration and a second aluminum concentration higher than the first aluminum concentration, and the 1-2nd reflective layer 221q is disposed on one side of the reflective layer 221p, and has a third aluminum concentration that changes from the first aluminum concentration to the second aluminum concentration. A 1-3th reflective layer 221r disposed between the 1-2nd reflective layers 221q may be included.

For example, when the first group first reflective layer 221 includes $AlxGa_{(1-x)}As_{(0<x<1)}$, the 1-1st reflective layer 221p may be $Al_{0.12}Ga_{0.88}As$, and, The 1-2nd reflective layer 221q may be $Al_{0.88}Ga_{0.12}As$, and the 1-3th reflective layer 221r may be $Al_{x3}Ga_{(1-x3)}As_{(0.12 \le x3 \le 0.88)}$, but is not limited thereto.

In addition, the first group first reflective layer 221 is disposed outside the 1-2nd reflective layer 221q and has a fourth aluminum concentration that changes from the first aluminum concentration to the second aluminum concentration. A reflective layer 221s may be further included.

For example, when the first group first reflective layer 221 includes $AlxGa_{(1-x)}As_{(0<x<1)}$, the 1-4th reflective layers 221s are $Al_{x4}Ga_{(1-x4)}As_{(0.12 \le x4 \le 0.88)}$, but is not limited thereto.

Through this, according to an embodiment, the 1-3th reflective layer 221r or the 1-4th reflective layer having an aluminum concentration in an intermediate region between the adjacent 1-1st reflective layer 221p and 1-2nd reflective layer 221q minimizes the generation of an electric field caused by energy band bending at the interface between adjacent reflective layers, thereby lowering the carrier barrier, thereby improving light output.

Accordingly, according to the embodiment, it is possible to provide a surface-emitting laser device, and a light emitting device including the same capable of improving light output by minimizing the influence of a carrier barrier due to generation of an electric field in a reflective layer.

In addition, in an embodiment, the thickness of the 1-2nd reflective layer 221q may be thicker than the thickness of the 1-1st reflective layer 221p. In addition, a thickness of the 1-1st reflective layer 221p or the 1-2nd reflective layer 221q may be thicker than that of the 1-3th reflective layer 221r or the 1-4th reflective layer 221s.

In this case, the second aluminum concentration of the 1-2nd reflective layer 221q may be higher than the first aluminum concentration of the 1-1st reflective layer 221p. In addition, the first aluminum concentration of the 1-1st reflective layer 221p may be higher than the third aluminum concentration of the 1-3th reflective layers 221r or the fourth aluminum concentration of the 1-4th reflective layers 221s.

Accordingly, since the thickness of the 1-2nd reflective layer 221q having a relatively high aluminum concentration is thicker than that of the 1-1st reflective layer 221p, the grating quality may be improved to contribute to light output.

In addition, since the thickness of the 1-1st reflective layer 221p, which has a relatively high aluminum concentration, is thicker than the thickness of the 1-3 reflective layer 221r or the 1-4th reflective layer 221s, it will contribute to light output by improving the lattice quality.

For example, the 1-2nd reflective layer 221q may have a thickness of about 50 to 55 nm, the 1-1st reflective layer 221p may have a thickness of about 40 to 45 nm, and the aluminum concentration is relatively high. Since the thickness of the 1-2nd reflective layer 221q is thicker than that of the 1-1st reflective layer 221p, the lattice quality may be improved, thereby contributing to light output.

In addition, the thickness of the 1-3th reflective layer 221r may be about 22 to 27 nm, the thickness of the 1-4th reflective layer 221s may be about 22 to 27 nm, and the aluminum concentration is relatively high. Since the thickness of the 1-2nd reflective layer 221q and the 1-1st reflective layer 221p is thicker than that of the 1-3th reflective layer 221r and the 1-4th reflective layer 221s, the lattice quality can be improved to contribute to light output.

Referring to FIG. 27, in an embodiment, the second group first reflective layer 222 includes a 1-5th reflective layer 222p, a 1-6th reflective layer 222q, a 1-7th reflective layer 222r, and 1-8th reflective layers 222s, and each layer may have a different refractive index.

For example, the second group first reflective layer 222 has a 1-5th reflective layer 222p having a fifth refractive index, and a 1-6th reflective layer (222q) disposed on one side of the 1-5th reflective layer 222p having a sixth refractive index lower than the fifth refractive index. In addition, it includes a 1-7th reflective layer (222r) having a seventh refractive index between the fifth refractive index and the sixth refractive index and disposed between the 1-5th reflective layer 222p and the 1-6th reflective layer 222q.

For example, the second group first reflective layer 222 has a 1-5th reflective layer 222p having a fifth aluminum concentration and a 1-6th reflective layer (222q) disposed on one side of the 1-5th reflective layer 222p having a sixth aluminum concentration higher than the fifth aluminum concentration. In addition, it includes a 1-7th reflective layer 222r which has a seventh aluminum concentration that changes from the fifth aluminum concentration to the sixth aluminum concentration, and is disposed between the 1-5th reflective layer 222p and the 1-6th reflective layer 222q.

For example, when the second group first reflective layer 222 includes $AlxGa_{(1-x)}As_{(0<x<1)}$, the 1-5th reflective layers 222p may be $Al_{0.12}Ga_{0.88}As$, and the 1-6th reflective layer 222q may be $Al_{0.88}Ga_{0.12}As$, and the 1-7th reflective layer 222r may be $Al_{x3}Ga_{(1-x3)}As_{(0.12 \leq x3 \leq 0.88)}$, but is not limited thereto.

In addition, the second group first reflective layer 222 may further include A 1-8th reflective layer 222s disposed outside the 1-6th reflective layers 222q and has an eighth aluminum concentration that changes from a fifth aluminum concentration to the sixth aluminum concentration.

For example, when the second group first reflective layer 222 includes $AlxGa_{(1-x)}As_{(0<x<1)}$, the 1-8th reflective layers 222s are $Al_{x4}Ga_{(1-x4)}As_{(0.12 \leq x4 \leq 0.88)}$, but is not limited thereto.

Through this, according to an embodiment, the 1-7th reflective layer 222r or the 1-8th reflective layer 222s having an aluminum concentration in an intermediate region between the adjacent 1-5th reflective layers 222p and 1-6th reflective layers 222q minimizes the generation of an electric field due to energy band bending at the interface between adjacent reflective layers, thereby lowering the carrier barrier, thereby improving light output.

Accordingly, according to the embodiment, it is possible to provide a surface-emitting laser device, and a light emitting device including the same capable of improving light output by minimizing the influence of a carrier barrier due to generation of an electric field in a reflective layer.

Also, in an embodiment, the thickness of the 1-6th reflective layer 222q may be thicker than the thickness of the 1-5th reflective layer 222p. In addition, a thickness of the 1-5th reflective layer 222p or the 1-6th reflective layer 222q may be thicker than that of the 1-7th reflective layer 222r or the 1-8th reflective layer 222s.

In this case, the sixth aluminum concentration of the 1-6th reflective layers 222q may be higher than the fifth aluminum concentration of the 1-5th reflective layers 222p. In addition, the fifth aluminum concentration of the 1-5th reflective layers 222p may be higher than the seventh aluminum concentration of the 1-7th reflective layers 222r or the eighth aluminum concentration of the 1-8th reflective layers 222s.

Accordingly, since the thickness of the 1-6th reflective layer 222q, which has a relatively high aluminum concentration, is thicker than the thickness of the 1-5th reflective layer 222p, it is possible to improve the grating quality and contribute to light output.

In addition, since the thickness of the 1-5th reflective layer 222p having a relatively high aluminum concentration is thicker than the thickness of the 1-7th reflective layer 222r or the 1-8th reflective layer 222s, it will contribute to light output by improving the lattice quality.

For example, the thickness of the 1-6th reflective layer 222q may be about 50 to 55 nm, the thickness of the 1-5th reflective layer 222p may be about 40 to 45 nm, and the aluminum concentration is relatively high. Since the thickness of the 1-6th reflective layers 222q is thicker than the thickness of the 1-5th reflective layers 222p, the grating quality may be improved, thereby contributing to the light output.

In addition, the thickness of the 1-7th reflective layer 222r may be about 22 to 27 nm, the thickness of the 1-8th reflective layer 222s may be about 22 to 27 nm, and the aluminum concentration is relatively high. Since the thicknesses of the 1-6th reflective layers 222q and 1-5th reflective layers 222p are thicker than those of the 1-7th reflective layers 222r and 1-8th reflective layers 222s, the lattice quality can be improved to contribute to light output.

Next, FIG. 28 is data of the refractive index N2 of the second reflective layer 250 of the surface-emitting laser device 202 according to the second embodiment shown in FIG. 26.

Referring to FIG. 28, in an embodiment, the second reflective layer 250 may include a first group second reflective layer 251 and a second group second reflective layer 252.

At this time, the first group second reflective layer 251 may include a plurality of layers, for example, the 2-1st reflective layer 251p, the 2-2nd reflective layer 251q, and the 2-3rd reflective layer 251r and a 2-4th reflective layer 251s.

In an embodiment, the second reflective layer 251 of the first group may include a plurality of pairs when the 2-1st reflective layers 251p to 2-4th reflective layers 251s are used as one pair. For example, in an embodiment, the first group of second reflective layers 251 may include about 2 to 5 pairs of 2-1st reflective layers 251p to 2-4th reflective layers 251s.

In addition, the second group second reflective layer 252 may include a plurality of layers, for example, the 2-5th reflective layer 252p, the 2-6th reflective layer 252q, and the 2-7th reflective layer 252r and a 2-8th reflective layer 252s.

The second group of second reflective layers 252 may also include a plurality of pairs when the 2-5th reflective layers 252p to 2-8th reflective layers 252s are used as one pair. For example, in the embodiment, the second group of second reflective layers 252 is about 10 to 20 when the 2-5th reflective layers 252p to 2-8th reflective layers 252s are used as one pair.

One of the technical problems of the embodiment is to provide a surface-emitting laser device and a light emitting device including the same capable of improving light output by minimizing the influence of a carrier barrier due to generation of an electric field in a reflective layer.

Referring to FIG. 28, in an embodiment, the first group second reflective layers 251 include a 2-1st reflective layer 251p, a 2-2nd reflective layer 251q, a 2-3rd reflective layer 251r, and a s2-4th reflective layer 251s and each layer may have a different refractive index.

For example, the first group second reflective layer 251 has a 2-1st reflective layer 251p having a first refractive index, and a 2-2nd reflective layer 251q disposed on one side of 2-1st reflective layer 251p having a second refractive index lower than the first refractive index, and a 2-3rd reflective layer 251r disposed therebetween the 2-1st reflective layer 251p and the 2-2nd reflective layer 251q having a third refractive index between the first and second refractive indexes.

For example, the first group second reflective layer 251 has a 2-1st reflective layer 251p having a first aluminum concentration, and 2-2nd reflective layer 251q disposed on one side of the 2-1st reflective layer 251p having a second aluminum concentration higher than the first aluminum concentration. It includes a 2-3rd reflective layer 251r having a third aluminum concentration that changes from the first aluminum concentration to the second aluminum concentration, disposed between the 2-1st reflective layer 251p and 2-2nd reflective layers 251q.

For example, when the first group second reflective layer 251 includes $AlxGa_{(1-x)}As_{(0<x<1)}$, the 2-1st reflective layer 251p may be $Al_{0.12}Ga_{0.88}As$, the 2-2nd reflective layer 251q may be $Al_{0.88}Ga_{0.12}As$, and the 2-3rd reflective layer 251r may be $Al_{x3}Ga_{(1-x3)}As_{(0.12 \leq X3 \leq 0.88)}$, but is not limited thereto.

In addition, the first group second reflective layer 251 further includes a 2-4th reflective layers 251s disposed outside the 2-2nd reflective layer 251q and having a fourth aluminum concentration that changes from the first aluminum concentration to the second aluminum concentration.

For example, when the first group second reflective layer 251 includes $AlxGa_{(1-x)}As_{(0<x<1)}$, the 2-4th reflective layers 251s is $Al_{x4}Ga_{(1-x4)}As_{(0.12 \leq X4 \leq 0.88)}$, but is not limited thereto.

Through this, according to an embodiment, the 2-3rd reflective layer 251r or the 2-4th reflective layer having an aluminum concentration in an intermediate region between the adjacent 2-1st reflective layer 251p and the 2-2nd reflective layer 251q and minimizes the generation of an electric field caused by energy band bending at the interface between adjacent reflective layers, thereby lowering the carrier barrier, thereby improving light output.

Accordingly, according to the embodiment, it is possible to provide a surface-emitting laser device, and a light emitting device including the same capable of improving light output by minimizing the influence of a carrier barrier due to generation of an electric field in a reflective layer.

Also, in an embodiment, the thickness of the 2-2nd reflective layer 251q may be thicker than the thickness of the 2-1nd reflective layer 251p. In addition, the thickness of the 2-1st reflective layer 251p or the 2-2nd reflective layer 251q may be thicker than that of the 2-3rd reflective layer 251r or the 2-4th reflective layer 251s.

In this case, the second aluminum concentration of the 2-2nd reflective layer 251q may be high in the first aluminum concentration of the 2-1nd reflective layer 251p. In addition, the first aluminum concentration of the 2-1st reflective layer 251p may be higher than the third aluminum concentration of the 2-3rd reflective layer 251r or the fourth aluminum concentration of the 2-4th reflective layer 251s.

Accordingly, since the thickness of the 2-2nd reflective layer 251q having a relatively high aluminum concentration is thicker than the thickness of the 2-1st reflective layer 251p, the grating quality may be improved, thereby contributing to light output.

In addition, since the thickness of the 2-1st reflective layer 251p, which has a relatively high aluminum concentration, is thicker than the thickness of the 2-3rd reflective layer 251r or the 2-4th reflective layer 251s, it will contribute to light output by improving the lattice quality.

For example, the thickness of the 2-2nd reflective layer 251q may be about 50 to 55 nm, the thickness of the 2-1st reflective layer 251p may be about 26 to 32 nm, and the aluminum concentration is relatively high. Since the thickness of the 2-2nd reflective layer 251q is thicker than the thickness of the 2-1nd reflective layer 251p, the grating quality may be improved, thereby contributing to light output.

In addition, the thickness of the 2-3rd reflective layer 251r may be about 22 to 27 nm, the thickness of the 2-4th reflective layer 251s may be about 22 to 27 nm, and the aluminum concentration is relatively high. Since the thickness of the 2-2nd reflective layer 251q and the 2-1st reflective layer 251p is thicker than that of the 2-3rd reflective layer 251r and the 2-4th reflective layer 251s, it is possible to contribute to light output by improving the lattice quality.

With continued reference to FIG. 28, in an embodiment, the second group second reflective layer 252 includes a 2-5th reflective layer 252p, a 2-6th reflective layer 252q, a 2-7th reflective layer 252r, and 2-8th reflective layer 252s, and each layer may have a different refractive index.

For example, the second group of second reflective layers 252 may include a 2-5th reflective layer 252p having a fifth refractive index and a 2-6th reflective layer 252q disposed on one side of the 2-5th reflective layer 252p having a 6th refractive having index lower than the fifth refractive index. It further includes a 2-7th reflective layer 252r having a 7th refractive index between the 5th and 6th refractive indexes and disposed between the 2-5th reflective layer 252p and the 2-6th reflective layer 252q.

For example, the second group second reflective layer 252 has a 2-5th reflective layer 252p having a fifth aluminum concentration, and a 2-6th reflective layer 252q disposed on one side of the 2-5th reflective layer 252p having a 6th aluminum concentration higher than the fifth aluminum concentration, and a 2-7th reflective layer 252r disposed between the 2-5th reflective layer 252p and the 2-6th reflective layer 252q having a seventh aluminum concentration that changes from the fifth aluminum concentration to the sixth aluminum concentration.

For example, when the second group second reflective layer 252 includes $AlxGa_{(1-x)}As_{(0<x<1)}$, the 2-5th reflective layer 252p may be $Al_{0.12}Ga_{0.88}As$, and the 2-6th reflective layer 252q may be $Al_{0.88}Ga_{0.12}As$, and the 2-7th reflective layer 252r may be $Al_{x3}Ga_{(1-x3)}As_{(0.12 \leq x3 \leq 0.88)}$, but is not limited thereto.

In addition, the second group second reflective layer 252 includes a 2-8th reflective layer 252s disposed outside the 2-6th reflective layer 252q and having an eighth aluminum concentration that changes from a fifth aluminum concentration to the sixth aluminum concentration.

For example, when the second group of second reflective layers 252 includes $AlxGa_{(1-x)}As_{(0<x<1)}$, the 2-8th reflective layers 252s are $Al_{x4}Ga_{(1-x4)}As_{(0.12 \leq x4 < 0.88)}$, but is not limited thereto.

Through this, according to the embodiment, the 2-7th reflective layer 252r or the 2-8th reflective layer having an aluminum concentration in the intermediate region between the adjacent 2-5th reflective layer 252p and 2-6th reflective layer 252q and minimizes the generation of an electric field caused by energy band bending at the interface between adjacent reflective layers, thereby lowering the carrier barrier, thereby improving light output.

Accordingly, according to the embodiment, it is possible to provide a surface-emitting laser device, and a light emitting device including the same capable of improving light output by minimizing the influence of a carrier barrier due to generation of an electric field in a reflective layer.

In addition, in the embodiment, the thickness of the 2-6th reflective layer 252q may be thicker than the thickness of the 2-5th reflective layer 252p. Further, the thickness of the 2-5th reflective layer 252p or the 2-6th reflective layer 252q may be thicker than that of the 2-7th reflective layer 252r or the 2-8th reflective layer 252s.

In this case, the sixth aluminum concentration of the 2-6th reflective layers 252q may be higher than the fifth aluminum concentration of the 2-5th reflective layers 252p. In addition, the fifth aluminum concentration of the 2-5th reflective layers 252p may be higher than the seventh aluminum concentration of the 2-7th reflective layers 252r or the eighth aluminum concentration of the 2-8th reflective layers 252s.

Accordingly, since the thickness of the 2-6th reflective layer 252q having a relatively high aluminum concentration is thicker than the thickness of the 2-5th reflective layer 252p, the grating quality may be improved to contribute to light output.

In addition, since the thickness of the 2-5th reflective layer 252p, which has a relatively high aluminum concentration, is thicker than the thickness of the 2-7th reflective layer 252r or the 2-8th reflective layer 252s, it can contribute to light output by improving the lattice quality.

For example, the thickness of the 2-6th reflective layer 252q may be about 50 to 55 nm, the thickness of the 2-5th reflective layer 252p may be about 40 to 45 nm, and the aluminum concentration is relatively high. Since the thickness of the 2-6th reflective layer 252q is thicker than that of the 2-5th reflective layer 252p, it is possible to improve the grating quality and contribute to light output.

Further, the thickness of the 2-7th reflective layer 252r may be about 22 to 27 nm, the thickness of the 2-8th reflective layer 252s may be about 22 to 27 nm, and the aluminum concentration is relatively high. Since the thicknesses of the 2-6 reflective layers 252q and 2-5th reflective layers 252p are thicker than those of the 2-7th reflective layers 252r and 2-8th reflective layers 252s, the grating quality can be improved to contribute to light output.

Next, one of the technical problems of the embodiment is to provide a surface emitting laser device, and a light emitting device including the same capable of improving light output by minimizing the influence of a carrier barrier due to generation of an electric field in a reflective layer.

Referring to FIG. 25 for a moment, the distribution of light energy (E) according to the position in the surface-emitting laser device according to the embodiment can be seen. The distribution of light energy decreases as the distance from the active region 230 increases. In consideration of the energy distribution, referring to FIG. 28, the concentration of the first conductivity type dopant in the second reflective layer 251 of the first group is controlled to be lower than the dopant concentration in the second reflective layer 252 of the second group.

For example, in the embodiment, the concentration of the dopant in the first group second reflective layer 251 may be about 7.00E17 to 1.50E18, and in the second group second reflective layer 252, about 1.00E18 to 3.00E18 can be controlled. In an embodiment, the concentration unit 1.00E18 may mean $1.00 \times 10^{18}$ (atoms/$cm^3$). In an embodiment, the p-type dopant may be C (Carbon), but is not limited thereto.

Through this, the embodiment controls the concentration of the second conductivity type dopant in the second group second reflective layer 252 to be higher than the dopant concentration in the first group second reflective layer 251, and has a relatively high optical energy. By doping the second conductive type dopant relatively low in the region of the first group second reflective layer 251, the second reflective layer 251 of the first group minimizes light absorption by the dopant, thereby improving light output, In the group second reflective layer 252, a surface-emitting laser device capable of simultaneously improving light output and voltage efficiency by improving voltage efficiency by improving resistance due to a relatively high dopant and a light emitting device including the same can be provided.

In addition, according to the related art, there is a possibility that the standing wave is absorbed by such a dopant to proceed at an interface with the DBR. Accordingly, the embodiment minimizes resistance by performing more doping at the node position where the optical power reflectance of the standing wave is the smallest, and performing light doping as low as possible at the antinode position. There is a technical effect that can minimize absorption. The node position may mean a point at which the refractive index of each layer increases or decreases to change.

With continued reference to FIG. 28, the refractive indices of the 2-1st reflective layer 251p and the 2-2nd reflective layer 251q in the second reflective layer 251 of the first group are the antinode positions that do not change to the upper or lower point. In addition, in the second reflective layer 251 of the first group, the refractive indices of the 2-3rd reflective layers 251r and the 2-4th reflective layers 251s may be a node position that changes by rising or falling.

Accordingly, in the embodiment, the second conductivity type doping concentration of the 2-3rd reflective layer 251r or the 2-4th reflective layer 251s is the second of the 2-1st reflective layer 251p or the 2-2nd reflective layer 251q. It can be controlled higher than the conductivity type doping concentration.

For example, the second conductivity type doping concentration of the 2-3rd reflective layer 251r or the 2-4th reflective layer 251s may be about 1.00E18 to 1.50E18, and the 2-1st reflective layer 251p or the second −2 The second conductivity type doping concentration of the reflective layer 251q may be about 6.00E17 to 8.00E17.

Accordingly, in the 2-3 reflective layer 251r or the 2-4th reflective layer 251s, which is a node position having a low optical power reflectance of the standing wave, a lot of doping is performed to minimize the resistance, and the 2-1st reflective layer 251p or the 2-2nd reflective layer 251q, which is an antinode position, has a complex technical effect that can minimize light absorption by performing low doping.

In addition, in the embodiment, among the 2-3 reflective layers 251r or 2-4th reflective layers 251s, which are the node positions, the 2-4th reflective layer 251s, which is the node position whose refractive index increases in a direction away from the active region 230. The concentration of the second conductivity type dopant may be controlled to be higher than the concentration of the second conductivity type dopant of the 2-3rd reflective layer 251r, which is a node position at which the refractive index decreases.

Through this, the concentration of the second conductivity type dopant of the 2-4th reflective layer 251s, which is a node position at which the refractive index having a relatively lower optical reflectivity is increased, can be controlled to be high, thereby improving electrical characteristics.

For example, the second conductivity type doping concentration of the 2-4th reflective layer 251s may be about 1.50E18, and the second conductivity type doping concentration of the 2-3rd reflective layer 251r may be about 1.00E18. Electrical characteristics may be improved by controlling the concentration of the second conductivity type dopant in the 2-4th reflective layers 251s, which have a relatively lower optical reflectivity, to be high.

Continuing with reference to FIG. 28, in the second group second reflective layer 252, the refractive indices of the 2-5th reflective layer 252p and the 2-6th reflective layer 252q are antinode positions that do not change to the upper or lower point. In addition, in the second group of second reflective layers 252, refractive indices of the 2-7th reflective layers 252r and 2-8th reflective layers 252s may be a node position that changes by rising or falling.

In the embodiment, the second conductivity type doping concentration of the 2-7th reflective layer 252r or the 2-8th reflective layer 252s is the second conductivity type of the 2-5th reflective layer 252p or the 2-6 reflective layer 252q and it can be controlled higher than the doping concentration.

For example, the second conductivity type doping concentration of the 2-7th reflective layer 252r or the 2-8th reflective layer 252s may be about 2.00E18 to 3.00E18, and the 2-5th reflective layer 252p or the second conductivity type doping concentration of the −6 reflective layer 252q may be about 1.00E18 to 1.50E18.

Accordingly, the 2-7th reflective layer 252r or the 2-8th reflective layer 252s, which is a node position having a low optical power reflectance of the standing wave, undergoes a lot of doping to minimize resistance. And the 2-5th reflective layer 252p or the 2-6th reflective layer 252q, which is the antinode position, has a complex technical effect that can minimize light absorption by performing low doping.

In addition, in the embodiment, among the 2-7th reflective layers 252r or 2-8th reflective layers 252s, which are the node positions, the 2-8th reflective layer 252s, which is the node position whose refractive index increases in a direction away from the active region 230. The concentration of the second conductivity type dopant may be controlled to be higher than the concentration of the second conductivity type dopant in the 2-7th reflective layer 252r, which is a node position at which the refractive index decreases.

Through this, the concentration of the second conductivity type dopant of the 2-8th reflective layers 252s, which is the node position at which the refractive index having a relatively lower optical reflectivity is increased, may be controlled to be high, thereby improving electrical characteristics.

For example, the second conductivity type doping concentration of the 2-8th reflective layers 252s may be about 3.00E18, and the second conductivity type doping concentration of the 2-7th reflective layers 252r may be about 2.00E18. Electrical characteristics may be improved by controlling the concentration of the second conductivity type dopant in the 2-8th reflective layers 252s, which have a relatively lower optical reflectivity, to be high.

Next, Table 1 below shows chip characteristic data in the related art (comparative example) and the embodiment.

According to the embodiment, as shown in Table 1, it can be seen that the light output, voltage characteristics, and the like are significantly improved.

TABLE 1

| | | | Comparative Example | Embodiment | Note |
|---|---|---|---|---|---|
| | Emitter No(ea) | | 202 | 202 | |
| Chip characteristics (@2.5A) | $W_p$ | nm | 937.5 | 939 | |
| | $P_{op}$ | mW | 1516 | 1858 | 22.6% increase |
| | $V_f$ | V | 2.19 | 1.96 | 0.23 V reduction |
| | PCE | % | 27.8 | 38.0 | 36.7% increase |

Third Embodiment

Next, FIG. 29 is an exemplary diagram of an energy band diagram 203 in the surface emitting laser device according to the third embodiment.

The third embodiment can adopt the technical features of the first and second embodiments.

For example, referring to FIG. 29, in an embodiment, when the first reflective layer 220 includes $Al_xGa_{(1-x)}As_{(0<x<1)}$, there is a grading in the Al concentration between adjacent reflective layers so that electric field generation can be minimized.

For example, the first reflective layer 220 may include a first layer 220p having a first aluminum concentration and a second layer 220q having a second aluminum concentration. The first reflective layer 220 includes a third layer 220r having a third concentration of aluminum between the first layer 220p having the first aluminum concentration and the second layer 220$q$ having a second aluminum concentration, the aluminum concentration of the third layer 220$r$ may have a value between the aluminum concentration between the first layer 220$p$ and the second layer 220$q$.

For example, the first reflective layer 220 includes a third layer 220$r$ of $Al_{x3}Ga_{(1-x3)}As_{(0.12 \le x3 \le 0.88)}$ between the first layer 220$p$ of $Al_{0.12}Ga_{0.88}As$ and the second layer 220$q$ of $Al_{0.88}Ga_{0.12}As$.

Through this, according to an embodiment, by providing a third layer 220$r$ having an aluminum concentration in an intermediate region between the first layer 220$p$ and the second layer 220$q$, the electric field by energy band bending at the interface between adjacent reflective layers could be minimized so that there is a technical effect that can improve light output by lowering the carrier barrier.

Accordingly, according to the embodiment, it is possible to provide a surface-emitting laser device, and a surface-emitting laser package including the same capable of improving light output by minimizing the influence of a carrier barrier due to generation of an electric field in a reflective layer.

Hereinafter, the main technical features of the third embodiment will be described.

With continued reference to FIG. 29, the third embodiment may include an active region 230 on the first reflective layer 220.

In this case, the active region 230 may include an active layer 232, a first cavity 231 disposed below the active layer 232, and a second cavity 233 disposed above the active layer 232. The active region 230 according to the embodiment may include both the first cavity 231 and the second cavity 233, or may include only one of the two.

The first cavity 231 and the second cavity 233 may be formed of an $AlyGa_{(1-y)}As_{(0<y<1)}$ material, but are not limited thereto. For example, the first cavity 231 and the second cavity 233 may each include a plurality of layers of $Al_yGa_{(1-y)}As$.

For example, the first cavity 231 may include a 1-1st cavity layer 231$a$ and a 1-2nd cavity layer 231$b$. The 1-1st cavity layer 231$a$ may be further spaced apart from the active layer 232 than the 1-2nd cavity layer 231$b$. The 1-1st cavity layer 231$a$ may be formed to be thicker than the 1-2nd cavity layer 231$b$, but is not limited thereto.

One of the technical problems of the embodiment is to provide a surface-emitting laser device and a surface-emitting laser package including the same capable of improving light output by improving voltage efficiency.

The embodiment provides a surface-emitting laser device having a technical effect capable of improving light output by improving voltage efficiency through reduction of resistance in an active region and a surface-emitting laser package including the same, in order to solve these technical problems.

First, referring to FIG. 29, in the third embodiment, the active region 230 includes a first cavity 231 disposed on the first reflective layer 220, a quantum well 232$a$, and a quantum barrier 232$b$, and includes an active layer 232 disposed on the first cavity 231. The first cavity 231 is adjacent to the first reflective layer 220 and includes a first conductive type first doped layer 261.

According to the third embodiment, by including the first conductive type first doped layer 261 in a partial region of the first cavity 231, the resistance is reduced compared to the existing active region, thereby reducing the resistance in the active region, thereby reducing the voltage efficiency such that there is a technical effect that can improve the light output by improving.

For example, in the third embodiment, when the first cavity 231 includes the 1-1st cavity layer 231$a$ and the 1-2nd cavity layer 231$b$, the active layer 232 is further spaced apart from each other. By including the first conductivity-type first doped layer 261 in the 1-1st cavity layer 231$a$, the resistance is reduced compared to the conventional active region, thereby reducing the resistance in the active region, thereby improving the voltage efficiency and increasing the light output.

Table 2 below shows characteristic data of the surface emitting laser devices of comparative examples and third embodiment. The comparative example is a case where doping does not proceed to the cavity.

TABLE 2

| Category | Comparative Example | Third embodiment |
| --- | --- | --- |
| Number of emitters | 202 | 202 |
| Wp(nm) | 943.2 | 942.4 |
| Vf(V) | 2.19 | 2.07 |
| PCE(%) | 38.9 | 39.3 |

In the third embodiment, as doping proceeds to the cavity, the operating voltage Vf is lowered compared to the comparative example through resistance reduction in the active region, and there is a technical effect of improving light efficiency and light output. The area of the first conductivity type first doped layer 261 is controlled to be 10% to 70% compared to the area of the first cavity 231, thereby improving the voltage efficiency by reducing the resistance in the active region to improve light output. In this case, when the area of the first conductivity type first doped layer 261 exceeds 70% of the area of the first cavity 231, light output may be reduced due to light absorption by the doped area, and if it is less than 10%, the contribution of the resistance reduction effect may be low. In addition, in an embodiment, the area of the first conductive type first doped layer 261 may be controlled to be 20% to 50% compared to the area of the first cavity 231. In an embodiment, the "area" may be compared based on the "width" occupied by each layer. Also, the "area" may be a "volume" occupied by each layer.

In the embodiment, the concentration of the first conductivity-type dopant in the first conductivity-type first dopant layer 261 is controlled in the range of $1 \times 10^{17}$ to $8 \times 10^{17}$ (atoms/cm$^3$), thereby reducing the resistance in the active region, thereby improving the voltage efficiency and thereby outputting light. At this time, when the concentration of the first conductivity type dopant in the first conductivity type dopant layer 261 exceeds the upper limit, the light output may decrease due to light absorption by the doped region, and when the concentration is less than the lower limit, the resistance decreases and the contribution of the effect may be low.

In this case, in the embodiment, the concentration of the first conductivity type dopant in the first conductivity type first doping layer 261 located in the first cavity 231 is lower than the concentration of the first conductivity type dopant in the first reflective layer 220. By being controlled, light absorption by the doped region can be prevented, and voltage efficiency can be improved by reducing resistance in the active region, thereby improving light output.

For example, when the concentration of the first conductivity-type dopant in the first conductivity-type first doped layer 261 is in the range of $1 \times 10^{18}$ to $2 \times 10^{18}$ (atoms/cm$^3$). Since the concentration of the first conductivity type dopant is controlled in the range of $1 \times 10^{17}$ to $8 \times 10^{17}$ (atoms/cm$^3$), there is a technical effect of improving light output by improving voltage efficiency through reduction of resistance in the active region.

In addition, one of the technical problems of the embodiment is to provide a surface-emitting laser device and a surface-emitting laser package including the same capable of improving light output by improving optical confinement efficiency around the emission layer.

The embodiment has a technical effect of improving light output by improving optical confinement efficiency in the active region 230 around the light emitting layer in order to solve this technical problem.

Specifically, when the first cavity 231 includes an AlxGaAs-based layer (0<X<1), by controlling the concentration of Al in the first cavity 231 to decrease in the direction of the active layer 232. As shown in FIG. 29, by controlling the band gap energy level of the first cavity 231 to decrease in the direction of the active layer 232, there is a technical effect of improving light output through improved optical confinement efficiency.

In addition, when the second cavity 233 includes an AlxGaAs-based layer (0<X<1), the concentration of Al in the second cavity 233 is controlled to decrease in the direction of the active layer 232. As shown in FIG. 29, there is a technical effect of improving light output through improved optical confinement efficiency by controlling the band gap energy level of the second cavity 233 to decrease in the direction of the active layer 232.

Fourth Embodiment

Next, FIG. 30 is an exemplary diagram of an energy band diagram 204 in the surface emitting laser device according to the fourth embodiment.

The fourth embodiment may employ the technical features of the first to third embodiments described above, and will be described below with focus on the main features of the fourth embodiment.

In the fourth embodiment, the second width T2 of the second cavity 233 may be larger than the first width T1 of the first cavity 231.

For example, the second cavity 233 may be formed of an $Al_yGa_{(1-y)}As_{(0<y<1)}$ material, but is not limited thereto, and may include a single layer or a plurality of $Al_yGa_{(1-y)}As$ layers.

For example, the second cavity 233 may include a 2-1st cavity layer 233a and a 2-2nd cavity layer 233b. The 2-2nd cavity layer 233b may be further spaced apart from the active layer 232 compared to the 2-1st cavity layer 233a. The 2-2nd cavity layer 233b may be formed to be thicker than the 2-1st cavity layer 233a, but is not limited thereto. In this case, the 2-2nd cavity layer 233b may be formed to be about 60 to 70 nm, and the 2-1st cavity layer 233a may be formed to be about 40 to 55 nm, but the present invention is not limited thereto.

According to the fourth embodiment, the second width T2 of the second cavity 233 is formed larger than the first width T1 of the first cavity 231, thereby improving light output by improving resonance efficiency.

Next, FIGS. 31A and 31B are doping concentration data in the first conductive type first doped layer 261 of the active region of the surface-emitting laser device according to the fourth exemplary embodiment illustrated in FIG. 30.

For example, in FIGS. 31A and 31B, the horizontal axis indicates doping concentration of the first conductivity type dopant when the distance increases from the active layer 232 to the first reflective layer 220 (X direction).

In an exemplary embodiment, the concentration of the first conductivity type dopant in the first conductivity type first doped layer 261 may be controlled to increase in the direction of the first reflective layer 220 from the direction of the active layer 232. In the embodiment, the doping concentration increase in the region adjacent to the active layer 232 can be controlled to prevent a decrease in light intensity due to light absorption, and the doping concentration in the region adjacent to the first reflective layer 220 is increased to reduce resistance so that there is a technical effect that can improve the light output by improving the voltage efficiency.

For example, referring to FIG. 31A, the first conductivity-type first doped layer 261 may include a 1-1st doped layer 261a and a 1-2nd doped layer 261b. The doping concentration in the 1-2nd doped layer 261b disposed further apart from the active layer 232 compared to the 1-1st doped layer 261a may increase from d1 to d2 or d3. Accordingly, a decrease in light intensity due to light absorption in the 1-1st doped layer 261a adjacent to the active layer 232 can be prevented, and a region of the 1-2nd doped layer 261b adjacent to the first reflective layer 220 so that there is a technical effect that can improve the light output by improving the voltage efficiency according to the decrease in resistance.

In addition, referring to FIG. 31B, the first conductive type first doped layer 261 includes the 1-1st doped layer 261a, the 1-2nd doped layer 261b, and the 1-3rd doped layer 261c. Doping concentrations in the 1-2nd doped layer 261b and the 1-3rd doped layer 261c disposed further apart from the active layer 232 compared to the 1-1st doping layer 261a can increase sequentially are d1, d2, d3. Accordingly, a decrease in light intensity due to light absorption in a region adjacent to the active layer 232 is prevented, and voltage efficiency due to a decrease in resistance in a region adjacent to the first reflective layer 220 is improved, thereby improving light output.

Fifth Example

Next, FIG. 32 is an exemplary diagram of an energy band diagram 205 in the surface emitting laser device according to the fifth embodiment.

The fifth embodiment may employ the technical features of the first to fourth embodiments, and will be described below with focus on the features of the fifth embodiment.

According to the fifth embodiment, the active region 230 includes a second cavity 233 disposed between the second reflective layer 250 and the active layer 232, and the second cavity 233 is adjacent to the second reflective layer 250 and may include a second conductive type second doped layer 262.

According to the embodiment, by including the second conductive type second doped layer 262 in a partial region of the second cavity 233, the resistance is reduced compared to the existing active region, thereby improving the voltage efficiency by reducing the resistance in the active region. By doing so, there is a technical effect that can improve the light output.

For example, in the embodiment, when the second cavity 233 includes the 2-1st cavity layer 233a and the 2-2nd cavity layer 233b, the second cavity 233 is further spaced apart from the active layer 232. By including the second doped layer 262 of the second conductivity type in the cavity layer 233b, there is a technical effect of improving the light output by improving the voltage efficiency by reducing the resistance in the active region compared to the related art. For example, in the case of the embodiment in which doping is performed in the second cavity 233, the operating voltage Vf is lowered compared to the comparative example by reducing the resistance in the active region, and there is a technical effect that can improve light efficiency or light output.

In the embodiment, the area of the second conductivity type second doping layer 262 is controlled to be 10% to 70% compared to the area of the second cavity 233, thereby reducing the resistance in the active region to improve the voltage efficiency and thereby output light. At this time, when the area of the second conductivity type second doped layer 262 exceeds 70% of the area of the second cavity 233, light output may be reduced due to light absorption by the doped area, and if it is less than 10%, the contribution of the resistance reduction effect may be low.

Referring to the embodiment, the total area of the first conductive type first doped layer 261 and the second conductive type second doped layer 262 is 20% to 70% of the total area of the active region 230. When the upper limit is exceeded, the light output may be lowered due to light absorption by the doped region, and when the lower limit is less than the lower limit, the contribution of the resistance reduction effect may be low.

In the embodiment, the concentration of the second conductivity-type dopant in the second conductivity-type second doped layer 262 is controlled in the range of $1\times10^{17}$ to $8\times10^{17}$ (atoms/cm$^3$), thereby reducing the resistance in the active region, thereby improving the voltage efficiency and thereby outputting light. At this time, when the concentration of the second conductivity type dopant in the second conductivity type second dopant layer 262 exceeds the upper limit, light output may decrease due to light absorption by the doped region, and when the concentration is less than the lower limit, the resistance decreases and the contribution of the effect may be low.

In addition, in the embodiment, the concentration of the second conductivity type dopant in the second conductivity type second doped layer 262 is controlled to be less than the concentration of the second conductivity type dopant in the second reflective layer 250 to prevent light absorption by the doped region. At the same time, it is possible to improve the light output by improving the voltage efficiency by reducing resistance in the active region.

For example, when the concentration of the second conductivity type dopant in the second conductivity type second doped layer 262 is in the range of $7\times10^{17}$ to $3\times10^{18}$ (atoms/cm$^3$). Since the concentration of the second conductivity type dopant is controlled in the range of $1\times10^{17}$ to $7\times10^{17}$ (atoms/cm$^3$) in the second conductivity type second doped layer 262, there is a technical effect of improving light output by improving voltage efficiency through reduction of resistance in the active region.

Sixth Embodiment

FIG. 33 is another enlarged view of the first region Cl of the surface-emitting laser device according to the embodiment illustrated in FIG. 4.

Referring to FIG. 33, in an embodiment, in the surface-emitting laser device 201, a second electrode 280 is disposed in a region other than the aperture 241, which is an opening, and a passivation layer 270 disposed on a surface corresponding to the aperture 241.

Next, FIG. 34 is a cross-sectional view taken along line A1-A2 of the surface-emitting laser device according to the embodiment shown in FIG. 33.

Referring to FIG. 34, in the embodiment, the surface-emitting laser device 201 includes a first electrode 215, a substrate 210, a first reflective layer 220, an active region 230, an aperture region 240, and at least one of the reflective layer 250, the second electrode 280, and the passivation layer 270.

The aperture region 240 may include an aperture 241 and an insulating area 242. The insulating area 242 may be referred to as an oxide layer, and the aperture region 240 may be referred to as an oxidation region, but is not limited thereto.

The second electrode 280 may include a contact electrode 282 and a pad electrode 284.

On the other hand, one of the technical problems of the embodiment is to provide a surface emitting laser device and a light emitting device including the same capable of controlling a divergence angle according to the FOI specification of a module.

FIG. 35A is a schematic plan view of the aperture region 240 of the surface-emitting laser device according to the embodiment shown in FIG. 34, and FIG. 35B is a schematic diagram of the aperture region 240 of the surface-emitting laser device according to the embodiment shown in FIG. 34.

In an embodiment, the aperture region 240 includes an insulating region 242 and an aperture 241, and the aperture 241 may include an elliptical cross section. In the embodiment, the elliptical cross-section of the aperture 241 does not mean only an exact ellipse, but it may include a round shape including a predetermined long axis D2 and a shorter short axis D1. In this case, the outer periphery of the insulating region 242 may be circular.

According to an embodiment, the cross section of the aperture 241 includes a round shape including a long axis D2 and a short axis D1, for example, an elliptical cross section, so that there is a special technical effect of designing the beam divergence angle the beam in the VCSEL chip to fit the field of interest (FOI) shape of the module stage, and accordingly, design freedom can be expanded.

For example, FIG. 36A shows divergence angle data according to the aperture size of the surface-emitting laser device according to the embodiment. For example, in FIG. 36A, the X axis is the diameter of the aperture, and the Y axis is the divergence angle value of the exit beam.

As shown in FIG. 36A, as the size of the aperture 241 increases, the divergence angle decreases, and as the size of the aperture 241 decreases, the beam divergence angle increases.

Accordingly, according to an embodiment, the beam divergence angle is relatively increased in the short axis D1 of the aperture 241 having a small size, and the long axis D2 of the aperture 241 having a relatively large size is increased so that it is possible to relatively reduce the beam divergence angle. Through this, the embodiment has a special technical effect of designing a beam divergence angle in a VCSEL chip according to a field of interest (FOI) shape of a module stage.

The technical effect of the embodiment will be described in more detail with reference to FIGS. 36B and 36C.

FIG. 36B is a near field image of a surface-emitting laser device according to an embodiment, and FIG. 36C is a far field beam profile of a surface-emitting laser device according to an embodiment.

In the example, the far field beam profile of the surface-emitting laser device was measured using a beam profiler measuring instrument 8050M-GE-TE (Thorlabs, Inc.) (8050M-GE-TE specification information: 8 Megapixel Monochrome Scientific CCD Camera, Hermetically Sealed Cooled Package, GigE Interface).

As shown in FIG. 35A, when the cross section of the aperture 241 includes a long axis D2 and a short axis D1, the near field image as shown in FIG. 36B may correspond to the cross-sectional image of the aperture 241.

However, as shown in FIG. 36C, the beam divergence angle of the output beam is relatively increased in the short axis D1 of the aperture 241 having a small size, as shown in FIG. 36C. There is a special technical effect in that the beam divergence angle is relatively reduced in the region of the long axis D2 of the aperture 241 of which is large.

Through this, the embodiment has a unique technical effect of designing the beam divergence angle in the VCSEL chip to fit the field of interest (FOI) shape of the module stage.

FIGS. 37A and 37B are divergence angle and radiation (Radiometric %) data of a surface-emitting laser device according to a comparative example and an example.

In the comparative example, as shown in FIG. 37A, there is no difference in the radiometric % data according to the divergence angle in the circular aperture in the Phi 0° direction and the Phi 90° direction (see FIG. 2D).

However, as shown in FIG. 37, there is a clear difference between the direction of Phi 0° and the direction of Phi 90° in the divergence angle and radiometric % data of the surface-emitting laser device according to the embodiment.

Through this, the embodiment can control the degree of radiation (Radiometric %) as well as the beam divergence angle from the VCSEL chip in consideration of the field of interest (FOI) at the module stage.

In the example, the divergence angle of the surface emitting laser device was measured using an LEDGON-100 goniophotometer (Instrument Systems Optische Messtechnik GmbH, Germany).

Next, FIGS. 38 and 39 are beam pattern change data according to a change in aspect ratio of an ellipse aperture in the surface-emitting laser device according to embodiments and Comparative Examples.

According to an embodiment, the long axis D2 of the horizontal section may range from 1.1 to 2.5 times than the short axis D1 of the horizontal section. In this range, the embodiment may relatively increase the beam divergence angle in the short axis D1 area of the aperture 241 having a small size. In addition, a technical effect capable of relatively reducing a beam divergence angle in a region of the long axis D2 of the aperture 241 having a relatively large size can be maximized. Accordingly, the embodiment has a special technical effect of designing a beam divergence angle in a VCSEL chip according to a field of interest (FOI) shape of a module stage.

In addition, according to an embodiment, when the long axis D2 of the horizontal section of the aperture 241 is controlled in the range of 1.1 to 2.5 times the short axis D1 of the horizontal section, the beam diverges from the VCSEL chip. A unique technical effect that can control not only the beam divergence angle but also the degree of radiation (Radiometric %) can be maximized.

Meanwhile, when the long axis D2 of the horizontal section of the aperture 241 is less than 1.1 times the short axis D1 of the horizontal section, there may not be a significant difference from the circular aperture, and the ratio is 2.5 times. In case of excess, the beam pattern due to the oscillation mode change is Hermite-Gauss (HG) Mode (FIG. 38), which is a rectangular symmetry emission pattern in Laguerre-Gauss (LG) Mode (see FIG. 39).

Next, one of the technical problems of the embodiment is an increase in the divergence angle of beams or a beam pattern according to a higher mode shift when a high current is applied or despite an increase in the aperture size. It is intended to provide a surface-emitting laser device and a light emitting device including the same capable of preventing the problem of fragmentation of patterns.

FIG. 40A shows mode change data according to an aperture size in the related art, and FIG. 40B shows beam pattern data for each mode.

In the related art, the aperture size is increasing in accordance with the demand for a high-output VCSEL package.

Meanwhile, as shown in FIG. 40A, when the aperture size, for example, the radius $r_A$ increases, the oscillation occurs in a relatively stable mode, and thus a higher mode shift occurs.

For example, in the related art, as the aperture size increases, the higher mode shifts to LP01 ($r_A$=2 μm), LP21 ($r_A$=4 μm), and LP41 ($r_A$=6 μm).) Phenomenon occurs.

However, such a higher mode shift phenomenon causes a problem in that the divergence angle of beams is increased or the beam pattern is split.

For example, as shown in FIG. 40B, as the aperture size increases, the higher order mode is changed to LP01 ($r_A$=2 μm), LP21 ($r_A$=4 μm), and LP41 ($r_A$=6 μm) higher as mode shift occurs, there is a problem that the splitting phenomenon of the beam pattern increases.

Meanwhile, FIG. 40C is data of oscillation mode change according to a high power change in the surface-emission laser device according to Comparative Example (RC) and embodiment (EE).

In the comparative example (RC) of FIG. 40C, the oscillation mode is LP01 (I=1 mA), LP22 (I=3 mA), LP52 (I=5 mA), as the applied current gradually increases from about 1 mA to 7 mA in the circular aperture. LP53 (I=7 mA) causes a sudden change to a higher mode shift, and accordingly, the divergence angle of beams increases or the beam pattern is split. Is occurring.

However, in the elliptical aperture of the embodiment (EE) of FIG. 40C, even if the applied current gradually increases from about 1 mA to 7 mA, the higher mode shift is due to the effect of reducing the size by shortening the asymmetric aperture is delayed and the mode is maintained.

For example, as in the embodiment (EE) of FIG. 40C, even if the applied voltage is applied with 3 mA or more, the mode is maintained at LP32 (I=3 mA), LP32 (I=5 mA), and LP32 (I=7 mA). There is a special technical effect that can prevent a problem in which a higher mode shift phenomenon is delayed so that the divergence angle of beams is abnormally increased or the beam pattern is split.

Next, FIGS. 41A and 41B are second plan views of an aperture region of a surface-emitting laser device according to another exemplary embodiment.

According to an embodiment, as shown in FIG. 41A, a horizontal cross section of the aperture 241 may include a round shape having a predetermined long axis D2 and a shorter short axis D1 than this.

Meanwhile, as shown in FIG. 41B, the outer shape of the second insulating region 242b disposed outside the aperture 241 is greater than the second long axis D4 so as to correspond to the shape of the horizontal cross-section of the aperture 241. May have a round shape having a short second short axis D3.

FIGS. 41A and 41B, a second long axis D4 and a shorter second short axis D3 are formed so that the outer shape of the second insulating region 242b corresponds to the outer shape of the aperture 241. By forming the round shape provided, the horizontal cross section of the aperture 241 can be formed into a round shape having a long axis D2 and a shorter short axis D1 than this.

Through this, the embodiment relatively increases the beam divergence angle in the short axis region of the aperture with a small size, and the beam divergence angle in the long axis region of the aperture with a relatively large size. Accordingly, the embodiment has a special technical effect of designing a beam divergence angle in a VCSEL chip according to a field of interest (FOI) shape of a module stage.

In addition, the embodiment has a technical effect of controlling the degree of radiation (Radiometric %) as well as the divergence angle of the beam from the VCSEL chip in consideration of the FOI of the module stage.

In addition, in the embodiment, the horizontal cross section of the aperture 241 includes a round shape having a predetermined long axis D2 and a shorter short axis D1 than this, so that even when a high current is applied or the aperture size is increased. It is possible to provide a surface-emitting laser device and a light-emitting device including the same capable of preventing a problem in that due to the effect of reducing the size by shortening the asymmetric aperture, the divergence angle of beams according to the higher mode shift increases or the beam pattern is split.

Hereinafter, contents of a method of manufacturing a surface-emitting laser device according to an embodiment will be described with reference to the drawings.

For example, with reference to FIGS. 42A to 46B below, technical features for forming the aperture region 240 in the embodiment will be described in detail.

FIGS. 42A and 42B are conceptual diagrams illustrating a first manufacturing process of the aperture region 240 in the surface emitting laser device according to the embodiment.

According to an embodiment, as shown in FIG. 42B, the aperture region 240 may include an insulating region 242 and an aperture 241, and the aperture 241 may include an elliptical cross section. In the embodiment, the elliptical cross section of the aperture 241 does not mean only an exact ellipse, but a predetermined long axis D2 and a shorter short axis D1 and it may include a round shape not in the form of a circle having the same horizontal diameter and vertical diameter. In this case, the outer periphery of the insulating region 242 may be circular.

In the embodiment, when the AlGa-based layer 240a is mesa-etched as shown in FIG. 42A, the outer edge may be etched into a circular shape. Subsequently, through an oxidation process, as shown in FIG. 42B, the cross section of the aperture 241 may include a round shape including a long axis D2 and a short axis D1, for example, an elliptical cross section. Through this, it is possible to design the beam divergence angle in the VCSEL chip according to the field of interest (FOI) shape of the module stage.

Hereinafter, the concept of the first manufacturing process of the aperture region 240 will be described in more detail.

FIG. 43A is a conceptual diagram illustrating a thickness and oxidation rate of an AlGa-based layer 240a in a first manufacturing process concept in a surface-emitting laser device according to an embodiment.

According to the embodiment, the oxidation rate of the AlGa-based layer 240a is controlled to be relatively fast F in the thick region $T_k$, and the oxidation rate is controlled to be relatively slow in the thin region Tn. Through this, as shown in FIG. 42B, the cross section of the aperture 241 may form a round shape including a long axis D2 and a short axis D1.

For example, according to an embodiment, the first thickness of the insulating region in a direction parallel to the direction of the short axis D1 of the elliptical cross section of the aperture 241 is thicker than the second thickness of the insulating region in a direction parallel to the direction of the long axis D2 of the elliptical cross section of the aperture 241.

For example, according to the embodiment, the region $T_k$ of the AlGa-based layer 240a having a thick thickness can be a direction parallel to the direction of the short axis D1 in the elliptical cross section because the oxidation rate is controlled relatively quickly (at F). The first thickness of the insulating region 242 may be thicker than the second thickness.

On the other hand, according to the embodiment, in the region (Tn) of the AlGa-based layer 240a having a thin thickness, the oxidation rate is controlled relatively slowly (S) so that it can be a direction parallel to the direction of the short axis D2 in the elliptical cross section. The second thickness of the region 242 may be thinner than the first thickness.

FIG. 43B is a photograph of the thickness and degree of oxidation of the insulating region 242 in the surface emitting laser device according to the embodiment, and the region Tk having a thick insulating region 242 is a region having a relatively high oxidation rate (F). The thin region Tn is a region S having a relatively slow oxidation rate.

FIG. 44A shows relation data between the thickness of the insulating region and the oxidation rate in the surface-emitting laser device according to the embodiment. It can be seen that the oxidation rate increases as the thickness of the AlGa-based layer 240a to become the insulating region increases.

FIG. 44B is a photograph of the aperture region 240 in the surface emitting laser device of the embodiment.

In the embodiment, the thickness of the AlGa-based layer 240a is relatively controlled to obtain the aperture region 240 in the surface emitting laser device as shown in FIG. 44B.

In addition, in the embodiment, the long axis and the short axis of the aperture 241 may be controlled by controlling the thickness of the AlGa-based layer 240a in consideration of the crystal direction.

For example, as shown in FIG. 44B, by controlling a growth mode by placing a predetermined off-angle on the substrate, the thickness can be differently controlled for each direction.

For example, in the embodiment, an off-angle of the substrate may be controlled in a range of about 0.5° to 12°, and the thickness may be differently controlled for each direction. When the off angle of the substrate exceeds 12°, the step bunching effect described later may disappear, and when the off angle is less than 0.5°, the step bunching effect may not occur.

FIG. 45A is a conceptual diagram illustrating a thickness and oxidation rate of an AlGa-based layer 240a to become an insulating region in a surface emitting laser device according to an embodiment.

According to the embodiment, the oxidation rate is controlled relatively quickly in the region Tk where the thickness of the AlGa-based layer 240a is thick (F), and the oxidation rate is controlled slowly in the region Tn where the thickness is relatively thin (S), in particular, in a bunched step as shown in FIG. 44B, the oxidation rate is controlled relatively faster in the thick region Tk (F), and the oxidation rate is slow in the relatively thin region Tn. By being controlled, the horizontal cross section of the aperture 241 may have a round shape having a predetermined long axis and a shorter short axis.

Next, FIG. 45B is another conceptual diagram of the thickness and oxidation rate of the insulating region in the surface-emitting laser device according to the embodiment, and FIG. 45C is a photograph of the thickness and oxidation degree of the insulating region in the surface-emitting laser device according to the embodiment.

According to an embodiment, as shown in FIGS. 45B and 45C, in a region (Tk) in which the thickness of a preliminary layer to become an insulating region, for example, an AlGa-based layer is thick, the oxidation rate is controlled relatively quickly (F), and the oxidation rate may be slowly controlled (S) thin in the relatively thin region Tn.

Next, FIGS. 46A and 46B are conceptual diagrams illustrating a thickness of an insulating region and an oxidation rate in a second manufacturing process concept in a surface emitting laser device according to another embodiment.

In the second manufacturing process, as shown in FIG. 46A, the outer shape of the second AlGa-based layer 240b for becoming an insulating region corresponds to the shape of the horizontal cross-section of the aperture, so that the second long axis D4 and the second shorter axis are shorter. It can be mesa etched to include a round shape with second short axis D3. In the second manufacturing process, the thickness of the AlGa-based layer 240b may be uniform.

As shown in FIG. 46B, as the oxidation process proceeds at a uniform rate, the outer shape of the second insulating region 242b disposed on the outer side of the aperture 241 corresponds to the shape of the horizontal cross-section of the aperture 241. It may include a round shape having a long axis D4 and a shorter second short axis D3 than long axis D4. Accordingly, the horizontal cross section of the aperture 241 may be formed in a round shape having a long axis D2 and a shorter short axis D1 than long axis D2.

According to the embodiment, since the horizontal cross section of the aperture 241 includes a round shape having a predetermined long axis and a shorter short axis than long axis, the beam divergence in the short axis region of the aperture having a small size angle may be relatively increased, and a beam divergence angle may be relatively decreased in the long axis region of the aperture having a relatively large size. Accordingly, the embodiment has a special technical effect of designing a beam divergence angle in a VCSEL chip according to a field of interest (FOI) shape of a module stage.

In addition, the embodiment has a technical effect of controlling the degree of radiation (Radiometric %) as well as the divergence angle of the beam from the VCSEL chip in consideration of the FOI of the module stage.

In addition, in the embodiment, the horizontal cross section of the aperture includes a round shape having a predetermined long axis and a shorter short axis than long axis, so that the asymmetric aperture shortening is reduced when a high current is applied or despite an increase in the aperture size. Due to the size reduction effect, there is a technical effect that can prevent the problem of increasing the divergence angle of beams or splitting the beam pattern due to higher mode shift.

INDUSTRIAL APPLICABILITY

The surface emitting laser device according to the embodiment may be applied to a mobile terminal.

For example, FIG. 47 is a perspective view of a mobile terminal to which a surface-emitting laser device is applied according to an embodiment.

As shown in FIG. 47, the mobile terminal 1500 according to the embodiment may include a camera module 1520, a flash module 1530, and an autofocus device 1510 provided on the rear side. Here, the autofocus device 1510 may include one of the packages of the surface emitting laser device according to the above-described embodiment as a light emitting unit.

The flash module 1530 may include a light emitting device that emits light therein. The flash module 1530 may be operated by a camera operation of a mobile terminal or a user's control.

The camera module 1520 may include an image capturing function and an auto focus function. For example, the camera module 1520 may include an auto focus function using an image.

The auto focus device 1510 may include an auto focus function using a laser. The auto focus device 1510 may be mainly used in a condition in which an auto focus function using an image of the camera module 1520 is deteriorated, for example, in a proximity or dark environment of 10 m or less. The autofocusing device 1510 may include a light emitting unit including a vertical cavity surface emission laser (VCSEL) semiconductor device, and a light receiving unit that converts light energy such as a photodiode into electrical energy.

Features, structures, effects, and the like described in the embodiments above are included in at least one embodiment, and are not necessarily limited to only one embodiment. Furthermore, the features, structures, effects, and the like illustrated in each embodiment may be combined or modified for other embodiments by a person having ordinary knowledge in the field to which the embodiments belong. Therefore, contents related to such combinations and modifications should be interpreted as being included in the scope of the embodiments.

Although the embodiments have been described above, these are only examples and are not intended to limit the embodiments, and those of ordinary skill in the field to which the embodiments belong are not departing from the essential characteristics of the embodiments. It will be seen that branch transformation and application are possible. For example, each component specifically shown in the embodiment can be modified and implemented. And differences related to these modifications and applications should be construed as being included in the scope of the embodiments set in the appended claims.

The invention claimed is:

1. A surface-emitting laser device comprising:
a first reflective layer;
an active region disposed on the first reflective layer;
a plurality of aperture regions disposed on the active region and including an aperture and an insulating region;
a second reflective layer disposed on the aperture region; and
a first electrode and a second electrode electrically connected to the first reflective layer and the second reflective layer, respectively,
wherein an outer periphery of each insulating region of the plurality of aperture regions is circular,
wherein an outer periphery of the aperture comprises a polygonal shape, wherein a size of the aperture is greater than the shortest distance from a polygonal edge of the aperture to an outer edge of the insulating region, and wherein a distance between centers of each of the closest apertures in the plurality of aperture regions is greater than twice a radius of each aperture region and less than 3 times, and a size of the aperture region is a sum of half size of the aperture and a shortest distance from the polygonal edge to the outside of the insulating region.

2. The surface-emitting laser device of claim 1, wherein the outside of the aperture is one of a triangular to hexagonal polygonal shape.

3. The surface-emitting laser device of claim 1, wherein the size of the aperture, which is a length of a long axis diagonal of the polygon, is 6.0 µm to 12 µm, and wherein a current density of the aperture is $8.3 kA/cm^3$ to $30.0 kA/cm^3$.

4. A light-emitting device comprising the surface-emitting laser device of claim 1.

5. The surface-emitting laser device of claim 1, wherein a half of the size of the aperture is greater than the shortest distance from the polygonal edge of the aperture to the outside of the insulating region.

6. The surface-emitting laser device of claim 1, wherein the size of the aperture is 6.0 µm to 12 µm, in which a oscillation shape in a near field of the aperture is one of a triangular to hexagonal polygonal shape.

7. A surface-emitting laser device comprising:
a first electrode;
a substrate disposed on the first electrode;
a first reflective layer disposed on the substrate;
an active region disposed on the first reflective layer and including a cavity region;
an aperture region disposed on the active region and including an aperture and an insulating region;
a second reflective layer disposed on the aperture region; and
a second electrode disposed on the second reflective layer,
wherein the insulating region of the aperture region includes a first recess recessed radially inward from an outermost periphery of the insulating region, and
wherein the aperture of the aperture region includes a second recess in a region corresponding to the first recess.

8. The surface-emitting laser device of claim 7, wherein a plurality of the first recesses in the insulating region are provided, wherein a first angle of the first recess is 5° to 30°, and wherein a second angle of the second recess is 2° to 45°.

9. The surface-emitting laser device of claim 8, wherein the aperture comprises a first aperture spaced apart from the second recess and a second aperture adjacent to the second recess, wherein a first radius of the first aperture is larger than a second radius of the second aperture based on a center of the aperture region.

10. A light-emitting device comprising the surface-emitting laser device of claim 7.

11. A surface-emitting laser device comprising:
a first electrode;
a substrate disposed on the first electrode;
a first reflective layer disposed on the substrate;
an active region disposed on the first reflective layer and including a cavity region;
an aperture region disposed on the active region and including an aperture and an insulating region;
a second reflective layer disposed on the aperture region; and
a second electrode disposed on the second reflective layer,
wherein the aperture includes a round shape in which a horizontal cross section has a long axis and a short axis that is shorter than the long axis,
wherein the long axis of the horizontal section is in the range of 1.1 to 2.5 times than the short axis of the horizontal section, and
wherein the round shape includes an ellipse, and an outer edge of the horizontal cross section of the insulating region in the aperture region is circular.

12. The surface-emitting laser device of claim 11, wherein a first thickness of the insulating region in a direction parallel to the short axis direction of the elliptical cross section of the aperture is thicker than a second thickness of the insulating region in a direction parallel to a direction of the long axis of an elliptical cross section of the aperture.

13. The surface-emitting laser device of claim 11, wherein in the aperture region, a cross section of the insulating region is an ellipse.

14. The surface-emitting laser device of claim 13, wherein an outer shape of the insulating region disposed outside the aperture is a round shape having a second long axis and a second short axis shorter than the second long axis.

15. A light-emitting device comprising the surface-emitting laser device of claim 11.

* * * * *